(12) United States Patent
Takakuwa et al.

(10) Patent No.: US 7,910,272 B2
(45) Date of Patent: Mar. 22, 2011

(54) DYE-CONTAINING PHOTOSENSITIVE COMPOSITION, COLOR FILTER USING THE SAME, AND PRODUCTION METHOD THEREOF

(75) Inventors: Hideki Takakuwa, Shizuoka-ken (JP); Yuki Mizukawa, Kanagawa-ken (JP)

(73) Assignee: FUJIFILM Corporation, Tokyo (JP)

( * ) Notice: Subject to any disclaimer, the term of this patent is extended or adjusted under 35 U.S.C. 154(b) by 1065 days.

(21) Appl. No.: 11/701,486

(22) Filed: Feb. 2, 2007

(65) Prior Publication Data

US 2007/0190435 A1    Aug. 16, 2007

(30) Foreign Application Priority Data

Feb. 16, 2006 (JP) ................................. 2006-039491
Jun. 13, 2006 (JP) ................................. 2006-163847

(51) Int. Cl.
*G02B 5/20* (2006.01)
*G03F 7/00* (2006.01)

(52) U.S. Cl. ................ 430/7; 430/270.1; 430/288.1
(58) Field of Classification Search .................. None
See application file for complete search history.

(56) References Cited

U.S. PATENT DOCUMENTS

| | | | |
|---|---|---|---|
| 5,234,791 | A | 8/1993 | Dammel et al. |
| 5,284,943 | A | 2/1994 | Tai et al. |
| 5,478,680 | A | 12/1995 | Hishiro et al. |
| 5,804,102 | A | 9/1998 | Oi et al. |
| 5,830,267 | A | 11/1998 | Zambounis et al. |
| 6,589,672 | B1 | 7/2003 | Kobayashi et al. |
| 6,713,227 | B2 | 3/2004 | Machiguchi et al. |
| 2002/0045111 | A1 | 4/2002 | Machiguchi et al. |
| 2004/0185372 | A1* | 9/2004 | Takakuwa .............. 430/270.1 |
| 2005/0113478 | A1 | 5/2005 | Suzuki |
| 2006/0051685 | A1* | 3/2006 | Fujimori et al. ............... 430/7 |
| 2006/0246364 | A1 | 11/2006 | Fujimori |
| 2006/0257762 | A1 | 11/2006 | Fujimori |
| 2007/0072096 | A1 | 3/2007 | Takakuwa et al. |
| 2007/0212623 | A1 | 9/2007 | Takakuwa et al. |
| 2009/0047585 | A1* | 2/2009 | Seto et al. .................... 430/7 |

FOREIGN PATENT DOCUMENTS

| | | |
|---|---|---|
| JP | 1-102469 A | 4/1989 |
| JP | 2-127602 A | 5/1990 |
| JP | 2-199403 A | 8/1990 |
| JP | 2-276866 A | 11/1990 |
| JP | 3-195783 A | 8/1991 |
| JP | 6-75375 A | 3/1994 |
| JP | 7-013014 A | 1/1995 |
| JP | 7-140654 A | 6/1995 |
| JP | 7-111485 B2 | 11/1995 |
| JP | 11-302285 A | 11/1999 |
| JP | 2002-14222 A | 1/2002 |
| JP | 2002-196481 A | 7/2002 |
| JP | 2002-278056 A | 9/2002 |
| JP | 2002-338825 A | 11/2002 |
| JP | 2004-139050 A | 5/2004 |
| JP | 2004-295116 A | 10/2004 |
| JP | 2005-227722 A | 8/2005 |
| JP | 2005-266149 A | 9/2005 |
| WO | 2005/083521 A1 | 9/2005 |
| WO | WO 2006/013697 * | 2/2006 |

OTHER PUBLICATIONS

Computer-generated translation of JP 2002-338825 (Nov. 27, 2002).

* cited by examiner

*Primary Examiner* — John A. McPherson
(74) *Attorney, Agent, or Firm* — Sughrue Mion, PLLC

(57) ABSTRACT

The present invention provides a dye-containing photosensitive composition that includes at least phthalocyanine, a photosensitive compound, and a transition metal complex of which the molar absorption coefficient $\epsilon$ in a visible light region is less than 5000.

17 Claims, No Drawings

US 7,910,272 B2

DYE-CONTAINING PHOTOSENSITIVE COMPOSITION, COLOR FILTER USING THE SAME, AND PRODUCTION METHOD THEREOF

CROSS-REFERENCE TO RELATED APPLICATION

This application claims priority under 35 USC 119 from Japanese Patent Application Nos. 2006-039491 and 2006-163847, the disclosures of which are incorporated by reference herein.

BACKGROUND OF THE INVENTION

1. Field of the Invention

The present invention relates to a dye-containing photosensitive composition suitable for forming a colored image of a color filter that is used in liquid crystal display devices and solid-state image pickup devices (CCD and CMOS), to a color filter using the same, and to a production method thereof.

2. Description of the Related Art

A dying method, a printing method, an electrodeposition method and a pigment dispersion method are known as methods of preparing a color filter that is used for liquid crystal display devices and solid-state image pickup devices.

Among these, the pigment dispersion method is a method where a color filter is prepared by photolithography with a colored photosensitive composition in which a pigment is dispersed in various kinds of photosensitive compositions and, since a pigment is used, this method is advantageous in terms of stability with respect to light and heat. Furthermore, since the photolithographic method is used for patterning, the method has high positioning precision, and has hitherto been widely used as a preferable method for producing color filters for large screens and high definition color displays.

When preparing a color filter by means of the pigment dispersion method, a photosensitive composition is applied to a glass substrate using a spin coater or a roll coater and dried to form a coated film and then the coated film is pattern-wise exposed and developed to form colored pixels. These steps are repeated for respective colors to obtain a color filter. As such a pigment dispersion method, a method that uses a negative type photosensitive composition containing an alkali-soluble resin in combination with a photopolymerizable monomer and a photopolymerization initiator has been described (see, for example, Japanese Patent Application Laid-Open (JP-A) No. 2-199403).

On the other hand, in recent years, there has been a need to make even higher resolution color filters for solid-state image pickup devices. However, since, in conventional pigment dispersion systems, it is difficult to further improve the resolution, and there is a problem that color unevenness is caused due to coarse particles in the pigment, the conventional pigment dispersion systems are not suitable for applications where a fine pattern is necessary as in solid-state image pickup devices.

In view of these problems, a technique of using dyes in place of conventional pigments has been proposed. However, there is a problem that dye-containing photosensitive compositions are generally inferior in light resistance to pigments. As a method of improving the light resistance, a technique of adding a transition metal complex has been proposed (see, for example, JP-A No. 2004-295116).

On the other hand, various kinds of color filters for solid-state image pickup devices that use organic solvent-soluble phthalocyanine have been proposed as color filters that are excellent in the heat resistance and light resistance (see, for example, JP-A No. 2005-266149).

SUMMARY OF THE INVENTION

However, when phthalocyanine is added to a dye-containing photosensitive composition for use in color filters, there is a problem that the viscosity increases over time to a significant degree.

Accordingly, a dye-containing photosensitive composition with excellent color purity and light resistance and that can inhibit the viscosity from increasing over time, a color filter with excellent light resistance, and a production method thereof are needed.

The present inventors have found that it is possible to increase the light resistance without seriously impairing dispersion and to inhibit the viscosity from increasing over time as described above, by adding a transition metal complex, of which the molar absorption coefficient $\epsilon$ in a visible light region is less than 5000, to a dye-containing photosensitive composition containing phthalocyanine and a photosensitive composition.

According to an aspect of the invention, there is provided a dye-containing photosensitive composition, including phthalocyanine, a photosensitive compound, and a transition metal complex having a molar absorption coefficient $\epsilon$ in a visible light region of less than 5000.

According to another aspect of the invention, there is provided a production method for a color filter, including coating the dye-containing photosensitive composition of an aspect of the invention on a support to form a coated film, exposing the coated film through a mask, and developing to form a pattern of a color filter.

According to another aspect of the invention, there is provided a color filter formed by the production method of an aspect of the present invention.

DETAILED DESCRIPTION OF THE INVENTION

In the following, a dye-containing photosensitive composition of the present invention, a color filter using the dye-containing photosensitive composition, and a production method thereof will be described in detail.

<<Dye-containing Photosensitive Composition>>

A dye-containing photosensitive composition of the invention (hereinafter, referred to as "a composition of the invention" in some cases) contains at least phthalocyanine, a photosensitive compound and a transition metal complex of which the molar absorption coefficient $\epsilon$ in a visible light region (380 to 780 nm) is less than 5000.

In the invention, the molar absorption coefficient $\epsilon$ is measured in a cyclohexanone solution by use of UV-2500PC (trade name, manufactured by Shimadzu Corporation).

The definition of the dye component in the invention is that it is a component that includes phthalocyanine, which is an indispensable component of the invention, and a dye other than phthalocyanine, which is an optional component.

In the invention, a transition metal complex is not included in the definition of dye component and phthalocyanine is not included in the definition of transition metal complex.

Among the dye-containing photosensitive compositions, an embodiment in which, of dye components, a dye that has the smallest maximum value of the molar absorption coefficient $\epsilon$ in the visible light region (380 to 780 nm) has the maximum value of 10000 or more, and the maximum value of a transition metal complex is 5000 or less is preferable, and an embodiment in which, of dye components, a dye that has the smallest maximum value of the molar absorption coefficient ε in the visible light region (380 to 780 nm) has the maximum value of 25000 or more and the maximum value of a transition metal complex is 3000 or less is particularly preferable.

In the following, each component contained in the dye-containing photosensitive composition of the invention will be described in detail.

<Phthalocyanine>

The dye-containing photosensitive composition of the invention contains at least one kind of phthalocyanine dye (preferably, phthalocyanine dye soluble in an organic solvent) as a colorant. Any phthalocyanine dye can be used without particular restriction.

Examples of phthalocyanine dyes soluble in organic solvents include dyes described in JP-A Nos. 5-333207, 6-51115 and 6-194828. As particularly preferable phthalocyanine dyes soluble in organic solvents, dye compounds represented by the following formula (I) and dye compounds represented by the following formula (II) can be cited.

-Dye Compounds represented by Formula (I)-

Next, the dye compounds represented by the formula (I) will be described. The dye compounds represented by the formula (I) are compounds that are organic solvent-soluble phthalocyanine excellent in the molar absorption coefficient ε and the chromatic valence and can simultaneously satisfy high light resistance and high heat resistance.

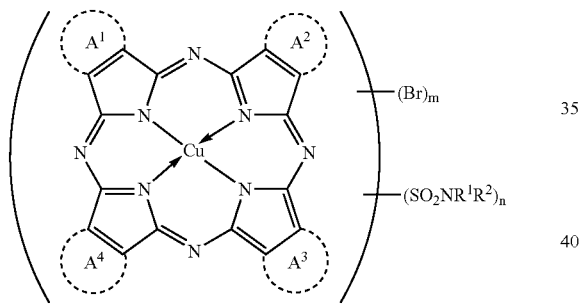

Formula (I)

In formula (I), ring $A^1$, ring $A^2$, ring $A^3$ and ring $A^4$ each independently represent the following aromatic ring. Depending on the condensation direction thereof and a substitution position of a substituent bound thereto, there are many isomers.

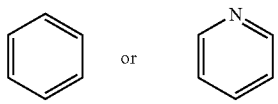

Furthermore, at least one of ring $A^1$, ring $A^2$, ring $A^3$ and ring $A^4$ represents the following aromatic ring.

Specific examples of the base skeleton of formula (I) include five kinds of structures as shown in the following formulas (1) to (5). Depending on the difference in the condensation direction of a pyridine ring, there are isomers with the N position in different positions. Further, there are also respective isomers in which the substitution position of a substituent such as bromine is different.

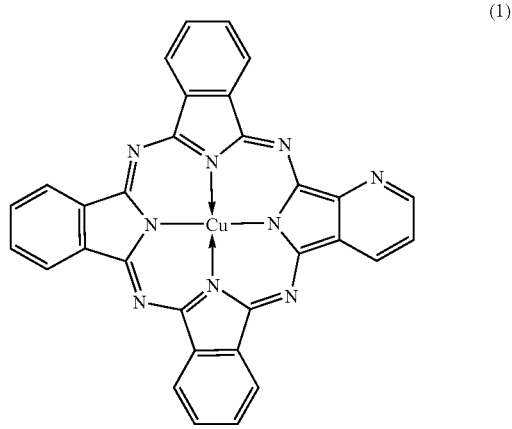

(1)

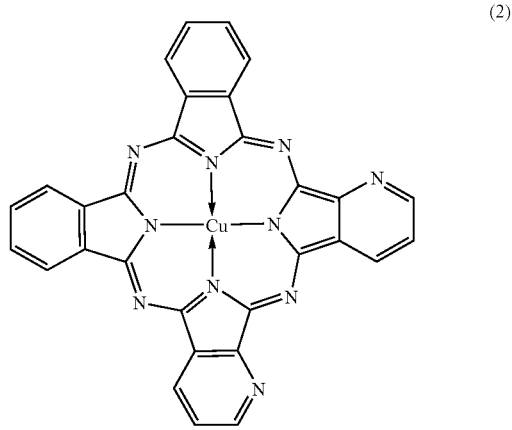

(2)

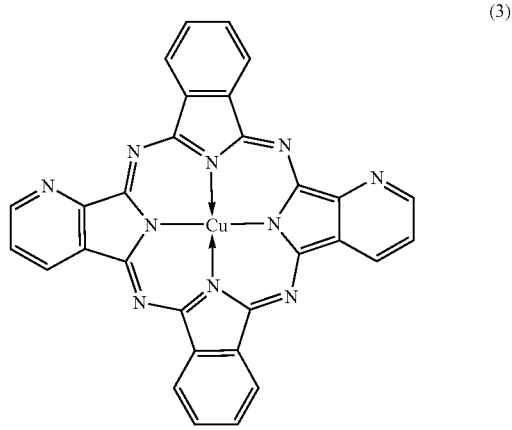

(3)

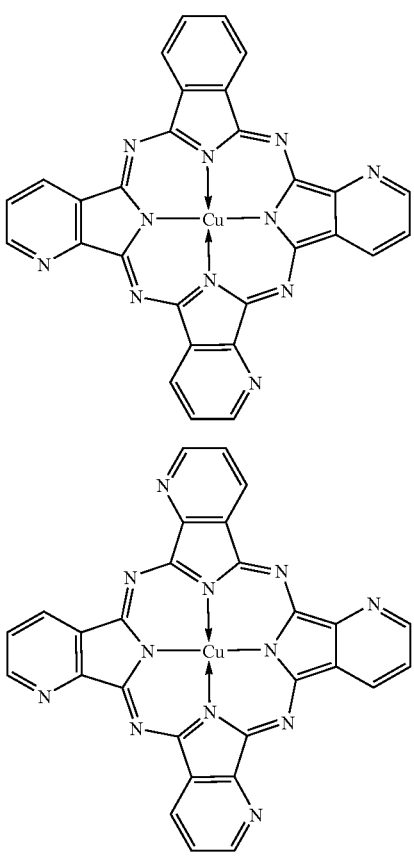

In formula (I), $R^1$ and $R^2$ each independently represent a hydrogen atom or a substituted or unsubstituted alkyl group; while $R^1$ and $R^2$ are not both a hydrogen atom simultaneously. Further, m is an integer from 1 to 8 and n is an integer from 1 to 4.

As the unsubstituted alkyl group represented by $R^1$ or $R^2$, an alkyl group having 1 to 12 carbon atoms is preferred. Examples thereof include straight chained or branched alkyl groups such as methyl group, ethyl group, n-propyl group, isopropyl group, n-butyl group, isobutyl group, n-hexyl group, 2-ethylhexyl group, n-octyl group and n-dodecyl group, and among these, a straight-chained or branched alkyl group having 4 to 12 carbon atoms is preferred.

As the substituted alkyl group represented by $R^1$ or $R^2$, "a substituted alkyl group containing an oxygen atom in at least one form of an ether bond, a carbonyl bond and an ester bond" is preferred, and a straight-chained, branched or cyclic substituted alkyl group having 2 to 12 carbon atoms containing 1 to 4 oxygen atoms in at least one form of the above is particularly preferred. Examples of the substituted alkyl group include methoxymethyl group, ethoxymethyl group, butoxymethyl group, methoxyethyl group, ethoxyethyl group, 3-methoxypropyl group, 3-ethoxypropyl group, 3-butoxypropyl group, methoxyethoxyethyl group, ethoxyethoxyethyl group, butoxyethoxyethyl group, methoxyethoxyethoxyethyl group, ethoxyethoxyethoxyethyl group, butoxyethoxyethoxyethyl group, acetylmethyl group, acetylethyl group, propionylmethyl group, propionylethyl group, tetrahydrofurfuryloxymethyl group, 2,2-dimethyl-1,3-dioxolane-4-methoxymethyl group, 2-(1,3-dioxolane)ethoxymethyl group, 2-(1,3-dioxane)ethoxymethyl group, methoxycarbonylmethyl group, ethoxycarbonylethyl group, propoxycarbonylethyl group, butoxycarbonylethyl group, pentoxycarbonylbutyl group, 1-(butoxymethyl)ethyl group, 1-(methoxymethyl)propyl group, 1-(ethoxymethyl)propyl group, 1-(butoxymethyl)propyl group, 1-(2-methoxy-ethoxy-methyl)propyl group, 1-(2-ethoxy-ethoxy-methyl)propyl group, 1-(2-methoxy-2-ethoxy-2-ethoxymethyl)ethyl group, 1-(2-ethoxy-2-ethoxy-2-ethoxymethyl)ethyl group, 1-(2-butoxy-2-ethoxy-2-ethoxymethyl)ethyl group, 1-(2-methoxy-2-ethoxy-2-ethoxymethyl)propyl group, 1-(2-ethoxy-2-ethoxy-2-ethoxymethyl)propyl group, 1-(2-propoxy-2-ethoxy-2-ethoxymethyl)propyl group, 1-(2-butoxy-2-ethoxy-2-ethoxymethyl)propyl group, 1-(2-methoxy-2-ethoxy-2-ethoxymethyl)butyl group, 1-(2-ethoxy-2-ethoxy-2-ethoxymethyl)butyl group, 1-(2-propoxy-2-ethoxy-2-ethoxymethyl)butyl group, 1-(2-methoxy-2-ethoxy-2-ethoxymethyl)pentyl group, 1-(2-ethoxy-2-ethoxy-2-ethoxymethyl)pentyl group, 1-(2-methoxy-2-ethoxy-2-ethoxymethyl)ethyl group, 1-(2-ethoxy-2-ethoxy-2-ethoxymethyl)ethyl group, 1-(2-methoxy-2-ethoxy-2-ethoxymethyl)propyl group, 1-(2-ethoxy-2-ethoxy-2-ethoxy-2-ethoxymethyl)propyl group, 1-(2-methoxy-2-ethoxy-2-ethoxy-2-ethoxymethyl)butyl group, 1-(2-methoxy-2-ethoxy-2-ethoxy-2-ethoxyethyl)ethyl group, 1-(2-ethoxy-2-ethoxy-2-ethoxy-2-ethoxyethyl)ethyl group, 1-(2-methoxy-2-ethoxy-2-ethoxy-2-ethoxyethyl)propyl group, 1,1-di(methoxymethyl)methyl group, 1,1-di(ethoxymethyl)methyl group, 1,1-di(propoxymethyl)methyl group, 1,1-di(butoxymethyl)methyl group, 1,1-di(2-methoxy-ethoxymethyl)methyl group, 1,1-di(2-ethoxy-ethoxymethyl)methyl group, 1,1-di(2-propoxy-ethoxymethyl)methyl group and 1,1-di(2-butoxy-ethoxymethyl)methyl group.

An embodiment in which $R^1$ and $R^2$ are each independently a hydrogen atom (however, $R^1$ and $R^2$ do not simultaneously represent a hydrogen atom), an unsubstituted alkyl group or "a substituted alkyl group containing an oxygen atom in at least one form of an ether bond, a carbonyl bond and an ester bond" is preferable.

Among the above, an embodiment in which $R^1$ and $R^2$ are each independently, a hydrogen atom (however, $R^1$ and $R^2$ do not simultaneously represent a hydrogen atom), an unsubstituted alkyl group having 1 to 12 carbon atoms or "a substituted alkyl group containing 1 to 4 oxygen atoms in at least one form of an ether bond, a carbonyl bond and an ester bond and having 2 to 12 carbon atoms" is particularly preferable, and, further among these, an embodiment in which at least one of $R^1$ and $R^2$ is "a substituted alkyl group containing 1 to 4 oxygen atoms in at least one form of an ether bond, a carbonyl bond and an ester bond and having 2 to 12 carbon atoms" is preferable in that the solubility to a polar organic solvent is high.

In particular, the compound represented by formula (I) is preferably a tetraazaporphyrin compound in which at least one of $R^1$ and $R^2$ is a substituted alkyl group represented by the following formula (I-a).

In formula (I-a), $R^3$ and $R^4$ each independently represent a hydrogen atom, an unsubstituted alkyl group, "a substituted alkyl group containing an oxygen atom in at least one form of an ether bond, a carbonyl bond and an ester bond", an alkylcarbonyl group, or an alkoxycarbonyl group. At least one of $R^3$ and $R^4$ represent "a substituted alkyl group containing an oxygen atom in at least one form of an ether bond, a carbonyl bond and an ester bond", an alkylcarbonyl group, or an alkoxycarbonyl group.

As an unsubstituted alkyl group represented by $R^3$ or $R^4$, an alkyl group having 1 to 8 carbon atoms is preferable. Examples thereof include a methyl group, ethyl group, propyl group, isopropyl group, butyl group, isobutyl group, pentyl group, hexyl group and octyl group.

As "the substituted alkyl group containing an oxygen atom in at least one form of an ether bond, a carbonyl bond and an ester bond" represented by $R^3$ or $R^4$, a substituted alkyl group having 2 to 10 carbon atoms containing 1 to 4 oxygen atoms is preferred. Examples thereof include methoxymethyl group, ethoxymethyl group, propoxymethyl group, butoxymethyl group, methoxyethoxymethyl group, ethoxyethoxymethyl group, propoxyethoxymethyl group, butoxyethoxymethyl group, methoxyethoxyethoxymethyl group, ethoxyethoxyethoxymethyl group, propoxyethoxyethoxymethyl group, butoxyethoxyethoxymethyl group, acetylmethyl group, propionylmethyl group, tetrahydrofurfuryloxymethyl group, 2,2-dimethyl-1,3-dioxolane-4-methoxymethyl group, 2-(1,3-dioxolane)ethoxymethyl group, 2-(1,3-dioxane)ethoxymethyl group, methoxycarbonylmethyl group, ethoxycarbonylmethyl group, propoxycarbonylmethyl group, butoxycarbonylmethyl group and pentoxycarbonylmethyl group.

As the alkylcarbonyl group and the alkoxycarbonyl group represented by $R^3$ or $R^4$, an alkyl carbonyl group having 2 to 10 carbon atoms and an alkoxycarbonyl group having 2 to 10 carbon atoms are preferred. Examples thereof include acetyl group, propionyl group, propylcarbonyl group, methoxycarbonyl group, ethoxycarbonyl group, propoxycarbonyl group, butoxycarbonyl group and pentoxycarbonyl group.

In formula (I), m is an integer from 1 to 8. m is preferably an integer from 1 to 6, and more preferably an integer from 1 to 4 in the point of having high absorbance. In addition, n is an integer from 1 to 4. m is preferably 2 or 3, and more preferably 2.

The tetraazaporphyrin compounds represented by formula (I) include a portion or a whole of these many isomers.

Exemplary compounds (specific examples 1 to 157) of the tetraazaporphyrin compound represented by formula (I) are presented below. The invention is not limited to these specific examples.

| Cl | Number of  | Number of 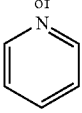 | m | n | $R^1$ | $R^2$ |
|----|---|---|---|---|---|---|
| 1  | 3 | 1 | 1 | 1 | H | $-C_2H_4OC_2H_5$ |
| 2  | 3 | 1 | 1 | 2 | H | $-C_2H_4OC_2H_5$ |
| 3  | 3 | 1 | 1 | 3 | H | $-C_2H_4OC_2H_5$ |
| 4  | 3 | 1 | 1 | 4 | H | $-C_2H_4OC_2H_5$ |
| 5  | 3 | 1 | 1 | 1 | $-C_2H_4OC_2H_5$ | $-C_2H_4OC_2H_5$ |
| 6  | 3 | 1 | 1 | 1 | H | $-C_3H_6OC_4H_9$ |
| 7  | 3 | 1 | 1 | 2 | H | $-C_3H_6OC_4H_9$ |
| 8  | 3 | 1 | 1 | 3 | H | $-C_3H_6OC_4H_9$ |
| 9  | 3 | 1 | 1 | 4 | H | $-C_3H_6OC_4H_9$ |
| 10 | 3 | 1 | 1 | 1 | $-C_2H_4OCH_3$ | $-C_2H_4OCH_3$ |
| 11 | 3 | 1 | 1 | 2 | $-C_2H_4OCH_3$ | $-C_2H_4OCH_3$ |
| 12 | 3 | 1 | 1 | 3 | $-C_2H_4OCH_3$ | $-C_2H_4OCH_3$ |
| 13 | 3 | 1 | 1 | 4 | $-C_2H_4OCH_3$ | $-C_2H_4OCH_3$ |
| 14 | 3 | 1 | 1 | 2 | $-C_4H_9$ | $-C_4H_9$ |
| 15 | 3 | 1 | 1 | 1 | H | $-CH_2-CH(C_2H_5)-C_4H_9$ |
| 16 | 3 | 1 | 1 | 2 | H | $-CH_2-CH(C_2H_5)-C_4H_9$ |
| 17 | 3 | 1 | 1 | 3 | H | $-CH_2-CH(C_2H_5)-C_4H_9$ |
| 18 | 3 | 1 | 1 | 4 | H | $-CH_2-CH(C_2H_5)-C_4H_9$ |
| 19 | 3 | 1 | 1 | 1 | H | $-C_3H_6-OCH_2-CH(C_2H_5)-C_4H_9$ |
| 20 | 3 | 1 | 1 | 2 | H | $-C_3H_6-OCH_2-CH(C_2H_5)-C_4H_9$ |

-continued

| Cl | Number of 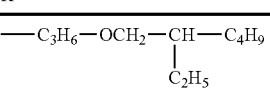 | Number of N  | m | n | R¹ | R² |
|---|---|---|---|---|---|---|
| 21 | 3 | 1 | 1 | 3 | H | —C₃H₆—OCH₂—CH(C₂H₅)—C₄H₉ |
| 22 | 3 | 1 | 4 | 2 | H | |
| 23 | 3 | 1 | 5 | 2 | H | —C₂H₄OC₂H₄OC₂H₅ |
| 24 | 3 | 1 | 6 | 1 | —C₂H₅ | —C₂H₄OC₂H₅ |
| 25 | 3 | 1 | 8 | 1 | —i-C₃H₇ | —CH₂O—C₂H₄—(1,3-dioxane) 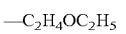 |
| 26 | 3 | 1 | 3 | 2 | H | —CH(C₂H₅)—CH₂OCH₃ |
| 27 | 3 | 1 | 1 | 1 | H | —CH(C₂H₅)—CH₂OC₂H₄OC₂H₅ |
| 28 | 3 | 1 | 1 | 2 | H | —CH(C₂H₅)—CH₂OC₂H₄OC₂H₅ |
| 29 | 3 | 1 | 2 | 2 | H | —CH(C₂H₅)—CH₂OC₂H₄OC₂H₅ |
| 30 | 3 | 1 | 3 | 2 | H | —CH(C₂H₅)—CH₂OC₂H₄OC₂H₅ |
| 31 | 3 | 1 | 1 | 1 | H | —CH(i-C₃H₇)—COOCH₃ |
| 32 | 3 | 1 | 1 | 2 | H | —CH(i-C₃H₇)—COOCH₃ |
| 33 | 3 | 1 | 1 | 2 | H | —CH(i-C₃H₇)—COOCH₃ |
| 34 | 3 | 1 | 1 | 1 | H | —CH(i-C₃H₇)—COOCH₃ |
| 35 | 3 | 1 | 3 | 2 | —n-C₈H₁₇ | —CH(C₂H₅)—CH₂OC₂H₄OC₂H₅ |
| 36 | 3 | 1 | 4 | 2 | H | —CH(COOC₂H₄OC₂H₅)—COOC₂H₄OC₂H₅ |
| 37 | 3 | 1 | 1 | 1 | —C₂H₄OC₂H₄OC₂H₅ | —C₂H₄OC₂H₄OC₂H₅ |
| 38 | 2 | 2 | 1 | 1 | H | —C₂H₄OC₂H₅ |
| 39 | 2 | 2 | 1 | 2 | H | —C₂H₄OC₂H₅ |
| 40 | 2 | 2 | 1 | 3 | H | —C₂H₄OC₂H₅ |
| 41 | 2 | 2 | 1 | 4 | H | —C₂H₄OC₂H₅ |
| 42 | 2 | 2 | 1 | 2 | —C₂H₄OC₂H₅ | —C₂H₄OC₂H₅ |
| 43 | 2 | 2 | 1 | 1 | H | —C₃H₆OC₄H₉ |
| 44 | 2 | 2 | 1 | 2 | H | —C₃H₆OC₄H₉ |
| 45 | 2 | 2 | 1 | 3 | H | —C₃H₆OC₄H₉ |

-continued

| Cl | Number of ⌬ | Number of N⌬ | m | n | R$^1$ | R$^2$ |
|---|---|---|---|---|---|---|
| 46 | 2 | 2 | 1 | 4 | H | —C$_3$H$_6$OC$_4$H$_9$ |
| 47 | 2 | 2 | 1 | 1 | —C$_2$H$_4$OCH$_3$ | —C$_2$H$_4$OCH$_3$ |
| 48 | 2 | 2 | 1 | 2 | —C$_2$H$_4$OCH$_3$ | —C$_2$H$_4$OCH$_3$ |
| 49 | 2 | 2 | 1 | 3 | —C$_2$H$_4$OCH$_3$ | —C$_2$H$_4$OCH$_3$ |
| 50 | 2 | 2 | 1 | 4 | —C$_2$H$_4$OCH$_3$ | —C$_2$H$_4$OCH$_3$ |
| 51 | 2 | 2 | 1 | 3 | —C$_4$H$_9$ | —C$_4$H$_9$ |
| 52 | 2 | 2 | 1 | 1 | H | —CH$_2$—CH(C$_2$H$_5$)—C$_4$H$_9$ |
| 53 | 2 | 2 | 1 | 2 | H | —CH$_2$—CH(C$_2$H$_5$)—C$_4$H$_9$ |
| 54 | 2 | 2 | 1 | 3 | H | —CH$_2$—CH(C$_2$H$_5$)—C$_4$H$_9$ |
| 55 | 2 | 2 | 1 | 4 | H | —CH$_2$—CH(C$_2$H$_5$)—C$_4$H$_9$ |
| 56 | 2 | 2 | 1 | 1 | H | —C$_3$H$_6$—OCH$_2$—CH(C$_2$H$_5$)—C$_4$H$_9$ |
| 57 | 2 | 2 | 1 | 2 | H | —C$_3$H$_6$—OCH$_2$—CH(C$_2$H$_5$)—C$_4$H$_9$ |
| 58 | 2 | 2 | 1 | 3 | H | —C$_3$H$_6$—OCH$_2$—CH(C$_2$H$_5$)—C$_4$H$_9$ |
| 59 | 2 | 2 | 1 | 4 | H | —C$_3$H$_6$—OCH$_2$—CH(C$_2$H$_5$)—C$_4$H$_9$ |
| 60 | 2 | 2 | 1 | 4 | H | —C$_2$H$_4$OC$_2$H$_4$OC$_2$H$_5$ |
| 61 | 2 | 2 | 1 | 1 | —C$_2$H$_5$ | —C$_2$H$_4$OC$_2$H$_5$ |
| 62 | 2 | 2 | 2 | 2 | —i-C$_3$H$_7$ | —CH$_2$O—C$_2$H$_4$—(1,3-dioxane) |
| 63 | 2 | 2 | 3 | 3 | H | —CH(C$_2$H$_5$)—CH$_2$OCH$_3$ |
| 64 | 2 | 2 | 1 | 1 | H | —CH(C$_2$H$_5$)—CH$_2$OC$_2$H$_4$OC$_2$H$_5$ |
| 65 | 2 | 2 | 1 | 2 | H | —CH(C$_2$H$_5$)—CH$_2$OC$_2$H$_4$OC$_2$H$_5$ |
| 66 | 2 | 2 | 3 | 3 | H | —CH(C$_2$H$_5$)—CH$_2$OC$_2$H$_4$OC$_2$H$_5$ |
| 67 | 2 | 2 | 1 | 4 | H | —CH(C$_2$H$_5$)—CH$_2$OC$_2$H$_4$OC$_2$H$_5$ |

-continued

| Cl | Number of benzene | Number of N | m | n | R¹ | R² |
|---|---|---|---|---|---|---|
| 68 | 2 | 2 | 1 | 1 | H | —CH(i-C$_3$H$_7$)—COOCH$_3$ |
| 69 | 2 | 2 | 2 | 2 | H | —CH(i-C$_3$H$_7$)—COOCH$_3$ |
| 70 | 2 | 2 | 3 | 3 | H | —CH(i-C$_3$H$_7$)—COOCH$_3$ |
| 71 | 2 | 2 | 1 | 4 | H | —CH(i-C$_3$H$_7$)—COOCH$_3$ |
| 72 | 2 | 2 | 1 | 4 | —n-C$_8$H$_{17}$ | —CH(C$_2$H$_5$)—CH$_2$OC$_2$H$_4$OC$_2$H$_5$ |
| 73 | 2 | 2 | 1 | 1 | H | —CH(COOC$_2$H$_4$OC$_2$H$_5$)—COOC$_2$H$_4$OC$_2$H$_5$ |
| 74 | 2 | 2 | 2 | 2 | —C$_2$H$_4$OC$_2$H$_4$OC$_2$H$_5$ | —C$_2$H$_4$OC$_2$H$_4$OC$_2$H$_5$ |
| 75 | 1 | 3 | 1 | 1 | H | —C$_2$H$_4$OC$_2$H$_5$ |
| 76 | 1 | 3 | 2 | 2 | H | —C$_2$H$_4$OC$_2$H$_5$ |
| 77 | 1 | 3 | 1 | 3 | H | —C$_2$H$_4$OC$_2$H$_5$ |
| 78 | 1 | 3 | 1 | 4 | H | —C$_2$H$_4$OC$_2$H$_5$ |
| 79 | 1 | 3 | 1 | 3 | —C$_2$H$_4$OC$_2$H$_5$ | —C$_2$H$_4$OC$_2$H$_5$ |
| 80 | 1 | 3 | 1 | 1 | H | —C$_3$H$_6$OC$_4$H$_9$ |
| 81 | 1 | 3 | 1 | 2 | H | —C$_3$H$_6$OC$_4$H$_9$ |
| 82 | 1 | 3 | 1 | 3 | H | —C$_3$H$_6$OC$_4$H$_9$ |
| 83 | 1 | 3 | 1 | 4 | H | —C$_3$H$_6$OC$_4$H$_9$ |
| 84 | 1 | 3 | 1 | 1 | —C$_2$H$_4$OCH$_3$ | —C$_2$H$_4$OCH$_3$ |
| 85 | 1 | 3 | 1 | 2 | —C$_2$H$_4$OCH$_3$ | —C$_2$H$_4$OCH$_3$ |
| 86 | 1 | 3 | 1 | 3 | —C$_2$H$_4$OCH$_3$ | —C$_2$H$_4$OCH$_3$ |
| 87 | 1 | 3 | 1 | 4 | —C$_2$H$_4$OCH$_3$ | —C$_2$H$_4$OCH$_3$ |
| 88 | 1 | 3 | 1 | 4 | —C$_4$H$_9$ | —C$_4$H$_9$ |
| 89 | 1 | 3 | 1 | 1 | H | —CH$_2$—CH(C$_2$H$_5$)—C$_4$H$_9$ |
| 90 | 1 | 3 | 1 | 2 | H | —CH$_2$—CH(C$_2$H$_5$)—C$_4$H$_9$ |
| 91 | 1 | 3 | 1 | 3 | H | —CH$_2$—CH(C$_2$H$_5$)—C$_4$H$_9$ |
| 92 | 1 | 3 | 1 | 4 | H | —CH$_2$—CH(C$_2$H$_5$)—C$_4$H$_9$ |
| 93 | 1 | 3 | 1 | 1 | H | —C$_3$H$_6$—OCH$_2$—CH(C$_2$H$_5$)—C$_4$H$_9$ |
| 94 | 1 | 3 | 1 | 2 | H | —C$_3$H$_6$—OCH$_2$—CH(C$_2$H$_5$)—C$_4$H$_9$ |
| 95 | 1 | 3 | 1 | 3 | H | —C$_3$H$_6$—OCH$_2$—CH(C$_2$H$_5$)—C$_4$H$_9$ |

-continued

| Cl | Number of ⌬ | Number of N-ring | m | n | R¹ | R² |
|---|---|---|---|---|---|---|
| 96 | 1 | 3 | 1 | 4 | H | —C$_3$H$_6$—OCH$_2$—CH(C$_2$H$_5$)—C$_4$H$_9$ |
| 97 | 1 | 3 | 1 | 1 | H | —C$_2$H$_4$OC$_2$H$_4$OC$_2$H$_5$ |
| 98 | 1 | 3 | 1 | 2 | —C$_2$H$_5$ | —C$_2$H$_4$OC$_2$H$_5$ |
| 99 | 1 | 3 | 3 | 3 | —i-C$_3$H$_7$ | —CH$_2$O—C$_2$H$_4$—(1,3-dioxane) |
| 100 | 1 | 3 | 1 | 4 | H | —CH(C$_2$H$_5$)—CH$_2$OCH$_3$ |
| 101 | 1 | 3 | 1 | 1 | H | —CH(C$_2$H$_5$)—CH$_2$OC$_2$H$_4$OC$_2$H$_5$ |
| 102 | 1 | 3 | 4 | 2 | H | —CH(C$_2$H$_5$)—CH$_2$OC$_2$H$_4$OC$_2$H$_5$ |
| 103 | 1 | 3 | 4 | 3 | H | —CH(C$_2$H$_5$)—CH$_2$OC$_2$H$_4$OC$_2$H$_5$ |
| 104 | 1 | 3 | 4 | 3 | H | —CH(C$_2$H$_5$)—CH$_2$OC$_2$H$_4$OC$_2$H$_5$ |
| 105 | 1 | 3 | 1 | 1 | H | —CH$_2$—C$_2$H$_4$COCH$_3$ |
| 106 | 1 | 3 | 2 | 2 | H | —CH$_2$—C$_2$H$_4$COCH$_3$ |
| 107 | 1 | 3 | 3 | 3 | H | —CH$_2$—C$_2$H$_4$COC$_3$H$_7$ |
| 108 | 1 | 3 | 1 | 4 | H | —CH$_2$—C$_2$H$_4$COC$_3$H$_7$ |
| 109 | 1 | 3 | 1 | 1 | —n-C$_8$H$_7$ | —CH(C$_2$H$_5$)—CH$_2$OC$_2$H$_4$OC$_2$H$_5$ |
| 110 | 1 | 3 | 2 | 2 | H | —CH(COOC$_2$H$_4$OC$_2$H$_5$)—COOC$_2$H$_4$OC$_2$H$_5$ |
| 111 | 1 | 3 | 1 | 3 | —C$_2$H$_4$OC$_2$H$_4$OC$_2$H$_5$ | —C$_2$H$_4$OC$_2$H$_4$OC$_2$H$_5$ |
| 112 | 0 | 4 | 1 | 1 | H | —C$_2$H$_4$OC$_2$H$_5$ |
| 113 | 0 | 4 | 1 | 2 | H | —C$_2$H$_4$OC$_2$H$_5$ |
| 114 | 0 | 4 | 1 | 3 | H | —C$_2$H$_4$OC$_2$H$_5$ |
| 115 | 0 | 4 | 1 | 4 | H | —C$_2$H$_4$OC$_2$H$_5$ |
| 116 | 0 | 4 | 1 | 4 | —C$_2$H$_4$OC$_2$H$_5$ | —C$_2$H$_4$OC$_2$H$_5$ |
| 117 | 0 | 4 | 1 | 1 | H | —C$_3$H$_6$OC$_4$H$_9$ |
| 118 | 0 | 4 | 1 | 2 | H | —C$_3$H$_6$OC$_4$H$_9$ |
| 119 | 0 | 4 | 1 | 3 | H | —C$_3$H$_6$OC$_4$H$_9$ |
| 120 | 0 | 4 | 1 | 4 | H | —C$_3$H$_6$OC$_4$H$_9$ |
| 121 | 0 | 4 | 1 | 1 | —C$_2$H$_4$OCH$_3$ | —C$_2$H$_4$OCH$_3$ |
| 122 | 0 | 4 | 1 | 2 | —C$_2$H$_4$OCH$_3$ | —C$_2$H$_4$OCH$_3$ |
| 123 | 0 | 4 | 1 | 3 | —C$_2$H$_4$OCH$_3$ | —C$_2$H$_4$OCH$_3$ |
| 124 | 0 | 4 | 1 | 4 | —C$_2$H$_4$OCH$_3$ | —C$_2$H$_4$OCH$_3$ |
| 125 | 0 | 4 | 1 | 1 | —C$_4$H$_9$ | —C$_4$H$_9$ |
| 126 | 0 | 4 | 1 | 1 | H | —CH$_2$—CH(C$_2$H$_5$)—C$_4$H$_9$ |
| 127 | 0 | 4 | 1 | 2 | H | —CH$_2$—CH(C$_2$H$_5$)—C$_4$H$_9$ |

-continued

| Cl | Number of ⌬ | Number of N-pyridine | m | n | R¹ | R² |
|---|---|---|---|---|---|---|
| 128 | 0 | 4 | 1 | 3 | H | —CH$_2$—CH(C$_2$H$_5$)—C$_4$H$_9$ |
| 129 | 0 | 4 | 1 | 4 | H | —CH$_2$—CH(C$_2$H$_5$)—C$_4$H$_9$ |
| 130 | 0 | 4 | 1 | 1 | H | —CHCOCH$_3$ |
| 131 | 0 | 4 | 1 | 2 | H | —CHCOCH$_3$ |
| 132 | 0 | 4 | 1 | 3 | H | —CHCOOC$_3$H$_7$ |
| 133 | 0 | 4 | 1 | 4 | H | —CHCOOC$_3$H$_7$ |
| 134 | 0 | 4 | 1 | 2 | H | —C$_2$H$_4$OC$_2$H$_4$OC$_2$H$_5$ |
| 135 | 0 | 4 | 1 | 3 | —C$_2$H$_5$ | —C$_2$H$_4$OC$_2$H$_5$ |
| 136 | 0 | 4 | 1 | 4 | —i-C$_3$H$_7$ | —CH$_2$O—C$_2$H$_4$—(1,3-dioxane) |
| 137 | 0 | 4 | 1 | 1 | H | —CH(C$_2$H$_5$)—CH$_2$OCH$_3$ |
| 138 | 0 | 4 | 1 | 1 | H | —CH(C$_2$H$_5$)—CH$_2$OC$_2$H$_4$OC$_2$H$_5$ |
| 139 | 0 | 4 | 1 | 2 | H | —CH(C$_2$H$_5$)—CH$_2$OC$_2$H$_4$OC$_2$H$_5$ |
| 140 | 0 | 4 | 1 | 3 | H | —CH(C$_2$H$_5$)—CH$_2$OC$_2$H$_4$OC$_2$H$_5$ |
| 141 | 0 | 4 | 1 | 4 | H | —CH(C$_2$H$_5$)—CH$_2$OC$_2$H$_4$OC$_2$H$_5$ |
| 142 | 0 | 4 | 1 | 1 | H | —CH(i-C$_3$H$_7$)—COOCH$_3$ |
| 143 | 0 | 4 | 1 | 2 | H | —CH(i-C$_3$H$_7$)—COOCH$_3$ |
| 144 | 0 | 4 | 1 | 3 | H | —CH(i-C$_3$H$_7$)—COOCH$_3$ |
| 145 | 0 | 4 | 1 | 4 | H | —CH(i-C$_3$H$_7$)—COOCH$_3$ |
| 146 | 0 | 4 | 1 | 2 | —n-C$_8$H$_{17}$ | —CH(C$_2$H$_5$)—CH$_2$OC$_2$H$_4$OC$_2$H$_5$ |
| 147 | 0 | 4 | 1 | 3 | H | —CH(COOC$_2$H$_4$OC$_2$H$_5$)—COOC$_2$H$_4$OC$_2$H$_5$ |
| 148 | 0 | 4 | 1 | 4 | —C$_2$H$_4$OC$_2$H$_4$OC$_2$H$_5$ | —C$_2$H$_4$OC$_2$H$_4$OC$_2$H$_5$ |
| 149 | 3 | 1 | 1 | 4 | —C$_{10}$H$_{21}$ | H |
| 150 | 3 | 1 | 1 | 3 | —C$_{12}$H$_{25}$ | —C$_{12}$H$_{25}$ |
| 151 | 3 | 1 | 1 | 4 | —C$_{12}$H$_{25}$ | —C$_2$H$_4$OC$_2$H$_5$ |

-continued

| Cl | Number of phenyl | Number of N (pyridine) | m | n | R¹ | R² |
|---|---|---|---|---|---|---|
| 152 | 3 | 1 | 1 | 1 | —CH(C$_2$H$_5$)CH$_2$OC$_2$H$_4$OC$_2$H$_4$OCH$_3$ | H |
| 153 | 3 | 1 | 1 | 3 | —CH(C$_2$H$_5$)CH$_2$OC$_2$H$_4$OC$_2$H$_4$OC$_2$H$_5$ | —C$_2$H$_5$ |
| 154 | 3 | 1 | 1 | 1 | —CH(C$_4$H$_9$)CH$_2$OC$_2$H$_4$OC$_2$H$_4$OC$_2$H$_5$ | H |
| 155 | 3 | 1 | 1 | 1 | —CH(C$_2$H$_5$)CH$_2$OC$_2$H$_4$OC$_2$H$_4$OC$_4$H$_9$ | H |
| 156 | 3 | 1 | 1 | 2 | —CH(C$_2$H$_5$)CH$_2$OC$_2$H$_4$OC$_2$H$_4$OC$_2$H$_4$OCH$_3$ | H |
| 157 | 3 | 1 | 1 | 3 | —CH(C$_2$H$_5$)CH$_2$OC$_2$H$_4$OC$_2$H$_4$OC$_2$H$_4$OC$_2$H$_5$ | H |

-Dye Compound Represented by Formula (II)-

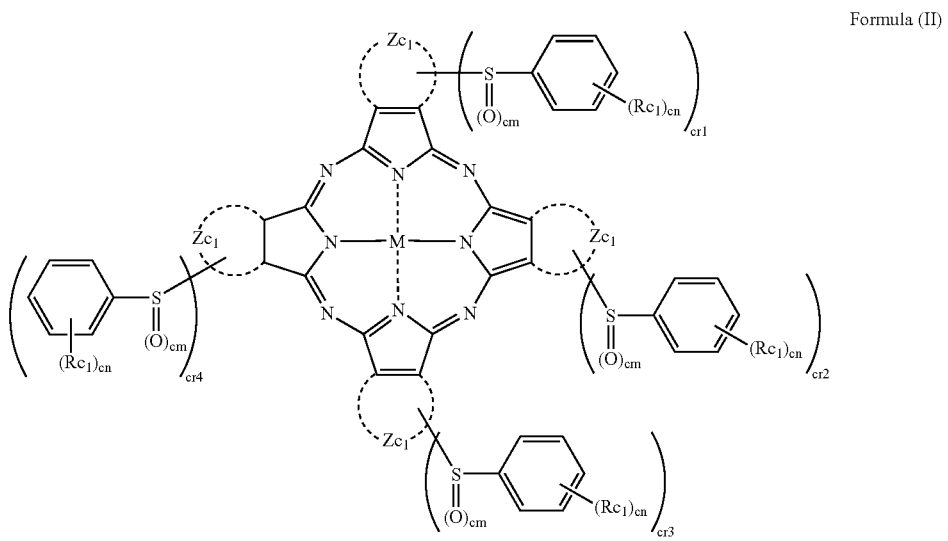

Formula (II)

In formula (II), $Rc_1$ is a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxygroup, an aryloxy group, acyloxy group, a carbamoyloxy group, a heterocyclic oxy group, an aliphatic oxycarbonyloxy group, an N-alkylacylamino group, a carbamoyl amino group, a sulfamoylamino group, an aliphatic oxycarbonylamino group, an aryloxycarbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imido group or a heterocyclic thio group.

$Zc_1$ is a non-metal atom group necessary for forming a 6-membered ring together with carbon atoms, and four $Zc_1$s may be the same as or different from each other.

M is two hydrogen atoms, a divalent metal atom, a divalent metal oxide, a divalent metal hydroxide or a divalent metal chloride.

cm is 0, 1 or 2, cn is 0 or an integer from 1 to 5, and four cns may be the same as or different from each other. One cn is an integer from 1 to 5, and a plurality of Rcis in a molecule may be the same as or different from each other. cr1, cr2, cr3 and cr4 are each independently 0 or 1, and the relationship cr1+cr2+cr3+cr4≧1 is satisfied.

In formula (II), the aliphatic portion of "aliphatic" may be straight-chained, branched or cyclic and may be saturated or unsaturated. Examples of "aliphatic" include an alkyl group, alkenyl group, cycloalkyl group and cycloalkenyl group, and "aliphatic" may be unsubstituted or substituted by a substituent. Moreover, "aryl" may be any one of a monocyclic ring or a condensed ring, and may be unsubstituted or substituted by a substituent. The heterocyclic portion of a "heterocyclic ring" contains a hetero atom (e.g., a nitrogen atom, a sulfur atom or an oxygen atom) in a ring, and may be any one of a saturated ring or an unsaturated ring. The "heterocyclic ring" may be any one of a monocyclic ring or a condensed ring, and may be unsubstituted or substituted by a substituent.

In formula (II), the "substituent" may be a group capable of substitution. Examples thereof include an aliphatic group, an aryl group, a heterocyclic group, an acyl group, an imido group, an azo group, an acyloxy group, an acylamino group, a N-alkylacylamino group, an aliphatic oxy group, an aryloxy group, a heterocyclic oxy group, an aliphatic oxycarbonyl group, an aryloxycarbonyl group, a heterocyclic-oxycarbonyl group, a carbamoyl group, an aliphatic sulfonyl group, an arylsulfonyl group, a heterocyclic sulfonyl group, an aliphatic sulfonyloxy group, an arylsulfonyloxy group, a heterocyclic sulfonyloxy group, a sulfamoyl group, an aliphatic sulfonamide group, an arylsulfonamide group, a heterocyclic sulfonamide group, an amino group, an aliphatic amino group, an arylamino group, a heterocyclic amino group, an aliphatic oxycarbonylamino group, an aryloxycarbonylamino group, a heterocyclic-oxycarbonylamino group, an aliphatic sulfinyl group, an arylsulfinyl group, an aliphatic thio group, an arylthio group, a heterocyclic thio, a hydroxyl group, a cyano group, a sulfo group, a carboxyl group, an aliphatic oxyamino group, an aryloxyamino group, a carbamoylamino group, a sulfamoylamino group, a halogen atom, a sulfamoylcarbamoyl group, a carbamoylsulfamoyl group, a dialiphatic oxyphosphinyl group and a diaryloxyphosphinyl group.

In formula (II), $Rc_1$ is a halogen atom, an aliphatic group, an aryl group, a heterocyclic group, a cyano group, a carboxyl group, a carbamoyl group, an aliphatic oxycarbonyl group, an aryloxycarbonyl group, an acyl group, a hydroxyl group, an aliphatic oxy group, an aryloxy group, acyloxy group, a carbamoyloxy group, a heterocyclic oxy group, an aliphatic oxycarbonyloxy group, an N-alkylacylamino group, a carbamoylamino group, a sulfamoylamino group, an aliphatic oxycarbonylamino group, an aryloxycarbonylamino group, an aliphatic sulfonylamino group, an arylsulfonylamino group, an aliphatic thio group, an aryl thio group, an aliphatic sulfonyl group, an arylsulfonyl group, a sulfamoyl group, a sulfo group, an imido group or a heterocyclic thio group.

Examples of halogen atom represented by $Rc_1$ include a fluorine atom, a chlorine atom and a bromine atom.

The aliphatic group represented by $Rc_1$ may be unsubstituted or substituted by a substituent. The aliphatic group may be saturated or unsaturated, and may be cyclic. As the aliphatic group, an aliphatic group having 1 to 15 carbon atoms is preferred, and examples thereof include methyl group, ethyl group, vinyl group, allyl group, ethynyl group, isopropenyl group and 2-ethylhexyl group.

The aryl group represented by $Rc_1$ may be unsubstituted or substituted by a substituent. As the aryl group, an aryl group having 6 to 16 carbon atoms is preferred and an aryl group having 6 to 12 carbon atoms is more preferred. Examples thereof include phenyl group, 4-nitrophenyl group, 2-nitrophenyl group, 2-chlorophenyl group, 2,4-dichlorophenyl group, 2,4-dimethylphenyl group, 2-methylphenyl group, 4-methoxyphenyl group, 2-methoxyphenyl group and 2-methoxycarbonyl-4-nitrophenyl group.

The heterocyclic group represented by $Rc_1$ may be saturated or unsaturated. As the heterocyclic group, a heterocyclic group having 1 to 15 carbon atoms is preferred, and a heterocyclic group having 3 to 10 carbon atoms is more preferred. Examples thereof include 3-pyridyl group, 2-pyridyl group, 2-pyrimidinyl group, 2-pyrazinyl group and 1-piperidinyl group. Moreover, the heterocyclic group may further have a substituent.

The carbamoyl group represented by $Rc_1$ may be unsubstituted or substituted by a substituent. As the carbamoyl group, a carbamoyl group having 1 to 16 carbon atoms is preferred, and a carbamoyl group having 1 to 12 carbon atoms is more preferred. Examples thereof include carbamoyl group, dimethylcarbamoyl group and dimethoxyethylcarbamoyl group.

The aliphatic oxycarbonyl group represented by $Rc_1$ may be unsubstituted or substituted by a substituent. The aliphatic oxycarbonyl group may be saturated or unsaturated, and may be cyclic. As the aliphatic oxycarbonyl group, an aliphatic oxycarbonyl group having 2 to 16 carbon atoms is preferred, and an aliphatic oxycarbonyl group having 2 to 10 carbon atoms is more preferred. Examples thereof include methoxycarbonyl group and butoxycarbonyl group.

The aryloxycarbonyl group represented by $Rc_1$ may be unsubstituted or substituted by a substituent. As the aryloxycarbonyl group, an aryloxycarbonyl group having 7 to 17 carbon atoms is preferred, and an aryloxycarbonyl group having 7 to 15 carbon atoms is more preferred. Examples thereof include phenoxycarbonyl group.

The acyl group represented by $Rc_1$ may be an aliphatic carbonyl group or an arylcarbonyl group. When the acyl group is an aliphatic carbonyl group, the acyl group may further have a substituent. When the acyl group is an arylcarbonyl group, the acyl group may further have a substituent. The acyl group may be saturated or unsaturated, and may be cyclic. As the acyl group, an acyl group having 2 to 15 carbon atoms is preferred, and an acyl group having 2 to 10 carbon atoms is more preferred. Examples thereof include acetyl group, pivaloyl group and benzoyl group. Moreover, the acyl group may further have a substituent.

The aliphatic oxy group represented by $Rc_1$ may be unsubstituted or substituted by a substituent. The aliphatic oxy group may be saturated or unsaturated, and may be cyclic. As the aliphatic oxy group, an aliphatic oxy group having 1 to 12 carbon atoms is preferred, and an aliphatic oxy group having 1 to 10 carbon atoms is more preferred. Examples thereof include methoxy group, ethoxyethoxy group, phenoxyethoxy group and thiophenoxyethoxy group.

The aryloxy group represented by $Rc_1$ may be unsubstituted or substituted by a substituent. As the aryloxy group, an aryloxy group having 6 to 18 carbon atoms is preferred, and an aryloxy group having 6 to 14 carbon atoms is more preferred. Examples thereof include phenoxy group and 4-methylpheoxy group.

The acyloxy group represented by $Rc_1$ may be unsubstituted or substituted by a substituent. As the acyloxy group, an acyloxy group having 2 to 14 carbon atoms is preferred, and an acyloxy group having 2 to 10 carbon atoms is more preferred. Examples thereof include acetoxy group, methoxyacetoxy group and benzoyloxy group.

The carbamoyloxy group represented by $Rc_1$ may be unsubstituted or substituted by a substituent. As the carbamoyloxy group, a carbamoyloxy group having 1 to 16 carbon atoms is preferred, and a carbamoyloxy group having 1 to 12 carbon atoms is more preferred. Examples thereof include dimethylcarbamoyloxy group and diisopropylcarbamoyloxy group.

The heterocyclic oxy group represented by $Rc_1$ may be unsubstituted or substituted by a substituent. As the heterocyclic oxy group, a heterocyclic oxy group having 1 to 15 carbon atoms is preferred, and a heterocyclic oxy group having 3 to 10 carbon atoms is more preferred. Examples thereof include 3-furyloxy group, 3-pyridyloxy group and N-methyl-2-piperidyloxy group.

The aliphatic oxycarbonyloxy group represented by $Rc_1$ may be unsubstituted or substituted by a substituent. The aliphatic oxycarbonyloxy group may be saturated or unsaturated, and may be cyclic. As the aliphatic oxycarbonyloxy group, an aliphatic oxycarbonyloxy group having 2 to 16 carbon atoms is preferred, and an aliphatic oxycarbonyloxy group having 2 to 10 carbon atoms is more preferred. Examples thereof include methoxycarbonyloxy group and (t)-butoxycarbonyloxy group.

The N-alkylacylamino group represented by $Rc_1$ may be unsubstituted or substituted by a substituent. As the N-alkylacylamino group, an N-alkylacylamino group having 3 to 15 carbon atoms is preferred, and an N-alkylacylamino group having 3 to 12 carbon atoms is more preferred. Examples thereof include N-methylacetylamino group, N-ethoxyethylbenzoylamino group and N-methylmethoxyacetylamino group.

The carbamoylamino group represented by $Rc_1$ may be unsubstituted or substituted by a substituent. As the carbamoylamino group, a carbamoylamino group having 1 to 16 carbon atoms is preferred, and a carbamoylamino group having 1 to 12 carbon atoms is more preferred. Examples thereof include N,N-dimethylcarbamoylamino group and N-methyl-N-methoxyethylcarbamoylamino group.

The sulfamoylamino group represented by $Rc_1$ may be unsubstituted or substituted by a substituent. As the sulfamoylamino group, a sulfamoylamino group having 0 to 16 carbon atoms is preferred, and a sulfamoylamino group having 0 to 12 carbon atoms is more preferred. Examples thereof include N,N-dimethylsulfamoylamino group and N,N-diehtylsulfamoyl group.

The aliphatic oxycarbonylamino group represented by $Rc_1$ may be unsubstituted or substituted by a substituent. As the aliphatic oxycarbonylamino group, an aliphatic oxycarbonylamino group having 2 to 15 carbon atoms is preferred, and an aliphatic oxycarbonylamino group having 2 to 10 carbon atoms is more preferred. Examples thereof include methoxycarbonylamino group and methoxyethoxycarbonylamino group.

The aryloxycarbonylamino group represented by $Rc_1$ may be unsubstituted or substituted by a substituent. As the aryloxycarbonylamino group, an aryloxycarbonylamino group having 7 to 17 carbon atoms is preferred, and an aryloxycarbonylamino group having 7 to 15 carbon atoms is more preferred. Examples thereof include phenoxycarbonylamino group and 4-methoxycarbonylamino group.

The aliphatic sulfonylamino group represented by $Rc_1$ may be unsubstituted or substituted by a substituent. The aliphatic sulfonylamino group may be saturated or unsaturated, and may be cyclic. As the aliphatic sulfonylamino group, an aliphatic sulfonylamino group having 1 to 12 carbon atoms is preferred, and an aliphatic sulfonylamino group having 1 to 8 carbon atoms is more preferred. Examples thereof include methanesulfonylamino group and butanesulfonylamino group.

The arylsulfonylamino group represented by $Rc_1$ may be unsubstituted or substituted by a substituent. As the arylsulfonylamino group, an arylsulfonylamino group having 6 to 15 carbon atoms is preferred, and an arylsulfonylamino group having 6 to 12 carbon atoms is more preferred. Examples thereof include benzenesulfonylamino group and 4-toluenesulfonylamino group.

The aliphatic thio group represented by $Rc_1$ may be unsubstituted or substituted by a substituent. The aliphatic thio group may be saturated or unsaturated, and may be cyclic. As the aliphatic thio group, an aliphatic thio group having 1 to 16 carbon atoms is preferred, and an aliphatic thio group having 1 to 10 carbon atoms is more preferred. Examples thereof include methylthio group, ethylthio group and ethoxyethylthio group.

The arylthio group represented by $Rc_1$ may be unsubstituted or substituted by a substituent. As the arylthio group, an arylthio group having 6 to 22 carbon atoms is preferred, and an arylthio group having 6 to 14 carbon atoms is more preferred. Examples thereof include phenylthio group and 2-t-butylthio group.

The aliphatic sulfonyl group represented by $Rc_1$ may be unsubstituted or substituted by a substituent. As the aliphatic sulfonyl group, an aliphatic sulfonyl group having 1 to 15 carbon atoms is preferred, and an aliphatic sulfonyl group having 1 to 8 carbon atoms is more preferred. Examples thereof include methanesulfonyl group, butanesulfonyl group and methoxyethanesulfonyl group.

The arylsulfonyl group represented by $Rc_1$ may be unsubstituted or substituted by a substituent. As the arylsulfonyl group, an arylsulfonyl group having 6 to 16 carbon atoms is preferred, and an arylsulfonyl group having 6 to 12 carbon atoms is more preferred. Examples thereof include benzenesulfonyl group, 4-t-butylbenzenesulfonyl group, 4-toluenesulfonyl group and 2-toluenesulfonyl group.

The sulfamoyl group represented by $Rc_1$ may be unsubstituted or substituted by a substituent. As the sulfamoyl group, a sulfamoyl group having 0 to 16 carbon atoms is preferred, and a sulfamoyl group having 0 to 12 carbon atoms is more preferred. Examples thereof include sulfamoyl group and dimethylsulfamoyl group.

The imido group represented by $Rc_1$ may be further condensed. As the imido group, an imido group having 3 to 22 carbon atoms is preferred, and an imido group having 3 to 15 carbon atoms is more preferred. Examples thereof include succinimido group and phthalimido group.

The heterocyclic thio group represented by $Rc_1$ may be unsubstituted or substituted by a substituent. As the heterocyclic thio group, a 5 to 7-membered heterocyclic thio group having 1 to 20 carbon atoms is preferred, and a 5 to 7-membered heterocyclic thio group having 1 to 12 carbon atoms is more preferred. Examples thereof include 3-furylthio group and 3-pyridylthio group.

In formula (II), $Zc_1$ is a non-metal atom group necessary for forming a 6-membered ring together with carbon atoms, and four $Zc_1$'s may be the same as or different from each other. The 6-membered ring, which is formed, may be any one of an aryl ring or a heterocyclic ring. The 6-membered ring may be condensed, and the condensed ring may be further substituted by a substituent. Examples of the 6-membered ring include benzene ring, pyridine ring, cyclohexene ring and naphthalene ring, and an embodiment in which the 6-membered ring is the benzene ring is preferred.

In formula (II), M is two hydrogen atoms, a divalent metal atom, a divalent metal oxide, a divalent metal hydroxide or a divalent metal chloride. Examples of M include VO, TiO, Zn, Mg, Si, Sn, Rh, Pt, Pd, Mo, Mn, Pb, Cu, Ni, Co, Fe, AlCl, InCl, FeCl, $TiCl_2$, $SnCl_2$, $SiCl_2$, $GeCl_2$, $Si(OH)_2$ and $H_2$, and an embodiment in which M is VO, Zn, Mn, Cu, Ni, Co is preferred.

In formula (II), cm is 0, 1 or 2 (preferably 0), and cn is 0 or an integer from 1 to 5 (preferably 0 or 1). Four cns in a molecule may be the same as or different from each other. One cn is an integer from 1 to 5. When there are a plurality of $Rc_1$s in a molecule, the plurality of $Rc_1$s may be the same as or different from each other.

Furthermore, cr1, cr2, cr3 and cr4 each are 0 or 1, and the relationship cr1+cr2+cr3+cr4$\geq$1 is satisfied. An embodiment in which cr1+cr2+cr3+cr4 is 3 or 4 is preferred.

Among the dye compounds represented by the formula (II), a dye represented by the following formula (II-1) is preferred in the viewpoint of obtaining the effect of the invention even more effectively.

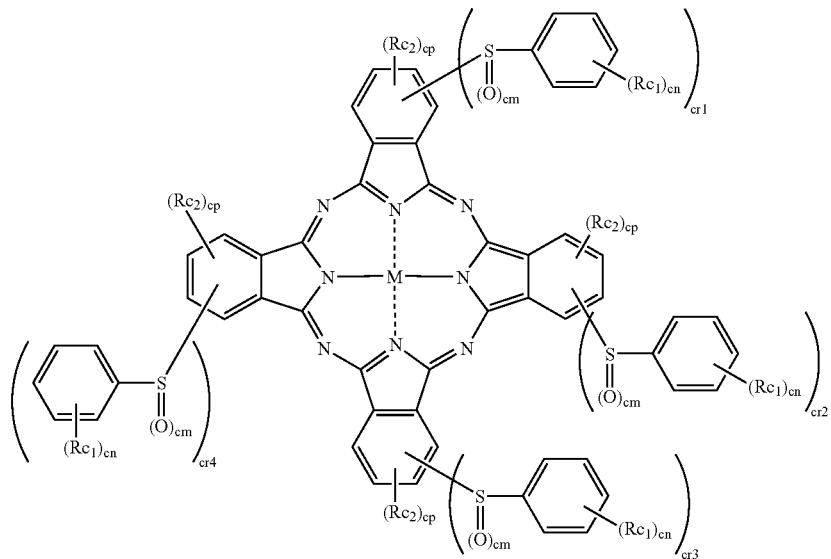

Formula (II-1)

In formula (II-1), $Rc_2$ is a substituent. The substituent may be any substituent as long as the group is capable of substitution, and examples thereof includes the groups exemplified as examples of "substituents" of the above-mentioned formula (II).

Such substituents are preferably an aliphatic group, an aryl group, a heterocyclic group, a N-alkylacylamino group, an aliphatic oxy group, an aryloxy group, a heterocyclic oxy group, an aliphatic oxycarbonyl group, an aryloxycarbonyl group, a heterocyclic-oxycarbonyl group, a carbamoyl group, an aliphatic sulfonyl group, a sulfamoyl group, an aliphatic sulfonamide group, an arylsulfonamide group, an aliphatic amino group, an arylamino group, an aliphatic oxycarbonylamino group, an aryloxycarbonylamino group, an aliphatic thio group, an arylthio group, a hydroxyl group, a cyano group, a sulfo group, a carboxyl group, a carbamoylamino group, a sulfamoylamino group and a halogen atom, and more preferably, an aliphatic group, a N-alkylacylamino group, an aliphatic oxy group, an aliphatic oxycarbonyl group, an aliphatic sulfonyl group, an aliphatic thio group, an arylthio group, a sulfo group, a carboxyl group and a halogen atom.

In formula (II-1), cp is an integer from 0 to 4, and preferably 0 or 1; while cp+cr1, cp+cr2, cp+cr3 and cp+cr4 each are an integer from 0 to 4. When there is a plurality of $Rc_2$s in a molecule, the plurality of $Rc_2$s may be the same as or different from each other.

Further, in formula (II-1), $Rc_1$, M, cm, cn, cr1, cr2, cr3 and cr4 have the same definitions as in formula (II), and preferable embodiments are also similar to those described in formula (II).

Among the dye compound represented by the formula (II-1), a dye represented by the following formula (II-2) is more preferred in the viewpoint of obtaining the effect of the invention even more effectively.

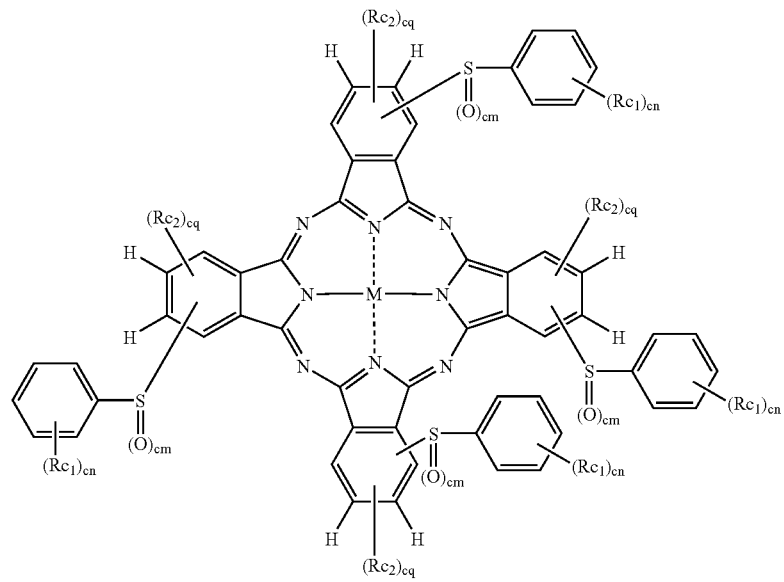

Formula (II-2)

In formula (II-2), $Rc_1$, $Rc_2$, M, cm and cn, have the same definitions as in formulas (II) and (II-1), respectively, and the preferable embodiments are also similar to those described in formulas (II) and (II-1). In formula (II-2), cq is 0 or 1. The phthalocyanine skeleton has a structure in which four benzene rings are condensed to the outside of the tetraazaporphyrin skeleton. Each benzene ring has four sites (carbon atoms) where substituents can be substituted. Formula (II-2) has hydrogen atoms bound to the two sites (β position) far from the tetraazaporphyrin skeleton of each benzene ring.

In formula (II-2), from the viewpoint of exhibiting the effect of the invention more effectively, an embodiment wherein $Rc_1$ is a halogen atom, aliphatic group, cyano group, carbamoyl group, aliphatic oxycarbonyl group, aryloxycarbonyl group, hydroxyl group, aliphatic oxy group, carbamoyloxy group, heterocyclic oxy group, aliphatic oxycarbonyloxy group, carbamoylamino group, sulfamoylamino group, aliphatic oxycarbonylamino group, aliphatic sulfonylamino group, arylsulfonylamino group, aliphatic thio group, arylthio group, aliphatic sulfonyl group, arylsulfonyl group, sulfamoyl group, imido group or sulfo group, is preferred, an embodiment wherein $Rc_1$ is aliphatic group, carbamoyl group, aliphatic oxycarbonyl group, aryloxycarbonyl group, aliphatic oxy group, aliphatic oxycarbonyloxy group, carbamoylamino group, sulfamoylamino group, aliphatic oxycarbonylamino group, aliphatic sulfonylamino group, arylsulfonylamino group, aliphatic sulfonyl group, arylsulfonyl group, sulfamoyl group, imido group or sulfo group, is more preferred, and an embodiment wherein $Rc_1$ is a carbamoyl group, aliphatic oxycarbonyl group, aliphatic oxy group, aliphatic oxycarbonyloxy group, carbamoylamino group, aliphatic oxycarbonylamino group, arylsulfonyl group, imido group or aliphatic sulfonyl group, is the most preferred.

Similarly, from the viewpoint of exhibiting the effect of the invention more effectively, an embodiment wherein $Rc_2$ is an aliphatic group, N-alkylacylamino group, aliphatic oxy group, aliphatic oxycarbonyl group, aliphatic sulfonyl group, aliphatic thio group, arylthio group, sulfo group, carboxyl group or a halogen atom, is preferred, and an embodiment wherein $Rc_2$ is an aliphatic group or a halogen atom, is more preferred. Similarly, from the viewpoint of exhibiting the effect of the invention more effectively, an embodiment wherein cq is 0, is preferred. Further similarly, from the viewpoint of exhibiting the effect of the invention more effectively, an embodiment wherein M is VO, Mn, Co, Ni, Cu, Zn or Mg, is preferred, an embodiment wherein M is VO, Co, Cu or Zn, is more preferred, and an embodiment wherein M is Cu, is the most preferred. In addition, an embodiment wherein cm is 0, is preferred, and an embodiment wherein cn is 1 or 2, is preferred and an embodiment wherein cn is 1, is more preferred.

From the viewpoint of exhibiting the effect of the invention even more effectively, in formula (II-2), an embodiment wherein the $Rc_1$ is a halogen atom, aliphatic group, cyano group, carbamoyl group, aliphatic oxycarbonyl group, aryloxycarbonyl group, hydroxyl group, aliphatic oxy group, carbamoyloxy group, heterocyclic oxy group, aliphatic oxycarbonyloxy group, carbamoylamino group, sulfamoylamino group, aliphatic oxycarbonylamino group, aliphatic sulfonylamino group, arylsulfonylamino group, aliphatic-thio group, arylthio group, aliphatic sulfonyl group, arylsulfonyl group, sulfamoyl group, imido group or sulfo group; M is VO, Co, Cu or Zn; cq is 0; cm is 0; and cn is 1, is preferred. Moreover, an embodiment wherein $Rc_1$ is an aliphatic group, carbamoyl group, aliphatic oxycarbonyl group, aryloxycarbonyl group, aliphatic oxy group, aliphatic oxycarbonyloxy group, carbamoylamino group, sulfamoylamino group, aliphatic oxycarbonylamino group, aliphatic sulfonylamino group, arylsulfonylamino group, aliphatic sulfonyl group, arylsulfonyl group, sulfamoyl group, imido group or sulfo group; M is VO, Co, Cu or Zn; cq is 0; cm is 0; and cn is 1, is more preferred.

Similarly, the viewpoint of exhibiting the effect of the invention even more effectively, an embodiment wherein $Rc_1$ is a carbamoyl group, aliphatic oxycarbonyl group, aliphatic oxy group, carbamoylamino group, aliphatic oxycarbonylamino group, aliphatic sulfonyl group, arylsulfonyl group or imido group; M is Cu; cq is 0; cm is 0; and cn is 1, is the most preferred.

Specific examples of the dye represented by any one of formulas (II) to (II-2) (Exemplary compounds C-1 to C-59) are presented below, while the invention is not limited to these examples.

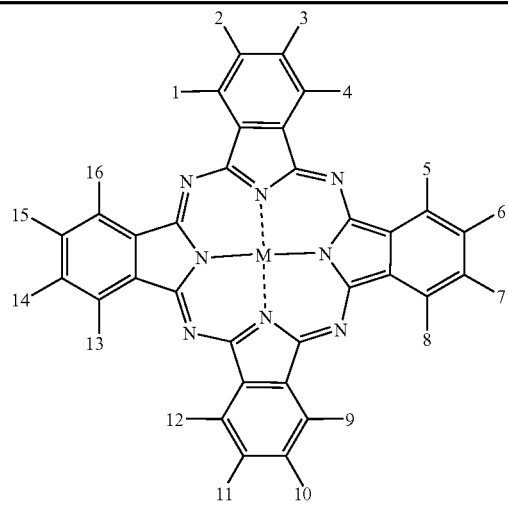

| Exemplary compound | M | Substituents at positions 1 or 4, 5 or 8, 9 or 12, and 13 or 16 (other four positions are occupied by H) | Substituents of the other eight positions |
|---|---|---|---|
| C-1 | Cu | —S—⟨⟩—C(=O)N(CH$_2$CH$_2$OC$_2$H$_5$)$_2$ | H |

-continued
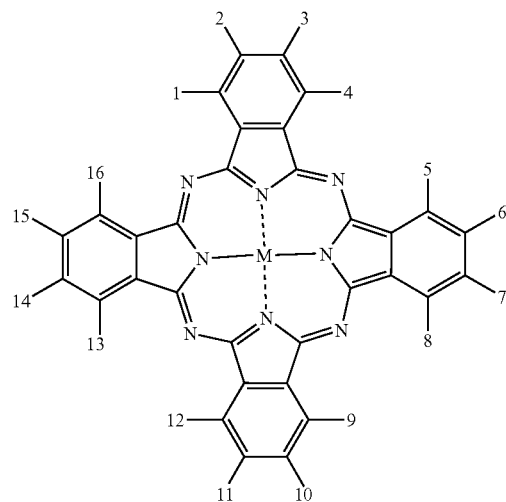
| Exemplary compound | M | Substituents at positions 1 or 4, 5 or 8, 9 or 12, and 13 or 16 (other four positions are occupied by H) | Substituents of the other eight positions |
|---|---|---|---|
| C-2 | Cu | 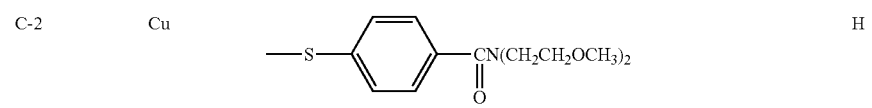 | H |
| C-3 | Cu | 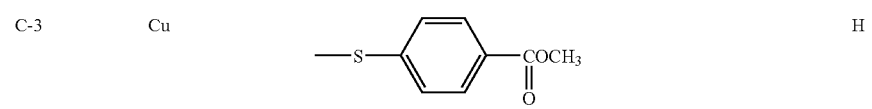 | H |
| C-4 | Cu | 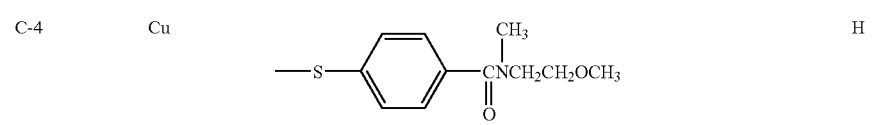 | H |
| C-5 | Cu | 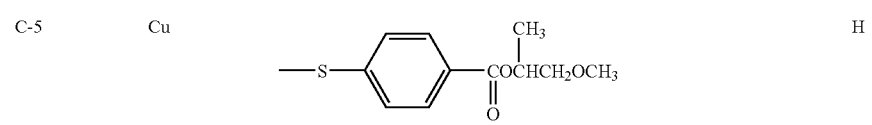 | H |
| C-6 | Cu | 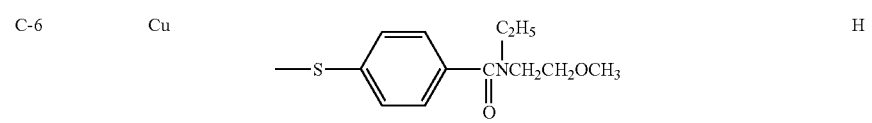 | H |
| C-7 | Cu | 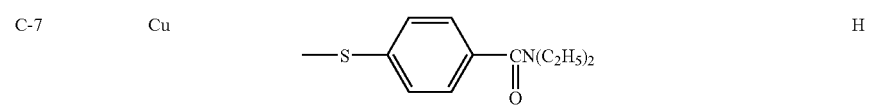 | H |
| C-8 | Cu | 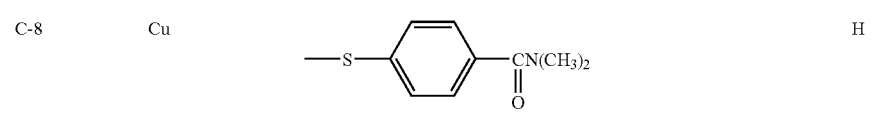 | H |
| C-9 | Cu | 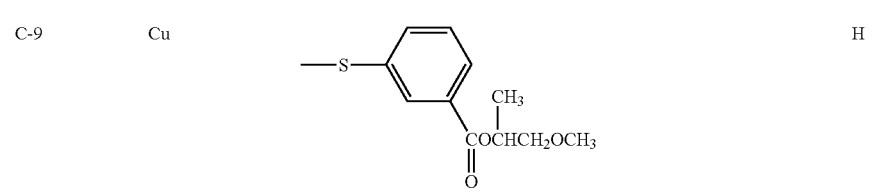 | H |

-continued

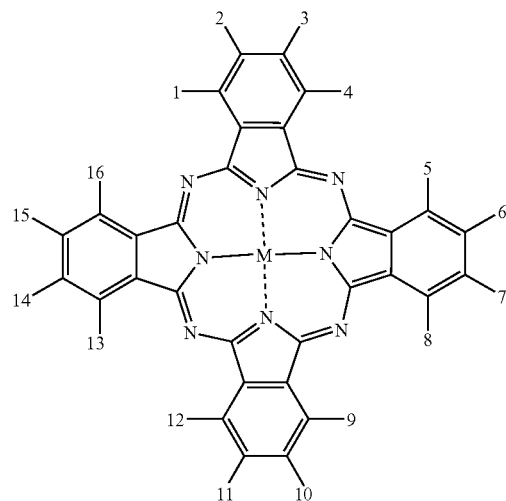

| Exemplary compound | M | Substituents at positions 1 or 4, 5 or 8, 9 or 12, and 13 or 16 (other four positions are occupied by H) | Substituents of the other eight positions |
|---|---|---|---|
| C-10 | Cu | —S—C$_6$H$_4$—C(=O)N(CH$_2$CH$_2$OC$_2$H$_5$)$_2$ (meta) | H |
| C-11 | Cu | —S—C$_6$H$_4$—OCH$_2$CH$_2$OC$_2$H$_5$ (para) | H |
| C-12 | Cu | —S—C$_6$H$_4$—SO$_2$CH$_2$CH$_2$OC$_2$H$_5$ (para) | CH$_3$ groups at position 2 or 3, 6 or 7, 10 or 11, and 14 or 15, and H at other four positions |
| C-13 | Cu | —S(=O)$_2$—C$_6$H$_4$—C(=O)N(CH$_2$CH$_2$OC$_2$H$_5$)$_2$ (meta) | H |
| C-14 | Cu | —S—C$_6$H$_4$—C(=O)N(CH$_2$CH$_2$OC$_2$H$_5$)$_2$ (ortho) | H |
| C-15 | Cu | —S—C$_6$H$_4$—OC(=O)CH$_2$CH$_2$OC$_2$H$_5$ (para) | CH$_3$ groups at position 2 or 3, 6 or 7, 10 or 11, and 14 or 15, and H at other four positions |
| C-16 | Cu | —S—C$_6$H$_4$—NHC(=O)N(CH$_2$CH$_2$OC$_2$H$_5$)$_2$ (para) | H |

-continued
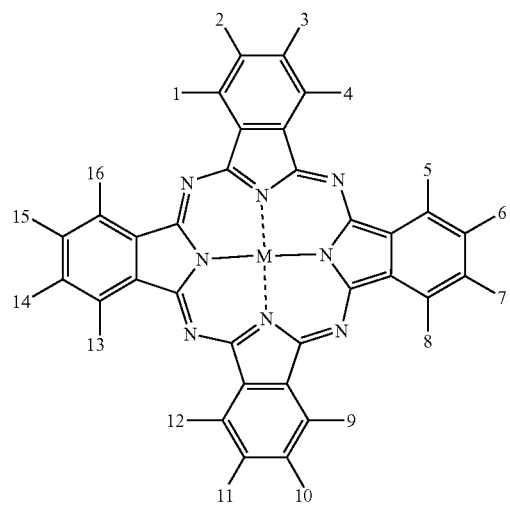
| Exemplary compound | M | Substituents at positions 1 or 4, 5 or 8, 9 or 12, and 13 or 16 (other four positions are occupied by H) | Substituents of the other eight positions |
|---|---|---|---|
| C-17 | Cu | —S—⟨C6H4⟩—NHCOCH(CH3)CH2OCH3 | H |
| C-18 | Cu | —S—⟨C6H3(CH3)⟩—N(CH3)COCH(CH3)CH2OCH3 | H |
| C-19 | Cu | —S—⟨C6H4⟩—CO-O—⟨2,4,6-tri(CH3)C6H2⟩ | H |
| C-20 | Cu | —S—⟨C6H4⟩—NH-SO2N(C2H5)2 | H |
| C-21 | Cu | —S—⟨C6H4⟩—N(CH3)SO2CH3 | H |
| C-22 | Cu | —S—⟨C6H4⟩—NHSO2—⟨C6H5⟩ | H |
| C-23 | Cu | —S—⟨C6H4⟩—SO2—⟨C6H4⟩—CH3 | H |
| C-24 | Cu | —S—⟨C6H4⟩—SO2N(CH2CH2OCH3)2 | H |

-continued
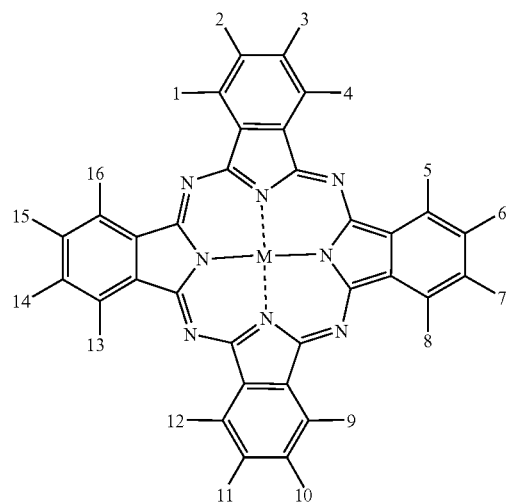
| Exemplary compound | M | Substituents at positions 1 or 4, 5 or 8, 9 or 12, and 13 or 16 (other four positions are occupied by H) | Substituents of the other eight positions |
|---|---|---|---|
| C-25 | Cu | —S—C₆H₃(SO₃Na)(OCH₂CH₂OC₂H₅) | H |
| C-26 | V=O | —S—C₆H₄—C(O)N(CH₂CH₂OC₂H₅)₂ | H |
| C-27 | Co | —S—C₆H₄—C(O)N(CH₃)(CH₂CH₂OCH₃) | H |
| C-28 | Co | —S—C₆H₄—C(O)N(CH₃)₂ | H |
| C-29 | Zn | —S—C₆H₄—NHC(O)CH(CH₃)CH₂OCH₃ | H |
| C-30 | V=O | —S—C₆H₄(OCH₂(CF₂)₃CF₂H) | H |
| C-31 | Cu | —S—C₆H₃(Cl)(OCH₂CH₂OCH₂CH₂OCH₃) | H |

-continued
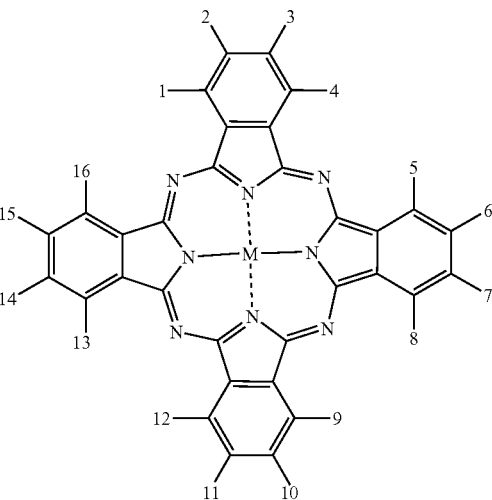
| Exemplary compound | M | Substituents at positions 1 or 4, 5 or 8, 9 or 12, and 13 or 16 (other four positions are occupied by H) | Substituents of the other eight positions |
|---|---|---|---|
| C-32 | Cu | 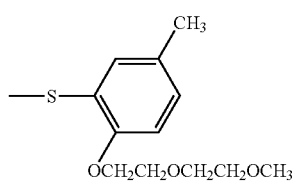 | H |
| C-33 | Cu | 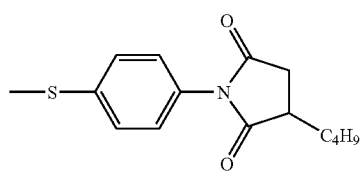 | H |
| C-34 | Cu | 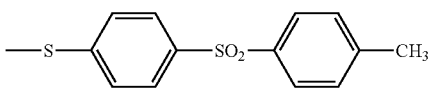 | H |
| C-35 | Cu | 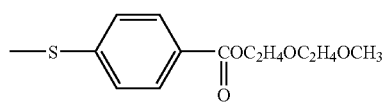 | H |
| C-41 | Cu | 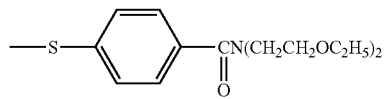 | H |
| C-42 | Cu | 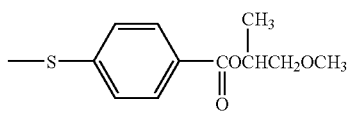 | H |
| C-43 | Cu | 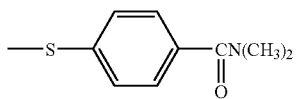 | H |

-continued
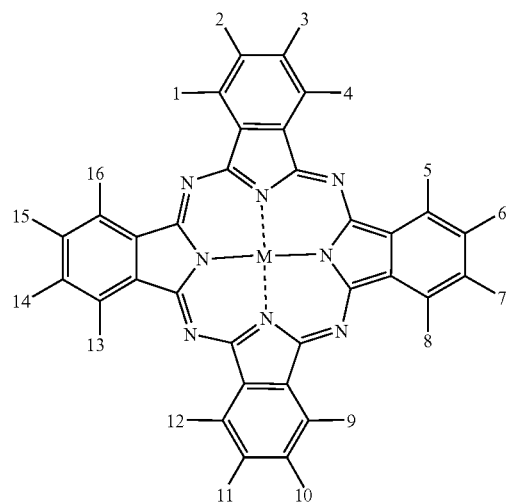
| Exemplary compound | M | Substituents at positions 1 or 4, 5 or 8, 9 or 12, and 13 or 16 (other four positions are occupied by H) | Substituents of the other eight positions |
|---|---|---|---|
| C-44 | Cu | 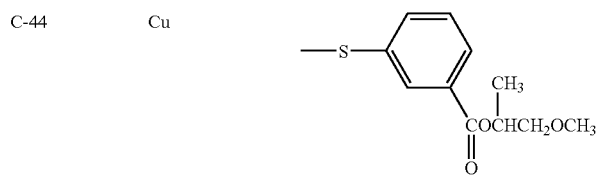 | H |
| C-45 | Co | 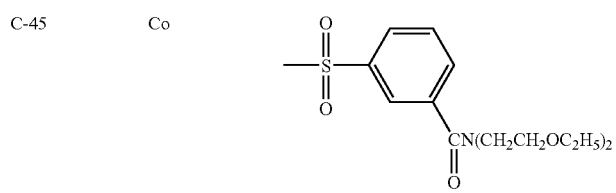 | H |
| C-46 | Zn | 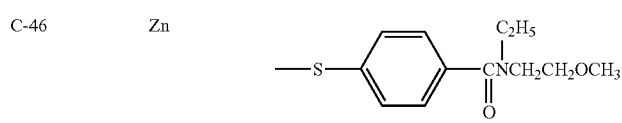 | H |
| C-47 | V=O | 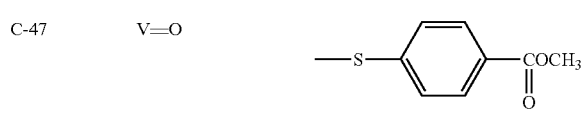 | H |
| C-48 | Cu | 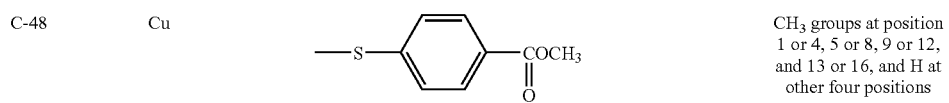 | $CH_3$ groups at position 1 or 4, 5 or 8, 9 or 12, and 13 or 16, and H at other four positions |
| C-49 | Cu | 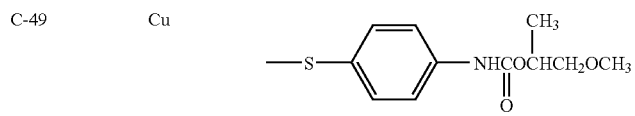 | H |

C-50
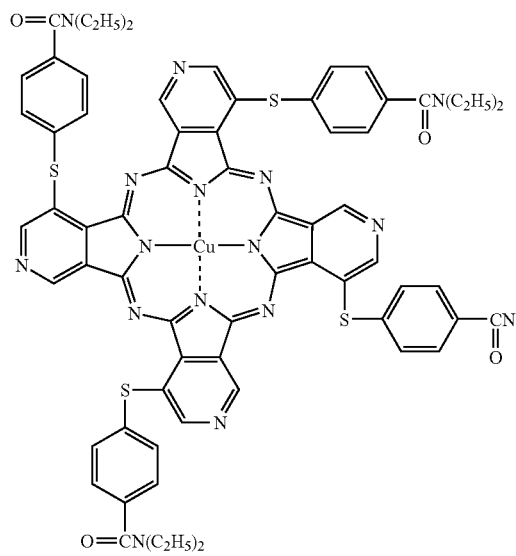
C-53
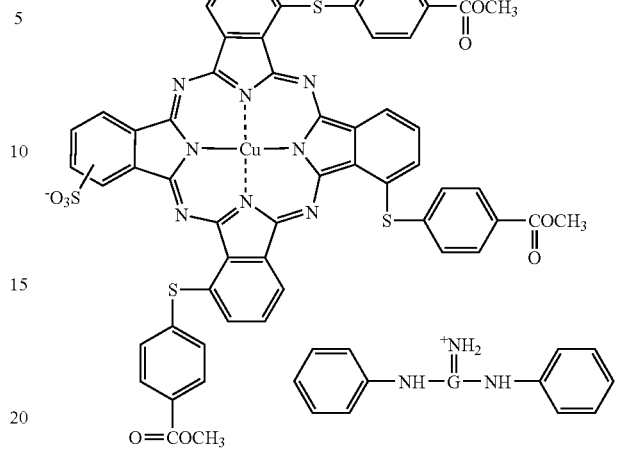
C-51
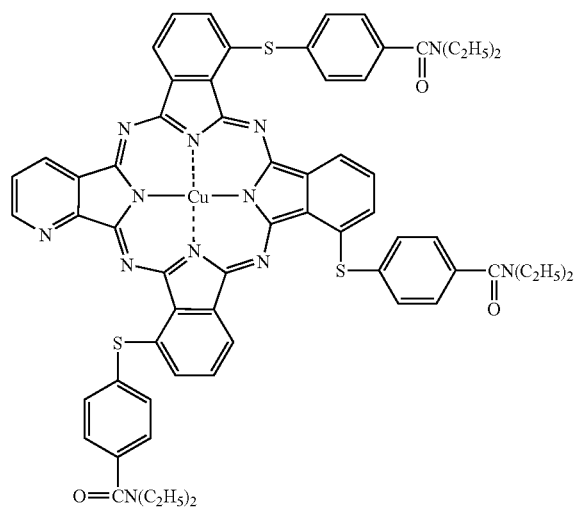
C-54
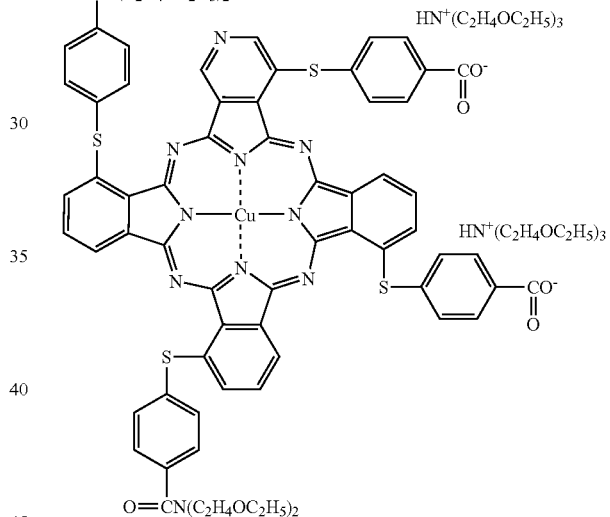
C-52
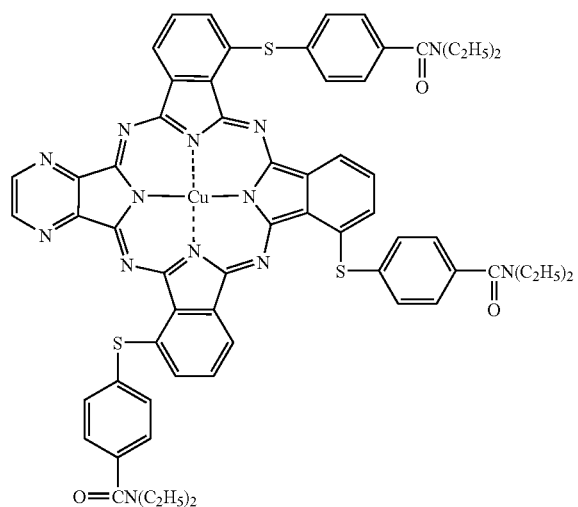
C-55
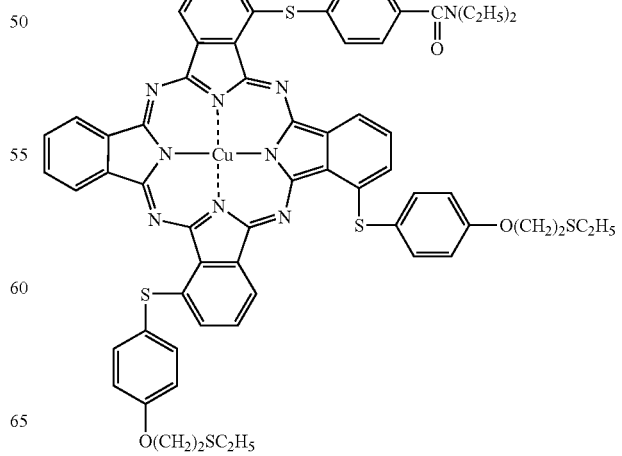

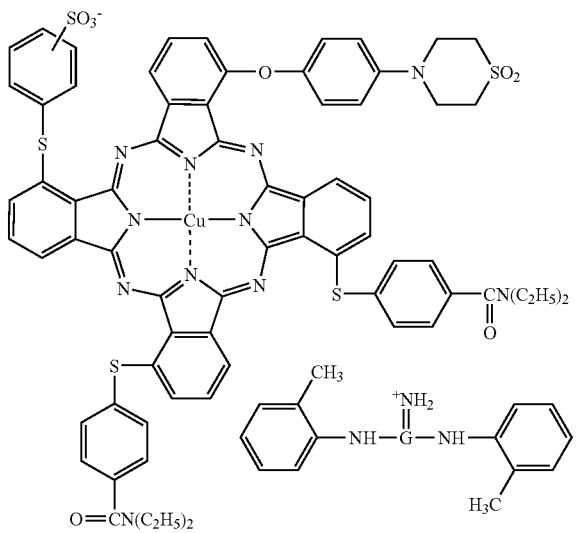

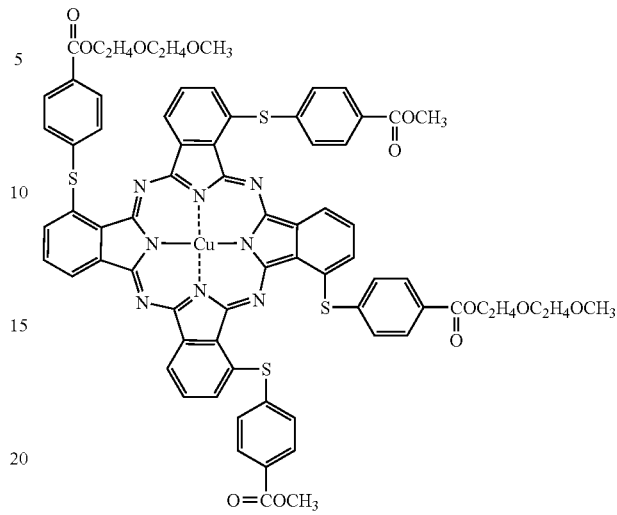

The content of the phthalocyanine, from a viewpoint of the absorbance due to the dye and the film curability, is preferably in the range of 20 to 70 mass %, more preferably in the range of 22 to 68 mass % and particularly preferably in the range of 25 to 65 mass %, based on the total solid content of the dye-containing photosensitive composition of the invention.

<Other Dyes>

In the invention, apart from the phthalocyanine, without particular restriction, as another dye, a known dye for a color filter (preferably a dye soluble in an organic solvent) can be used in combination with the phthalocyanine.

For example, dyes disclosed in JP-A Nos. 64-90403, 64-91102, 1-94301 and 6-11614, Japanese Patent No. 2592207, U.S. Pat. Nos. 4,808,501, 5,667,920 and 5,059,500 and JP-A No. 6-35183 can be used. As chemical structures, dyes such as triphenylmethane dyes, anthraquinone dyes, benzylidene dyes, oxonol dyes, cyanine dyes, phenothiazine dyes, pyrrolopyrazole azomethine dyes, xanthene dyes, phthalocyanine dyes, benzopyran dyes and indigo dyes can be used. Pyrazole azo dyes, anilinoazo dyes, pyrazolotriazole-azo dyes, pyridone-azo dyes and anthrapyridone dyes are particularly preferable.

Other than the above, direct dyes, basic dyes, mordant dyes, acidic mordant dyes and azoic dyes can be used.

-Acidic Dye-

Among the dyes, the acidic dyes will be mainly described. The acidic dye is not particularly restricted insofar as it is a dye having an acidic group such as sulfonic acid, carboxylic acid or a phenolic hydroxyl group. The acidic dye is selected in consideration of all necessary performances such as solubility in an organic solvent or a developing solution, an ability to form a salt with a basic compound, the absorbance, an interaction with other components in the dye-containing photosensitive composition, light resistance and heat resistance.

In the following, specific examples of the acidic dye will be cited. However, the invention is not restricted thereto. Examples of the acidic dyes include:

acid alizarin violet N;
acid black 1, 2, 24, 48;
acid blue 1, 7, 9, 15, 18, 23, 25, 27, 29, 40, 42, 45, 51, 62, 70, 74, 80, 83, 86, 87, 90, 92, 96, 103, 112, 113, 120, 129, 138, 147, 150, 158, 171, 182, 192, 210, 242, 243, 256, 259, 267, 278, 280, 285, 290, 296, 315, 324:1, 335, 340;

acid chrome violet K;

acid Fuchsin;

acid green 1, 3, 5, 9, 16, 25, 27, 50, 58, 63, 65, 80, 104, 105, 106, 109;

acid orange 6, 7, 8, 10, 12, 26, 50, 51, 52, 56, 62, 63, 64, 74, 75, 94, 95, 107, 108, 169, 173;

acid red 1, 4, 8, 14, 17, 18, 26, 27, 29, 31, 34, 35, 37, 42, 44, 50, 51, 52, 57, 66, 73, 80, 87, 88, 91, 92, 94, 97, 103, 111, 114, 129, 133, 134, 138, 143, 145, 150, 151, 158, 176, 182, 183, 198, 206, 211, 215, 216, 217, 227, 228, 249, 252, 257, 258, 260, 261, 266, 268, 270, 274, 277, 280, 281, 195, 308, 312, 315, 316, 339, 341, 345, 346, 349, 382, 383, 394, 401, 412, 417, 418, 422, 426;

acid violet 6B, 7, 9, 17, 19;

acid yellow 1, 3, 7, 9, 11, 17, 23, 25, 29, 34, 36, 38, 40, 42, 54, 65, 72, 73, 76, 79, 98, 99, 111, 112, 113, 114, 116, 119, 123, 128, 134, 135, 138, 139, 140, 144, 150, 155, 157, 160, 161, 163, 168, 169, 172, 177, 178, 179, 184, 190, 193, 196, 197, 199, 202, 203, 204, 205, 207, 212, 214, 220, 221, 228, 230, 232, 235, 238, 240, 242, 243, 251;

Direct Yellow 2, 33, 34, 35, 38, 39, 43, 47, 50, 54, 58, 68, 69, 70, 71, 86, 93, 94, 95, 98, 102, 108, 109, 129, 136, 138, 141;

Direct Orange 34, 39, 41, 46, 50, 52, 56, 57, 61, 64, 65, 68, 70, 96, 97, 106, 107;

Direct Red 79, 82, 83, 84, 91, 92, 96, 97, 98, 99, 105, 106, 107, 172, 173, 176, 177, 179, 181, 182, 184, 204, 207, 211, 213, 218, 220, 221, 222, 232, 233, 234, 241, 243, 246, 250;

Direct Violet 47, 52, 54, 59, 60, 65, 66, 79, 80, 81, 82, 84, 89, 90, 93, 95, 96, 103, 104;

Direct Blue 57, 77, 80, 81, 84, 85, 86, 90, 93, 94, 95, 97, 98, 99, 100, 101, 106, 107, 108, 109, 113, 114, 115, 117, 119, 137, 149, 150, 153, 155, 156, 158, 159, 160, 161, 162, 163, 164, 166, 167, 170, 171, 172, 173, 188, 189, 190, 192, 193, 194, 196, 198, 199, 200, 207, 209, 210, 212, 213, 214, 222, 228, 229, 237, 238, 242, 243, 244, 245, 247, 248, 250, 251, 252, 256, 257, 259, 260, 268, 274, 275, 293;

Direct Green 25, 27, 31, 32, 34, 37, 63, 65, 66, 67, 68, 69, 72, 77, 79, 82;

Mordant Yellow 5, 8, 10, 16, 20, 26, 30, 31, 33, 42, 43, 45, 56, 50, 61, 62, 65;

Mordant Orange 3, 4, 5, 8, 12, 13, 14, 20, 21, 23, 24, 28, 29, 32, 34, 35, 36, 37, 42, 43, 47, 48;

Mordant Red 1, 2, 3, 4, 9, 11, 12, 14, 17, 18, 19, 22, 23, 24, 25, 26, 30, 32, 33, 36, 37, 38, 41, 43, 45, 46, 48, 53, 56, 63, 71, 74, 85, 86, 88, 90, 94, 95;

Mordant Violet 2, 4, 5, 7, 14, 22, 24, 30, 31, 32, 37, 40, 41, 44, 45, 47, 48, 53, 58;

Mordant Blue 2, 3, 7, 8, 9, 12, 13, 15, 16, 19, 20, 21, 22, 23, 24, 26, 30, 31, 32, 39, 40, 41, 43, 44, 48, 49, 53, 61, 74, 77, 83, 84;

Mordant Green 1, 3, 4, 5, 10, 15, 19, 26, 29, 33, 34, 35, 41, 43, 53;

Food Yellow 3; and derivatives of the dyes.

Among the acidic dyes, dyes such as:

acid black 24;

acid blue 23, 25, 29, 62, 80, 86, 87, 92, 138, 158, 182, 243, 324:1;

acid orange 8, 51, 56, 74, 63;

acid red 1, 4, 8, 34, 37, 42, 52, 57, 80, 97, 114, 143, 145, 151, 183, 217, 249;

acid violet 7;

acid yellow 17, 25, 29, 34, 42, 72, 76, 99, 111, 112, 114, 116, 134, 155, 169, 172, 184, 220, 228, 230, 232, 243;

acid green 25; and derivatives thereof can be preferably cited.

As the derivatives of the acidic dyes, an inorganic salt of the acidic dye having a sulfonic acid or a carboxylic acid and a salt of the acidic dye with a nitrogen-containing compound can be used. The derivatives of the acidic dyes are not particularly restricted as long as they can be dissolved as a dye-containing photosensitive composition solution. However, the derivatives of the acidic dyes are selected in consideration of every necessary performance such as solubility in an organic solvent or a developing solution, absorbance, interaction with other components in the dye-containing photosensitive composition, light resistance and heat resistance.

Now, the salt of the acidic dye with a nitrogen-containing compound will be described.

A method of forming the salt of the acidic dye with a nitrogen-containing compound is in some cases effective in improving the solubility of the acidic dye (endowment of the solubility to the organic solvent) and in improving heat resistance and light resistance.

The nitrogen-containing compound that forms a salt with the acidic dye and the nitrogen-containing compound that forms an amide bond with the acidic dye are selected in consideration of all of the solubility of the salt or amide compound in an organic solvent or a developing solution, an ability to form a salt, the absorbance and chromatic valence of the dye, interactions with other components in the dye-containing photosensitive composition, and the heat resistance and light resistance thereof as a colorant. When the nitrogen-containing compound is selected only from the viewpoint of the absorbance and chromatic valence, the nitrogen-containing compound preferably has a molecular weight as small as possible, more preferably a molecular weight of 300 or less, still more preferably a molecular weight of 280 or less, and particularly preferably a molecular weight of 250 or less.

Now, a molar ratio of the nitrogen-containing compound/acidic dye (hereinafter, referred to as "n") in the salt of the acidic dye with the nitrogen-containing compound will be described. The molar ratio n is a value determining a molar ratio of the acidic dye molecule to an amine compound that is a counter ion, and can be arbitrarily selected depending on the conditions for forming a salt of the acidic dye/amine compound. Specifically, a numerical value between $0<n\leq 5$ of the number of functional groups in the acid in the acidic dye is practically used in many cases, and is selected in consideration of all of necessary performances such as the solubility in an organic solvent or a developing solution, the ability to form the salt, the absorbance, interaction with other components in the dye-containing photosensitive composition, light resistance and heat resistance. When it is selected only from the viewpoint of the absorbance, the n preferably takes a numerical value between $0<n\leq 4.5$, more preferably a numerical value between $0<n\leq 4$, and particularly preferably a numerical value between $0<n\leq 3.5$.

Furthermore, as another dye, apart from the phthalocyanine dyes, an organic solvent-soluble dye represented by the following formula (III) is particularly preferably contained.

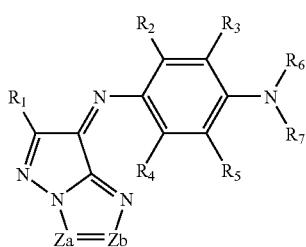

Formula (III)

In formula (III), $R_1$ represents a hydrogen atom or a substituent (other than a perfluoroalkylcarbonylamino group, sulfoneamide group and sulfamoylamino group), $R_2$ to $R_5$ each independently represent a hydrogen atom or a substituent, $R_6$ and $R_7$ each independently represent an alkyl group, alkenyl group, aryl group, or heterocyclic group, and Za and Zb each independently represent —N= or —C($R_8$)=. $R_8$ represents a hydrogen atom or a substituent. $R_2$ and $R_3$ may bonded to each other to form a five-membered, six-membered or seven-membered ring, $R_3$ and $R_6$ may bonded to each other to form a five-membered, six-membered or seven-membered ring, $R_4$ and $R_5$ may bonded to each other to form a five-membered, six-membered or seven-membered ring, $R_5$ and $R_7$ may bonded to each other to form a five-membered, six-membered or seven-membered ring, and $R_6$ and $R_7$ may bonded to each other to form a five-membered, six-membered or seven-membered ring.

$R_1$ to $R_7$, Za and Zb in formula (III) will be described in detail.

$R_1$ in formula (III) represents a hydrogen atom or a substituent, and a substituent represented by $R_1$ represents a halogen atom (for example, fluorine, chlorine or bromine), an alkyl group (preferably a straight-chain, branched or cyclic alkyl group having 1 to 48 carbon atoms such as methyl, ethyl, propyl, isopropyl, butyl, t-butyl, pentyl, hexyl, heptyl, octyl, 2-ethylhexyl, dodecyl, hexadecyl, cyclopropyl, cyclopentyl, cyclohexyl, 1-norbornyl or 1-adamantyl), an alkenyl group (preferably having 2 to 48 carbon atoms such as vinyl, allyl or 3-butene-1-yl), an aryl group (preferably having 6 to 48 carbon atoms such as phenyl or naphthyl), a heterocyclic group (preferably having 1 to 32 carbon atoms such as 2-tienyl, 4-pyridyl, 2-furyl, 2-pyrimidinyl, 1-pyridil, 2-benzothiazolyl, 1-imidazolyl, 1-pyrazoryl or benzotriazol-1-yl), a silyl group (preferably having 3 to 38 carbon atoms such as trimethylsilyl, triethylsilyl, tributylsilyl, t-butyldimethylsilyl or t-hexyldimethylsilyl), a hydroxyl group, a cyano group, a nitro group, an alkoxy group (preferably having 1 to 48 carbon atoms such as methoxy, ethoxy, 1-butoxy, 2-butoxy, isopropoxy, t-butoxy, dodecyloxy or cycloalkyloxy group such as cyclopentyloxy or cyclohexyloxy), an aryloxy group (preferably having 6 to 48 carbon atoms such as phenoxy or 1-naphthoxy), a heterocyclicoxy group (preferably having 1 to 32 carbon atoms such as 1-phenyltetrazole-5-oxy or 2-tetrahydropyranyloxy), a silyloxy group (preferably having 1 to 32 carbon atoms such as trimethylsilyloxy, t-butyldimethylsilyloxy or diphenylmethylsilyloxy), an acyloxy group (preferably having 2 to 48 carbon atoms such as acetoxy, pivaloyloxy, benzoyloxy, or dodecanoyloxy), an alkoxycarbonyloxy group (preferably having 2 to 48 carbon atoms such as ethoxycarbonyloxy, t-butoxycarbonyloxy or cycloalkyloxycarbonyloxy group such as cyclohexyloxycarbonyloxy), an aryloxycarbonyloxy group (preferably having 7 to 32 carbon atoms such as phenoxycarbonyloxy), a carbamoyloxy group (preferably having 1 to 48 carbon atoms such as N,N-dimethylcarbamoyloxy, N-butylcarbamoyloxy, N-phenylcarbamoyloxy or N-ethyl-N-phenylcarbamoyloxy), a sulfamoyloxy group (preferably having 1 to 32 carbon atoms such as N,N-diethylsulfamoyloxy or N-propylsulfamoyloxy), an alkylsulfonyloxy group (preferably having 1 to 38 carbon atoms such as methylsulfonyloxy, hexadecylsulfonyloxy or cyclohexylsulfonyloxy), an arylsulfonyloxy group (preferably having 6 to 32 carbon atoms such as phenylsulfonyloxy), an acyl group (preferably having 1 to 48 carbon atoms such as formyl, acetyl, pivaloyl, benzoyl, tetradecanoyl or cyclohexanoyl), an alkoxycarbonyl group (preferably having 2 to 48 carbon atoms such as methoxycarbonyl, ethoxycarbonyl, octadecyloxycarbonyl or cyclohexyloxycarbonyl), an aryloxycarbonyl group (preferably having 7 to 32 carbon atoms such as phenoxycarbonyl), a carbamoyl group (preferably having 1 to 48 carbon atoms such as carbamoyl, N,N-diethylcarbamoyl, N-ethyl-N-octylcarbamoyl, N,N-dibutylcarbamoyl, N-propylcarbamoyl, N-phenylcarbamoyl, N-methyl-N-phenylcarbamoyl or N,N-dicyclohexylcarbamoyl), an amino group (preferably having 32 carbon atoms or less such as amino, methylamino, N,N-dibutylamino, tetradecylamino, 2-ethylhexylamino or cyclohexylamino), an anilino group (preferably having 6 to 32 carbon atoms such as anilino or N-methylanilino), a heterocyclic amino group (preferably having 1 to 32 carbon atoms such as 4-pyridylamino), a carbonamide group (preferably having 1 to 32 carbon atoms such as acetamide, benzamide, pivaloylamide, cyclohexanamide, adamantylmide or 2-ethylhexaneamide, except for perfluoroalkylcarbonylamino group), an ureido group (preferably having 1 to 32 carbon atoms such as ureido, N,N-dimethylureido or N-phenylureido), an imide group (preferably having 10 carbon atoms or less such as N-succinimide or N-phthalimide), an alkoxycarbonylamino group (preferably having 2 to 48 carbon atoms such as methoxycarbonylamino, ethoxycarbonylamino, t-butoxycarbonylamino, octadecyloxycarbonylamino or cyclohexyloxycarbonylamino), an aryloxycarbonylamino group (preferably having 7 to 32 carbon atoms such as phenoxycarbonylamino), an azo group (preferably having 1 to 32 carbon atoms such as phenylazo or 3-pyrazolylazo), an alkylthio group (preferably having 1 to 48 carbon atoms such as methylthio, ethylthio, octylthio or cyclohexylthio), an arylthio group (preferably having 6 to 48 carbon atoms such as phenylthio), a heterocyclic thio group (preferably having 1 to 32 carbon atoms such as 2-benzothiazolylthio, 2-pyridylthio or 1-phenyltetrazolylthio), an alkylsulfinyl group (preferably having 1 to 32 carbon atoms such as dodecanesulfinyl), an arylsulfinyl group (preferably having 6 to 32 carbon atoms such as phenylsulfinyl), an alkylsulfonyl group (preferably having 1 to 48 carbon atoms such as methylsulfonyl, ethylsulfonyl, propylsulfonyl, butylsulfonyl, isopropylsulfonyl, 2-ethylhexylsulfonyl, hexadecylsulfonyl, octylsulfonyl or cyclohexylsulfonyl), an arylsulfonyl group (preferably having 6 to 48 carbon atoms such as phenylsulfonyl or 1-naphthylsulfonyl), a sulfamoyl group (preferably having 32 carbon atoms or less such as sulfamoyl, N,N-dipropylsulfamoyl, N-ethyl-N-dodecylsulfamoyl, N-ethyl-N-phenylsulfamoyl or N-cyclohexylsulfamoyl), a sulfo group, a phosphonyl group (preferably having 1 to 32 carbon atoms such as phenoxyphosphonyl, octyloxyphosphonyl or phenylphosphonyl), or a phosphinoylamino group (preferably having 1 to 32 carbon atoms such as diethoxyphosphinoylamino or dioctyloxyphosphinoylamino).

When $R_1$ in formula (III) is a group that can be further substituted, $R_1$ may have one or more of the substituents represented by $R_1$ described above, a sulfonamide group or a sulfamoylamino group. When the $R_1$ has two or more substituents, the substituents may be the same as or different from each other.

In formula (III), $R_2$ to $R_5$ each independently represent a hydrogen atom or a substituent group. The substituents represented by $R_2$ to $R_5$ each represent any one of the substituents described as the substituents represented by the $R_1$, a perfluoroalkylcarbonylamino group, a sulfonamide group (preferably having 1 to 48 carbon atoms such as methanesulfonamide, butanesulfonamide, benzenesulfonamide, hexadecanesulfonamide or cyclohexanesulfonamide) or a sulfamoylamino group (preferably having 1 to 48 carbon atoms such as N,N-dipropylsulfamoylamino or N-ethyl-N-dodecylsulfamoylamino).

When $R_2$ of formula (III) is a group that can be further substituted, $R_2$ may have one or more of the substituents described in the substituents represented by the $R_2$ to $R_5$. When $R_3$ of formula (III) is a group that can be further substituted, $R_3$ may have one or more of the substituents described in the substituents represented by the $R_2$ to $R_5$. When $R_4$ of formula (III) is a group that can be further substituted, $R_4$ may have one or more of the substituents described in the substituents represented by the $R_2$ to $R_5$. When $R_5$ of formula (III) is a group that can be further substituted, $R_5$ may have one or more of the substituents described in the substituents represented by the $R_2$ to $R_5$. Furthermore, when $R_2$ to $R_5$ have two or more substituents, the substituents may be the same as or different from each other.

In general, $R_2$ and $R_3$, $R_3$ and $R_6$, $R_4$ and $R_5$, $R_5$ and $R_7$, and/or $R_6$ and $R_7$ in formula (III) may be bonded to each other to form a five-membered, six-membered or seven-membered ring. The five-membered, six-membered or seven-membered ring formed when $R_2$ and $R_3$ are bonded, the five-membered, six-membered or seven-membered ring formed when $R_3$ and $R_6$ are bonded, the five-membered, six-membered or seven-membered ring formed when $R_4$ and $R_5$ are bonded, the five-membered, six-membered or seven-membered ring formed when $R_5$ and $R_7$ are bonded, and the five-membered, six-membered or seven-membered ring formed when $R_6$ and $R_7$ are bonded each may have a substituent described in the substituent of $R_2$ to $R_5$, and when two or more substituents are contained, the substituents may be the same as or different from each other.

In formula (III), $R_6$ and $R_7$ each independently represent an alkyl group, alkenyl group, aryl group or heterocyclic group. Preferred ranges of the alkyl group, alkenyl group, aryl group and heterocyclic group represented by $R_6$ and $R_7$ have the same meanings as those of the alkyl group, alkenyl group, aryl group or heterocyclic group described as the substituent group represented by $R_1$.

When $R_6$ in formula (III) is a group that can be further substituted, $R_6$ may have one or more of the substituents described in the substituent represented by the $R_2$ to $R_5$, and when the $R_7$ in formula (III) is a group that can be further substituted, $R_7$ may have one or more of the substituents described in the substituent represented by the $R_2$ to $R_5$ When $R_6$ and $R_7$ have two or more substituents, the substituents may be the same as or different from each other.

In formula (III), Za and Zb each independently represent =N— or —C($R_8$)=, and $R_8$ represents a hydrogen atom or a substituent.

The substituent represented by $R_8$ has the same meaning with the substituents described in the substituents represented by the $R_2$ to $R_5$. When the substituent represented by $R_8$ is a group that can be further substituted, it may be substituted by the substituents represented by $R_2$ to $R_5$, and when it is substituted by two or more substituents, the substituents may be the same as or different from each other.

Dyes represented by the formula (III) may be preferably represented by the following formula (III-1).

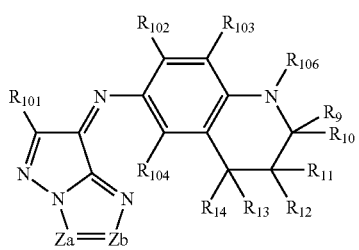

Formula (III-1)

In formula (III-1), $R_{101}$ has the same meaning as that of $R_1$ in formula (III), $R_{102}$ to $R_{104}$ have the same meaning as that of $R_2$ to $R_4$ in formula (III) and $R_{106}$ has the same meaning as that of $R_6$ in formula (III). $R_9$ to $R_{14}$ each independently represent a hydrogen atom or a substituent. Zc and Zd have the same meanings as those of Za and Zb in formula (III).

In the next place, $R_9$ to $R_{14}$, $R_{10}$ to $R_{104}$, $R_{106}$, Zc and Zd of formula (III-1) will be described in detail.

$R_9$ to $R_{14}$ in formula (III-1) each independently represent a hydrogen atom or a substituent, and preferable ranges of the substituents represented by $R_9$ to $R_{14}$ are same as those of the substituents described in the substituents represented by $R_2$ to $R_5$.

When the substituent represented by $R_9$ is a group that can be further substituted, $R_9$ may be substituted by one or more substituents described in the substituents represented by $R_2$ to $R_5$. When the substituent represented by $R_{10}$ is a group that can be further substituted, $R_{10}$ may be substituted by one or more substituents described in the substituents represented by $R_2$ to $R_5$. When the substituent represented by $R_{11}$ is a group that can be further substituted, $R_{11}$ may be substituted by one or more substituents described in the substituents represented by $R_2$ to $R_5$. When the substituent represented by $R_{12}$ is a group that can be further substituted, $R_{12}$ may be substituted by one or more substituents described in the substituents represented by $R_2$ to $R_5$. When the substituent represented by $R_{13}$ is a group that can be further substituted, $R_{13}$ may be substituted by one or more substituents described in the substituents represented by $R_2$ to $R_5$. When the substituent represented by $R_{14}$ is a group that can be further substituted, $R_{14}$ may be substituted by one or more substituents described in the substituents represented by $R_2$ to $R_5$. When $R_9$ to $R_{14}$ are substituted by two or more substituents, the substituents may be the same as or different from each other.

$R_{102}$ and $R_{103}$ may be bonded to each other to form a 5-, 6- or 7-membered ring. $R_{103}$ and $R_{106}$ may be bonded to each other to form a 5-, 6- or 7-membered ring. $R_{106}$ and $R_9$ may be bonded to each other to form a 5-, 6- or 7-membered ring. $R_{104}$ and $R_{14}$ may be bonded to each other to form a 5-, 6- or 7-membered ring.

In formula (III-1), $R_{101}$ has the same meaning as that described of the $R_1$ in formula (III). When the substituent represented by $R_{101}$ is a group that can be further substituted, it may be substituted by one or more substituents described in the substituents represented by $R_2$ to $R_5$. When it is substituted by two or more substituents, the substituents may be the same as or different from each other.

In formula (III-1), $R_{102}$ has the same meaning as that of the $R_2$ in formula (III), $R_{103}$ has the same meaning as that of $R_3$ in formula (III), $R_{104}$ has the same meaning as that of $R_4$ in formula (III) and $R_{106}$ has the same meaning as that of $R_6$ in formula (III).

Zc in formula (III-1) has the same meanings as that of Za in formula (III) and Zd in formula (III-1) has the same meanings as that of Zb in formula (III).

A dye represented by formula (III-1) can be preferably further represented by the following formula (III-2).

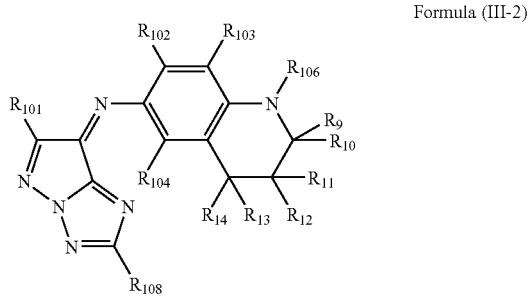

Formula (III-2)

$R_9$ through $R_{14}$, $R_{101}$ through $R_{104}$ and $R_{106}$ in formula (III-2) have the same meaning as those of formula (III-1), and $R_{108}$ represents a hydrogen atom, alkyl group, alkenyl group, aryl group or heterocyclic group.

In the next place, $R_9$ to $R_{14}$, $R_{101}$ to $R_{104}$, $R_{106}$ and $R_{108}$ in formula (III-2) will be described in detail.

$R_9$ to $R_{14}$, $R_{101}$ to $R_{104}$ and $R_{106}$ in formula (III-2) have the same meaning as those of the formula (III-1).

$R_{108}$ in formula (III-2) represents a hydrogen atom, an alkyl group, an alkenyl group, an aryl group or a heterocyclic group, and preferable ranges of the alkyl group, alkenyl group, aryl group and heterocyclic group of $R_{108}$ have the same meaning as that of the alkyl group, alkenyl group, aryl group and heterocyclic group described in the substituents represented by $R_1$ in formula (III).

$R_{108}$ may be further substituted by a substituent described of the substituents represented by $R^2$ to $R^5$, and, when it is substituted by two or more substituents, the substituents may be the same as or different from each other.

In the next place, preferable ranges of dyes represented by formula (III-2) will be described.

Dyes wherein in formula, $R_{101}$ (III-2) represents an alkyl group, alkenyl group, aryl group, heterocyclic group, hydroxyl group, cyano group, alkoxy group, aryloxy group, heterocyclic oxy group, carbamoyloxy group, acyl group, alkoxycarbonyl group, aryloxycarbonyl group, carbamoyl group, imide group, azo group, alkylthio group, arylthio group, heterocyclic thio group, alkylsulfinyl group, arylsulfinyl group, alkylsulfonyl group, arylsulfonyl group, sulfamoyl group, sulfo group, phosphonyl group or phosphinoylamino group; $R_{102}$, $R_{103}$ and $R_{104}$ each independently represent a hydrogen atom, halogen atom, alkyl group, alkenyl group, aryl group, heterocyclic group, alkoxy group, aryloxy group, alkoxycarbonyl group, carbamoyl group, amino group, anilino group, carbonamide group, ureido group, alkoxycarbonylamino group, sulfonamide group, sulfamoylamino group, azo group, alkylthio group, arylthio group, heterocyclic thio group, alkylsulfinyl group, arylsulfinyl group, alkylsulfonyl group, arylsulfonyl group, sulfamoyl group, sulfo group, phosphonyl group or phosphinoylamino group; $R_{106}$ represents an alkyl group, alkenyl group, aryl group or heterocyclic group; $R_{108}$ represents a hydrogen atom, alkyl group, alkenyl group, aryl group or heterocyclic group; and $R_9$ to $R_{14}$ each independently represent a hydrogen atom, halogen atom or alkyl group are preferable.

Dyes wherein in formula (III-2), $R_{101}$ represents an alkyl group, alkenyl group, aryl group, heterocyclic group, alkoxycarbonyl group, carbamoyl group, imide group, alkylthio group, arylthio group, heterocyclic thio group, alkylsulfonyl group or arylsulfonyl group; $R_{102}$, $R_{103}$ and $R_{104}$ each independently represent a hydrogen atom, halogen atom, alkyl group, alkoxy group, aryloxy group, alkoxycarbonyl group, carbamoyl group, carbonamide group, ureido group, alkoxycarbonylamino group, sulfonamide group, alkylthio group or arylthio group; $R_{106}$ represents an alkyl group, alkenyl group, aryl group or heterocyclic group; $R_{108}$ represents a hydrogen atom, alkyl group, alkenyl group, aryl group or heterocyclic group; and $R_9$ to $R_{14}$ each independently represent a hydrogen atom or alkyl group are more preferable.

Dyes wherein in formula (III-2), $R_{101}$ represents an alkyl group, aryl group, heterocyclic group, alkoxycarbonyl group, carbamoyl group, alkylthio group, arylthio group, alkylsulfonyl group or arylsulfonyl group; $R_{102}$, $R_{103}$ and $R_{104}$ each independently represent a hydrogen atom, halogen atom, alkyl group, alkoxy group, aryloxy group, alkoxycarbonyl group, carbamoyl group, carbonamide group, ureido group, alkoxycarbonylamino group, sulfonamide group, alkylthio group or arylthio group; $R_{106}$ represents an alkyl group or aryl group; $R_{108}$ represents a hydrogen atom, alkyl group, alkenyl group, aryl group or heterocyclic group; and $R_9$ to $R_{14}$ each independently represent a hydrogen atom or alkyl group are more preferable.

Dyes wherein in formula (III-2), $R_{10}$ represents an alkyl group; $R_{102}$, $R_{103}$ and $R_{104}$ each independently represent a hydrogen atom, halogen atom, alkyl group or alkoxy group; $R_{106}$ represents an alkyl group; $R_{108}$ represents an alkyl group, aryl group or heterocyclic group; and $R_9$ to $R_{14}$ each independently represent a hydrogen atom or alkyl group are more preferable.

Dyes wherein in formula (III-2), $R_{101}$ represents a tertiary alkyl group (preferably having 4 to 16 carbon atoms, more preferably having 4 to 8 carbon atoms, such as t-butyl, t-amyl, t-octyl or 1-adamantyl); $R_{102}$, $R_{103}$ and $R_{104}$ each independently represent a hydrogen atom, halogen atom (for example a fluorine atom, chlorine atom, bromine atom or iodine atom, preferably a fluorine atom or chlorine atom), an alkyl group (preferably having 1 to 12 carbon atoms, more preferably having 1 to 8 carbon atoms, such as methyl, ethyl, propyl, isopropyl, t-butyl, cyclohexyl or 2-ethylhexyl), or an alkoxy group (preferably having 1 to 12 carbon atoms, more preferably having 1 to 8 carbon atoms such as methoxy, ethoxy, isopropyloxy, octyloxy or 2-ethylhexyloxy); $R_{106}$ represents an alkyl group (preferably having 1 to 18 carbon atoms, more preferably having 1 to 12 carbon atoms such as methyl, ethyl, propyl, isopropyl, octyl, 2-ethylhexyl, 2-hydroxyethyl or 3-hydroxypropyl); $R_{108}$ represents an alkyl group (preferably having 1 to 24 carbon atoms, more preferably having 1 to 18 carbon atoms, such as methyl, ethyl, isopropyl, t-butyl, 2-ethylhexyl, dodecyl or hexadecyl), an alkenyl group (preferably having 2 to 18 carbon atoms, more preferably having 2 to 12 carbon atoms, such as vinyl, allyl or 3-butene-1-yl), an aryl group (preferably having 6 to 24 carbon atoms, more preferably having 6 to 12 carbon atoms such as phenyl or naphthyl), or a heterocyclic group (preferably having 1 to 12 carbon atoms, more preferably having 2 to 12 carbon atoms, such as 2-thienyl, 4-pyridyl, 2-pyridyl, 2-imidazolyl or 3-pyrazolyl); $R_9$ and $R_{10}$ each represent an alkyl group (preferably having 1 to 8 carbon atoms, more preferably having 1 to 4 carbon atoms, such as methyl, ethyl, propyl and most preferably methyl); $R_{11}$ to $R_{13}$ each represent a hydrogen atom; and $R_{14}$ represents an alkyl group (preferably having 1 to 8 carbon atoms, more preferably having 1 to 4 carbon atoms, such as methyl, ethyl, propyl, and most preferably methyl) are most preferable.

Here, a total content of the dye components will be described. A total content of the dye components is preferably in the range of 20 to 80 mass %, more preferably in the range of 30 to 75 mass % and particularly preferably in the range of 40 to 70 mass %, relative to the total solid content of the dye-containing photosensitive composition of the invention.

<Photosensitive Compound>

The dye-containing photosensitive composition of the invention contains at least one kind of photosensitive compound. The photosensitive compound is preferably a photopolymerization initiator and/or a photoacid generator.

In the beginning, the photopolymerization initiator will be described. The photopolymerization initiator, as long as it can polymerize a monomer having the polymerizability, is not particularly restricted. It is preferably selected in view of the characteristics, initiation efficiency, an absorption wavelength, availability and cost.

Examples of the photopolymerization initiator include at least one active halogen compound selected from a halomethyloxadiazole compound and a halomethyl-s-triazine compound, a 3-aryl-substituted coumarine compound, a roffin dimer, a benzophenone compound, an acetophenone compound and its derivative, a cyclopentadiene-benzene-iron complex and its salt, and an oxime-based compound.

Examples of the halomethyloxadiazole compound that is an active halogen compound include 2-halomethyl-5-vinyl-1,3,4-oxadiazole compound and the like described in JP-B No. 57-6096, 2-trichloromethyl-5-styryl-1,3,4-oxadiazole, 2-trichloromethyl-5-(p-cyanostyryl)-1,3,4-oxadiazole and 2-trichloromethyl-5-(p-methoxystyryl)-1,3,4-oxadiazole.

Examples of the halomethyl-s-triazine-based compound that is the active halogen compound include a vinylhalomethyl-s-triazine compound described in JP-B No. 59-1281, and a 2-(naphtho-1-yl)-4,6-bishalomethyl-s-triazine compound and a 4-(p-aminophenyl)-2,6-dihalomethyl-s-triazine compound described in JP-A No. 53-133428.

Other examples thereof include 2,4-bis(trichloromethyl)-6-p-methoxystyryl-s-triazine, 2,6-bis(trichloromethyl)-4-(3,4-methylenedioxyphenyl)-1,3,5-triazine, 2,6-bis(trichloromethyl)-4-(4-methoxyphenyl)-1,3,5-triazine, 2,4-bis(trichloromethyl)-6-(1-p-dimethylaminophenyl-1,3-butadienyl)-s-triazine, 2-trichloromethyl-4-amino-6-p-methoxystyryl-s-triazine, 2-(naphtho-1-yl)-4,6-bis-trichloromethyl-s-triazine, 2-(4-methoxynaphto-1-yl)-4,6-bis-trichloromethyl-s-triazine, 2-(4-ethoxy-naphtho-1-yl)-4,6-bis-trichloromethyl-s-triazine, 2-(4-butoxy-naphtho-1-yl)-4,6-bis-trichloromethyl-s-triazine, 2-[4-(2-methoxyethyl)-naphto-1-yl]-4,6-bis-trichloromethyl-s-triazine, 2-[4-(2-ethoxyethyl)-naphtho-1-yl]-4,6-bis-trichloromethyl-s-triazine, 2-[4-(2-butoxyethyl)-naphtho-1-yl]-4,6-bis-trichloromethyl-s-triazine, 2-(2-methoxy-naphtho-1-yl)-4,6-bis-trichloromethyl-s-triazine, 2-(6-methoxy-5-methyl-naphtho-2-yl)-4,6-bis-trichloromethyl-s-triazine, 2-(6-methoxy-naphtho-2-yl)-4,6-bis-trichloromethyl-s-triazine, 2-(5-methoxy-naphtho-1-yl)-4,6-bis-trichloromethyl-s-triazine, 2-(4,7-dimethoxy-naphtho-1-yl)-4,6-bis-trichloromethyl-s-triazine, 2-(6-ethoxy-naphtho-2-yl)-4,6-bis-trichloromethyl-s-triazine, 2-(4,5-dimethoxy-naphtho-1-yl)-4,6-bis-trichloromethyl-s-triazine, 4-[p-N,N-di(ethoxycarbonylmethyl)aminophenyl]-2,6-di(trichloromethyl)-s-triazine, 4-[o-methyl-p-N,N-di(ethoxycarbonylmethyl)aminophenyl]-2,6-di(trichloromethyl)-s-triazine, 4-[p-N,N-di(chloroethyl) aminophenyl]-2,6-di(trichloromethyl)-s-triazine, 4-[o-methyl-p-N,N-di(chloroethyl)aminophenyl]-2,6-di (trichloromethyl)-s-triazine, 4-[p-N-chloroethylaminophenyl]-2,6-di(trichloromethyl)-s-triazine, 4-(p-N-ethoxycabonylmethylaminophenyl)-2,6-di(trichloromethyl)-s-triazine, 4-[p-N,N-di(phenyl)aminophenyl]-2,6-di(trichloroemthyl)-s-triazine, 4-(p-N-chloroethylcarbonylaminophenyl)-2,6-di(trichloromethyl)-s-triazine, 4-[p-N-(p-methoxyphenyl)carbonylaminophenyl]-2,6-di (trichloromethyl)-s-triazine, 4-[m-N,N-di (ethoxycarbonylmethyl)aminophenyl]-2,6-di (trichloromethyl)-s-triazine, 4-[m-bromo-p-N,N-di (ethoxycarbonylmethyl)aminophenyl]-2,6-di (trichloromethyl)-s-triazine, 4-[m-chloro-p-N, N-di (ethoxycarbonylmethyl)aminophenyl]-2,6-di (trichloromethyl)-s-triazine, 4-[m-fluoro-p-N,N-di (ethoxycarbonylmethyl)aminophenyl]-2,6-di (trichloromethyl)-s-triazine, 4-[o-bromo-p-N,N-di(ethoxycarbonylmethyl)aminophenyl]-2,6-di(trichloromethyl)-s-triazine, 4-[o-chloro-p-N,N-di(ethoxycarbonylmethyl)aminophenyl]-2,6-di(trichloromethyl)-s-triazine, 4-[o-fluoro-p-N,N-di (ethoxycarbonylmethyl)aminophenyl]-2,6-di (trichloromethyl)-s-triazine, 4-[o-bromo-p-N,N-di (chloroethyl)aminophenyl]-2,6-di(trichloromethyl)-s-triazine, 4-[o-chloro-p-N,N-di(chloroethyl)aminophenyl]-2,6-di-(trichloromethyl)-s-triazine, 4-[o-fluoro-p-N,N-di (chloroethyl)aminophenyl]-2,6-di(trichloromethyl)-s-triazine, 4-[m-bromo-p-N,N-di(chloroethyl)aminophenyl]-2,6-di(trichloromethyl)-s-triazine, 4-[m-chloro-p-N,N-di (chloroethyl)aminophenyl]-2,6-di(trichloromethyl)-s-triazine, 4-[m-fluoro-p-N,N-di(chloroethyl)aminophenyl]-2,6-di (trichloromethyl)-s-triazine, 4-(m-bromo-p-N-ethoxycarbonylmethylaminophenyl)-2,6-di(trichloromethyl)-s-triazine, 4-(m-chloro-p-N-ethoxycarbonylmethylaminophenyl)-2,6-di(trichloromethyl)-s-triazine, 4-(m-fluoro-p-N-ethoxycarbonylmethylaminophenyl)-2,6-di(trichloromethyl)-s-triazine, 4-(o-bromo-p-N-ethoxycarbonylmethylaminophenyl)-2,6-di(trichloromethyl)-s-triazine, 4-(o-chloro-p-N-ethoxycarbonylmethylaminophenyl)-2,6-di (trichloromethyl)-s-triazine, 4-(o-fluoro-p-N-ethoxycarbonylmethylaminophenyl)-2,6-di (trichloromethyl)-s-triazine, 4-(m-bromo-p-N-chloroethylaminophenyl)-2,6-di(trichloromethyl)-s-triazine, 4-(m-chloro-p-N-chloroethylaminophenyl)-2,6-di(trichloromethyl)-s-triazine, 4-(m-fluoro-p-N-chloroethylaminophenyl)-2,6-di(trichloromethyl)-s-triazine, 4-(o-bromo-p-N-chloroethylaminophenyl)-2,6-di(trichloromethyl)-s-triazine, 4-(o-chloro-p-N-chloroethylaminophenyl)-2,6-di (trichloromethyl)-s-triazine and 4-(o-fluoro-p-N-chloroethylaminophenyl)-2,6-di(trichloromethyl)-s-triazine.

Examples of the photopolymerization initiator further include TAZ series such as TAZ-107, TAZ-110, TAZ-104, TAZ-109, TAZ-140, TAZ-204, TAZ-113 and TAZ-123 (trade name, manufactured by Midori Kagaku Co., Ltd.), T series such as T-OMS, T-BMP, T-R and T-B (trade name, manufactured by PANCHIM, Inc.), IRGACURE series such as IRGACURE 651, IRGACURE 184, IRGACURE 500, IRGACURE 1000, IRGACURE 149, IRGACURE 819 and IRGACURE 261 and DAROCURE series such as DAROCURE 1173 (trade name, manufactured by Ciba Specialty Chemicals Ltd.), 4,4'-bis(diethylamino)-benzophenone, 2-(O-benzoyloxime)-1-[4-(phenylthio)phenyl]-1,2-octadione, 1-(O-acetyloxime)-1-[9-ethyl-6-(2-methylbenzoyl)-9H-carbazole-3-yl]ethanone, 2-benzyl-2-dimethylamino-4-morpholinobutylophenone, 2,2-dimethoxy-2- phenylacetophenone, a 2-(o-chlorophenyl)-4,5-diphenylimidazolyl dimer, a 2-(o-fluorophenyl)-4,5-diphenylimidazolyl dimer, a 2-(o-methoxyphenyl)-4,5-diphenylimidazolyl dimer, a 2-(p-methoxyphenyl)-4,5-diphenylimidazolyl dimer, a 2-(p-dimethoxyphenyl)-4,5-diphenylimidazolyl dimer, a 2-(2,4-dimethoxyphenyl)-4,5-diphenylimidazolyl dimer, a 2-(p-methylmercaptophenyl)-4,5-diphenylimidazolyl dimer and benzoin isopropyl ether.

Among the above polymerization initiators, the oxime-based compounds are preferable and 2-(O-benzoyloxime)-1-[4-(phenylthio)phenyl]-1,2-octanedion and 1-(O-acetyloxime)-1-[9-ethyl-6-(2-methylbenzoyl)-9H-carbazole-3-yl]ethanone are most preferable.

In the composition of the invention, a known initiator other than the aforementioned photopolymerization initiator may be contained.

Specific examples thereof include a vicinal polyketolaldonyl compound described in U.S. Pat. No. 2,367,660, α-carbonyl compounds described in U.S. Pat. Nos. 2,367,661 and 2,367,670, an acyloin ether described in U.S. Pat. No. 2,448,828, an aromatic acyloin compound substituted by an α-hydrocarbon described in U.S. Pat. No. 2,722,512, a polynuclear quinone compound described in U.S. Pat. Nos. 3,046,127 and 2,951,758, a combination of a trialryl imidazole dimer and p-aminophenyl ketone described in U.S. Pat. No. 3,549,367, and a benzothiazole-based compound and a trihalomethyl-s-triazine compound described in JP-B No. 51-48516.

A sensitizor and a light stabilizer can be used in combination with the photopolymerization initiator.

Specific examples include benzoin, benzoin methylether, 9-fluorenone, 2-chloro-9-fluorenone, 2-methyl-9-fluorenone, 9-anthrone, 2-bromo-9-anthrone, 2-ethyl-9-anthrone, 9,10-anthraquinone, 2-ethyl-9,10-anthraquinone, 2-t-butyl-9,10-anthraquinone, 2,6-dichloro-9,10-anthraquinone, xanthone, 2-methylxanthone, 2-methoxyxanthone, 2-ethoxyxanthone, thioxanthone, 2,4-diethylthioxanthone, acrydone, 10-butyl-2-chloroacrydone, benzyl, dibenzalacetone, p-(dimethylamino)phenyl styrylketone, p-(dimethylamino) phenyl-p-methyl styrylketone, benzophenone, p-(dimethylamino)benzophenone (or Michller's ketone), p-(diethylamino)benzophenone, benzoanthrone, benzothiazole-based compounds described in JP-B No. 51-48516, and Tinuvin 1130 and 400.

A used amount of the photopolymerization initiator is preferably in the range of 10 to 40.0 mass %, more preferably in the range of 2.5 to 30.0 mass % and particularly preferably in the range of 5.0 to 20.0 mass %, based on the solid content. When the used amount thereof is less than 1.0 mass %, the polymerization may be difficult to proceed, and when it exceeds 40.0 mass %, although the polymerization ratio becomes larger, in some cases, the molecular weight becomes smaller to reduce the film strength.

To the composition of the invention, apart from the above, a thermal polymerization inhibitor may be preferably added. For example, hydroquinone, p-methoxyphenol, di-t-butyl-p-cresol, pyrogallol, t-butylcatecol, benzoquinone, 4,4'-thiobis(3-methyl-6-t-butylphenol), 2,2'-methylenebis(4-methyl-6-t-butylphenol) and 2-mercaptobenzoimidazole are useful.

In the next place, as an example of the photosensitive compound, a photoacid generator will be described. As the photoacid generator, known ones can be used. Examples of photoacid generators include diazonium salts described in S. I. Schlesinger, Photogr. Sci. Eng., 18, 387 (1974) and T. S. Bal et al., Polymer, 21, 423 (1980); ammonium salts described in U.S. Pat. Nos. 4,069,055, 4,069,056 and JP-A No. 3-140140; phosphonium salts described in D. C. Necker et al., Macromolecules, 17, 2468 (1984), C. S. Wen et al., Teh, Proc. Conf. Rad. Curing ASIA, p. 478, Tokyo, October (1988), U.S. Pat. Nos. 4,069,055 and 4,069,056; iodonium salts described in J. V. Crivello et al., Macromolecules, 10 (6) 1307 (1977), Chem. & Eng. News, Nov. 28, p. 31 (1988), European Patent No. 104,143, U.S. Pat. Nos. 339,049 and 410,201 and JP-A Nos. 2-150848 and 2-296514; sulfonium salts described in J. V. Crivello et al., Polymer J., 17, 73 (1985), J. V. Crivello et al., J. Org. Chem., 43, 3055 (1978), W. R. Watt et al., J. Polymer Sci., Polymer Chem. Ed., 22, 1789 (1984), J. V. Crivello et al., Polymer Bull., 14, 279 (1985), J. V. Crivello et al., Macromolecules, 14 (5), 1141 (1981), J. V. Crivello et al., J. Polymer Sci., Polymer Chem. Ed., 17, 2877 (1979), European Patent No. 370,693, U.S. Pat. No. 3,902,114, European Patent Nos. 233,567, 297,443 and 297,442, U.S. Pat. Nos. 4,933,377, 410, 201, 339,049, 4,760,013, 4,734,444 and 2,833,827 and German Patents Nos. 2,904,626, 3,604,580 and 3,604,581;

selenonium salts described in J. V. Crivello et al., Macromolecules, 10 (6), 1307 (1977) and J. V. Crivello et al., J. Polymer Sci., Polymer Chem. Ed., 17, 1047 (1979); onium salts such as arsonium salts described in C. S. Wen et al., Teh, Proc. Conf. Rad. Curing ASIA, p. 478, Tokyo, October (1988); organic halogen compounds described in U.S. Pat. No. 3,905,815, JP-B No. 46-4605, JP-A Nos. 48-36281, 55-32070, 60-239736, 61-169835, 61-169837, 62-58241, 62-212401, 63-70243 and 63-298339; organic metals/organic halides described in K. Meier et al., J. Rad. Curing, 13 (4), 26 (1986), T. P. Gill et al., Inorg. Chem., 19, 3007 (1980), D. Astruc, Acc. Chem. Res., 19 (12), 377 (1986) and JP-A No. 2-161445; photoacid generators having an o-nitrobenzyl-based protective group described in S. Hayase et al., J. Polymer Sci., 25, 753 (1987), E. Reichmanis et al., J. Polymer Sci., Polymer Chem. Ed., 23, 1 (1985), Q. Q. Zhu et al., J. Photochem., 36, 85, 39, 317 (1987), B. Amit et al., Tetrahedron Lett., (24), 2205 (1973), D. H. R. Barton et al., J. Chem. Soc., 3571 (1965), P. M. Collins et al., J. Chem. Soc., Perkin 1,1695 (1975), M. Rudinstein et al., Tetrahedron Lett., (17), 1445 (1975), J. W. Walker et al., J. Am. Chem. Soc., 110, 7170 (1988), S. C. Busman et al., J. Imaging Technol., 11 (4), 191 (1985), H. M. Houlihan et al., Macromolecules, 21, 2001 (1988), P. M. Collins et al., J. Chem. Soc., Chem. Commun., 532 (1972), S. Hayase et al., Macromolecules, 18, 1799 (1985), E. Reichmanis et al., J. Electrochem. Soc., Solid State Sci. Technol., 130 (6), F. M. Houlihan et al., Macromolecules, 21, 2001 (1988), European Patent Nos. 0,290,750, 046, 083, 156, 535, 271,851 and 0,388,343, U.S. Pat. Nos. 3,901,710 and 4,181,531 and JP-ANos. 60-198538 and 53-133022;

compounds that photochemically decompose to generate a sulfonic acid, represented by iminosulfonate, described in M. TUNOOKA et al., Polymer Preprints Japan, 35 (8), G Berner et al., J. Rad. Curing, 13 (4), W. J. Mijs et al., Coating Technol., 55 (697), 45 (1983), Akzo, H. Adachi et al., Polymer Preprints, Japan, 37 (3), European Patent Nos. 0,199,672, 84515, 199, 672, 044, 115, 618,564 and 0101,122, U.S. Pat. Nos. 4,618,564, 4,371,605 and 4,431,774 and JP-A Nos. 64-18143, 2-245756 and 4-365048; and disulfone compounds described in JP-A No. 61-166544.

In addition to the above, compounds represented by a formula (IV) below can be preferably used.

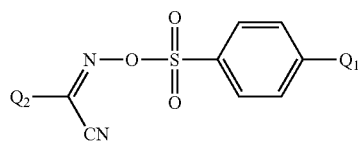

Formula (IV)

Among formula (IV), $Q_1$ represents a hydrogen atom or an alkyl group having 1 to 3 carbon atoms, $Q_2$ represents a phenyl group, a phenyl group substituted by an alkyl group having 1 to 3 carbon atoms or a phenyl group substituted by an alkoxy group having 1 to 3 carbon atoms.

Examples of the alkyl group having 1 to 3 carbon atoms shown as the $Q_1$ include a methyl group, ethyl group and propyl group. Examples of the phenyl group substituted by an alkyl group having 1 to 3 carbon atoms shown as the $Q_2$ include an o-isopropyl phenyl group, and, examples of the phenyl group substituted by an alkoxy group having 1 to 3 carbon atoms include a p-methoxyphenyl group, p-ethoxyphenyl group and p-propoxyphenyl group.

An addition amount of a compound that decomposes upon irradiation of active light beam or radiation to generate an acid is normally in the range of 0.001 to 40 mass %, preferably in the range of 0.01 to 20 mass % and more preferably in the range of 0.1 to 15 mass % on the basis of a total weight of the dye-containing photosensitive composition (excluding coating solvent).

As the photosensitive compound, from the viewpoint of the sensitivity, the photopolymerization initiator is preferable to a photoacid generator.

<Transition Metal Complex>

The dye-containing photosensitive composition of the invention contains at least one kind of transition metal complex.

In the transition metal complex in the invention, with a transition metal atom or ion at a center, a negative, neutral or positive unidentate or multidentate ligand is coordinated.

Furthermore, the phthalocyanine is not included in the transition metal complexes according to the invention.

Examples of the transition metals in transition metal atoms and ions in the transition metal complexes include scandium (Sc), titanium (Ti), vanadium (V), chromium (Cr), manganese (Mn), iron (Fe), cobalt (Co), nickel (Ni), copper (Cu), yttrium (Y), zirconium (Zr), niobium (Nb), molybdenum (Mo), technetium (Tc), ruthenium (Ru), rhodium (Rh), palladium (Pd), silver (Ag), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), lutetium (Lu), hafnium (Hf), tantalum (Ta), tungsten (W), rhenium (Re), osmium (Os), iridium (Ir), platinum (Pt) and gold (Au).

Preferable examples of the transition metal complexes in the invention includes ones of which transition metal or transition metal in transition metal ion belongs to the fourth row, for example, scandium (Sc), titanium (Ti), vanadium (V), chromium (Cr), manganese (Mn), iron (Fe), cobalt (Co), nickel (Ni) and copper (Cu).

More preferable examples of the transition metal complexes in the invention, ones of which transition metal in transition metal ion belongs to the fourth row and is divalent, for example, $Ti^{2+}$, $V^{2+}$, $Cr^{2+}$, $Mn^{2+}$, $Fe^{2+}$, $Co^{2+}$, $Ni^{2+}$ and $Cu^{2+}$. Particularly preferable examples include $Co^{2+}$, $Ni^{2+}$ and $Cu^{2+}$.

As the ligands in the transition metal complexes, any general ligand, irrespective of monodentate ligands and multidentate ligands, can be preferably used. Specific examples of the ligands include fluoro, chloro, bromo, iodo, hydrido, hydroxo, aquo, oxo, peroxo, carbonyl, carbonato, oxalato, acetato, ethanorato, acetylacetonato, thiocyanate, isothiocyanato, cyano, ammine, pyridine, ethylenediamine, 2,2'-bipyrizine, 1,10-phenanthroline, ethylenediamine tetraacetato, 1,4,8,11-tetraazacyclotetradecane, tris(2-aminoethyl)amine, sulfato, nitro, nitrito and phosphato.

Preferable examples of the ligands include carbonyl, carbonato, oxalato, acetato and derivatives thereof. As particularly preferred examples, acetato and derivatives thereof can be cited. As most preferred examples, acetato substituted by fluorine and acetato substituted by an alkyly group.

A molecular weight of one ligand is, from the viewpoint of the light resistance, preferably 20 or more and less than 300, and more preferably 25 or more and less than 250.

The transition metal complex of the invention has the molar absorption coefficient of less than 5000 in the visible light region (380 to 780 nm). This is because, when a transition metal complex large in the absorption coefficient is added, unnecessary coloration is caused to unfavorably lower the color purity in an image portion. The molar absorption coefficient ϵ is preferably zero or more and less than 4000 and more preferably zero or more and less than 3000. From the point of view of the color purity, the molar absorption coefficient ϵ is more preferably zero or more and less than 2500 and particularly preferably zero or more and less than 500.

An addition amount of the transition metal complex of the invention is, relative to the total dye components, preferably less than 50 mass %, more preferably less than 40 mass % and still more preferably less than 30 mass %. This is because, with an increase in an addition amount of the additive, the residual film ratio after the development of an image portion decreases.

Specific examples of the transition metal complexes in the invention will be cited below. However, the transition metal complexes of the invention are not restricted thereto.

Examples thereof include α-methylferrocene methanol, titanium(III) chloride tetrahydrofuran complex, titanium(IV) chloride tetrahydrofuran complex, zirconium(IV) chloride tetrahydrofuran complex, hafnium chloride tetrahydrofuran complex, vanadium(III) chloride tetrahydrofuran complex, 1-butanethiol copper(I) salt, tetra(dimethylamino)titanium, tetra(diethylamino)titanium, thiophenol copper(I) salt, μ-dichlorotetraethylene dirhodium, potassium trichloro(ethylene)platinate(II) monohydrate, allylpalladium chloride dimer, chloro(1,5-hexadiene)rhodium(I) dimer, chlorobis (cyclooctene)rhodium(I) dimer, chlorobis(cyclooctene)iridium(I) dimer, (1,5-cyclooctadiene)dimethylplatinum(II), dichloro(1,5-cyclooctadiene)ruthenium(II) polymer, dichloro(1,5-cyclooctadiene)palladium(II), dichloro(1,5-cyclooctadiene)platinum(II), dibromo(1,5-cyclooctadiene) platinum(II), (1,5-cyclooctadiene)diiodoplatinum(II), bis(1, 5-cyclooctadiene)rhodium(I) tetrafluoroboron, bis(1,5-cyclooctadiene)nickel(0), chloro(1,5-cyclooctadiene) rhodium(I) dimer, chloro(1,5-cyclooctadiene)iridium(I) dimer, (bicyclo[2.2.1]hepta-2,5-diene)dichlororuthenium(II) polymer, bis(bicyclo[2.2.1]hepta-2,5-diene)rhodium(I) perchlorate, (bicyclo[2.2.1]hepta-2,5-diene)chlororhodium(I) dimer, (bicyclo[2.2.1]hepta-2,5-diene)dichloropalladium (II), titanium(III) chloride ethyleneglycol dimethylether complex, niobium(III) chloride ethyleneglycol dimethylether complex, niobium(III) bromide ethyleneglycol dimethylether complex, nickel(II) bromide ethyleneglycol dimethylether complex, niobium(IV) chloride tetrahydrofuran complex, chromium(III) chloride tetrahydrofuran complex, copper(I) bromide dimethylsulfide complex, cis-bis(diethylsufide)platinum(II) chloride, (dimethylsulfide)gold(I) chloride, tris(ethylenediamine)cobalt(III) chloride dihydrate, tris (ethylenediamine)rhodium(III) chloride trihydrate, dichloro (ethylenediamine)palladium(II), dichloro(ethylenediamine) platinum(II), dichlorobis(ethylenediamine)palladium(II), dichloro(N,N,N',N'-tetramethylethylenediamine)palladium (II), bis(cis-1,2-diaminocyclohexane)nickel(II) chloride, (1,2-diaminocyclohexane)platinum(II) chloride, titanium(IV)(triethanolaminate)isopropoxide, bis (tetraethylammonium)tetrabromocopper(II), bis(tetraethylammonium)tetrabromomanganese(II), bis (tetraethylammonium)tetrabromocobalt(II), tetraphenylphosphonium acetate dichlorodioxoruthenium(IV), copper(II) acetylacetonate, lanthanum acetylacetonate hydrate, cerium(III) acetylacetonate hydrate, europium(III) acetylacetonate hydrate, gadolinium(III) acetylacetonate hydrate, yttrium acetylacetonate hydrate, titanium(IV) oxide acetylacetonate, zirconium (IV) acetylacetonate, vanadium (III) acetylacetonate, vanadyl acetylacetonate, chromium (III) acetylacetonate, bis(acetylacetonate) molybdenum (IV) dioxide, manganese(II) acetylacetonate, manganese(III) acetylacetonate, iron(III) acetylacetonate, cobalt(II) acetylacetonate, cobalt(III) acetylacetonate, nickel(II) acetylacetonate, ruthenium(III) acetylacetonate, rhodium(III) acetylacetonate, palladium(II) acetylacetonate, iridium(III) acetylacetonate, platinum(II) acetylacetonate, (1,5-cyclooctadiene)(2,4-pentanedionato)rhodium(I), (bicyclo[2.2.1]hepta-2,5-diene)(2,4-pentanedionato)rhodium (I), titanium diisopropoxidebis(2,4-pentanedionato), copper bis(2,2,6,6-tetramethyl-3,5-heptanedionato), yttrium tris(2, 2,6,6-tetramethyl-3,5-heptanedionato), neodymium tris(2,2, 6,6-tetramethyl-3,5-heptanedionato), erbium tris(2,2,6,6-tetramethyl-3,5-heptanedionato), samarium tris(2,2,6,6-tetramethyl-3,5-heptanedionato), thulium tris(2,2,6,6-tetramethyl-3,5-heptanedionato), nickel(II) bis(2,2,6,6-tetramethyl-3,5-heptanedionato), lanthanum tris(2,2,6,6-tetramethyl-3,5-heptanedionato), praseodymium tris(2,2,6, 6-tetramethyl-3,5-heptanedionato), europium tris(2,2,6,6-tetramethyl-3,5-heptanedionato), gadolinium tris(2, 2,6,6-tetramethyl-3,5-heptanedionato), dysprosium tris(2,2,6,6-tetramethyl-3,5-heptanedionato), holmium tris(2,2,6,6-tetramethyl-3,5-heptanedionato), ytterbium tris(2,2,6,6-tetramethyl-3,5-heptanedionato), thallium(I) trifluoroacetylacetonate, copper(II) trifluoroacetylacetonate, zirconium(IV) trifluoroacetylacetonate, thallium(I) hexafluoroacetylacetonate, copper(II) hexafluoroacetylacetonate hydrate, yttrium hexafluoroacetylacetonate dihydrate, manganese(II) hexafluoroacetylacetonate trihydrate, cobalt(II) hexafluoroacetylacetonate hydrate, nickel (II) hexafluoroacetylacetonate hydrate, palladium(II) hexafluoroacetylacetonate, (acetylacetonate)(1,5-cyclooctadiene)iridium(I), praseodymium tris[3-(trifluoro-methylhydroxymethylene)-(+)-camphorate], europium tris[3-(trifluoro-methylhydroxymethylene)-(+)-camphorate], erbium tris[3-(trifluoro-methylhydroxymethylene)-(+)-camphorate], ytterbium tris [3-(trifluoro-methylhydroxymethylene)-(+)-camphorate], bis[3-(heptafluoropropylhydroxymethylene)-(+)-camphorate]oxovanadium, praseodymium tris[3-(heptafluoropropylhydroxymethylene)-(+)-camphorate], preseodymium tris[3-(heptafluoropropylhydroxymethylene)-(−)-camphorate], europium tris[3-(heptafluoropropylhydroxymethylene)-(+)-camphorate], europium tris[3-(heptafluoropropylhydroxymethylene)-(−)-camphorate], erbium tris[3-(heptafluoropropylhydroxymethylene)-(+)-camphorate], erbium tris[3-(heptafluoropropylhydroxymethylene)-(−)-camphorate], ytterbium tris[3-(heptafluoropropylhydroxymethylene)-(+)-camphorate], ytterbium tris[3-(heptafluoropropylhydroxymethylene)-(−)-camphorate], diamine(1,1-cyclobutanedicarboxylate)platinum(II), titanium(IV) bis(ammoniumlactate)dihydroxide, titanium(IV) bis(ethylacetoacetate)diiopropoxide, [1,2,3,4-tetrakis(methoxycarbonyl)-1,3-butadiene-1,4-diyl]platinum, bis(acetonitrile)dichloro palladium(II), bis(acetonitrile)chloronitro palladium(II), bis(acetonitrile)molybdenum(IV) chloride, tetrakis(acetonitrile)palladium(II) tetrafluoroborate, cis-bis (acetonitrile)dichloro platinum(II), tetrekis(acetonitrile)copper(I) hexafluorophosphate, tetraethylammonium bis(acetonitrile)tetrachloro ruthenium(III), bis (diethyldithiocarbamate)dioxo molybdenum(VI), dichlorobis(triethylphosphine)palladium(II), cis-dichlorobis (triethylphosphine)platinum(II), trans-dichlorobis(triethylphosphine)platinum(II), dichlorobis(tributylphosphine) nickel(II), dibromobis(tributylphosphine)nickel(II), oxalate bis(triethylphosphine)platinum(II) hydrate, dichlorobis(tricyclohexylphosphine)palladium(II), iodo(trimethylphosphite)copper(I), iodo(triethylphosphite)copper(I), chloro(pyridine)bis(deimehtylglyoximate)cobalt(III), benzene ruthenium(II) chloride dimer, dichloro(p-cimene) ruthenium(II) dimer, (+)-di-µ-chlorobis{2-[1-(dimethylamino)ethyl]phenyl-C,N-dipalladium, di-µ-chlorobis{2-[(1-(diethylamino))ethyl]phenyl-C,N-dipalladium, di-β-chlorobis{2-(dimethylamino)}methyl}phenyl-C,N-dipalladium, bis(salicylaldehyde)cobalt(II) dihydrate, tris (dibenzylideneacetone)dipalladium(0), tris (dibenzoylmethanate)iron(III), bis(benzonitrile)dichloro palladium(II), cis-bis(benzonitrile)dichloro platinum(II), trichlorotris(dimethylphenylphosphine)rhenium(III), [tris (dimethylphenylphosphine)] (2,5-norbornadiene)rhodium(I) hexafluorophosphate, tetrakis(methyldiphenylphosphine)palladium(0), (1,5-cyclooctadiene)bis(methyldiphenylphosphine)iridium(I) hexafluorophosphate, tris(triphenylphosphine)copper(I) chloride, bis(triphenylphosphine)copper(I)nitrate, chloro (triphenylphosphine)gold(I), trichlorooxobis(triphenylphosphine)rhenium(V), iododioxobis(triphenylphosphine)rhenium(V), dichlorobis(triphenylphosphine)cobalt(II), chlorotris(triphenylphosphine)cobalt(I), tetrakis(triphenylphosphine)nickel(0), dichlorobis(triphenylphosphine) nickel(II), dibromobis(triphenylphosphine)nickel(II), dichlorotris(triphenylphosphine)ruthenium(II), dichlorotetrakis(triphenylphosphine)ruthenium(II), trans-dibromobis (triphenylphosphine)palladium(II), chlorotris(triphenylphosphine)rhodium(I), bromotris(triphenylphosphine) rhodium(I), nitrosyltris(triphenylphosphine)rhodium(I), dichlorobis(triphenylphosphine)palladium(II), tetrakis(triphenylphosphine)palladium(0), tetrakis(triphenylphosphine)platinum(0), cis-dichlorobis(triphenylphosphine)platinum(II), trans-dichlorobis(triphenylphosphine) platinum(II), dioxobis(triphenylphosphine)platinum(IV), ethylenebis(triphenylphosphine)platinum(0), (bicyclo[2.2.1] hepta-2,5-diene)[bis(triphenylphosphine)]rhodium(I) hexafluorophosphate, bis(acetate)bis(triphenylphosphine) palladiums(II), trans-benzyl(chloro)bis(triphenylphosphine) palladium(II), dichlorobis[methylenebis(diphenylphosphine)]dipalladium,

[1,2-bis(triphenylphosphino)ethane]iron(II) chloride, [1,2-bis(diphenylphosphino)ethane]cobalt(II) chloride, [1,2-bis(diphenylphosphino)ethane]nickel(II) chloride, [1,2-bis (diphenylphosphino)ethane]palladium(II) chloride, bis[1,2-bis(diphenylphosphino)ethane]palladium(0), [1,1,1-tris (diphenylphosphinomethyl)ethane]rhodium(I) chloride, (N-3-allyl)[(2S,3S)-(+)-bis (diphenylphosphino)butane]palladium(II) perchlorate, (bicyclo[2.2.1]hepta-2,5-diene) [(2S, 3S)-(+)-bis(diphenylphosphino)butane]rhodium(I) perchlorate, [1,3-bis(diphenylphosphino)propane]dichloro nickel (II), [(R)-(+)-2,2'-bis(diphenylphosphino) 1,1'-binaphthyl] chloro(p-cumene)ruthenium chloride, [(S)-(−)-2,2'-bis (diphenylphosphino) 1,1'-binaphthyl]chloro(p-cumene) ruthenium chloride, bis[(R)-(−)-2,2'-bis(diphenylphosphino) 1,1-binaphtyl]rhodium (I) perchlorate, [(R)-(+)-2,2'-bis (diphenylphosphino) 1,1'-binaphthyl] (1,5-cyclooctadiene) rhodium(I) perchlorate, [(S)-(−)-2,2'-bis(diphenylphosphino)1,1'-binaphthyl](1,5-cyclooctadiene)rhodium(I) perchlorate, [(R)-(+)-2,2'-bis(diphenylphosphino) 1,1'-binaphthyl]palladium(II) chloride, tetrakis(triphenylphosphite)nickel(0), tris[N-(diohenylphosphinyl)-p,p-diphenylphosphinic amidate-O,O']praseodymium, bis(1,5-cyclooctadiene)bis(1H-pyrazolate)diiridium, tetrakis(pyridine)cobalt(II) bis(chromate), cis-dichlorobis(pyridine)platinum(II), (1,5-cyclooctadiene)(pyridine)(tricyclohexylphosphine)iridium(I) hexafluorophosphate, trichlorobis(2-phenylpyridine)rhodium(III) dimer, tris(2,2'-bipyridine)iron(II) hexafluorophosphate, cis-bis(2,2'-bipyridine)dichloro ruthenium(II) hydrate, tris(2,2'-bipyridyl)ruthenium(II) chloride hexahydrate, (2,2'-bipyridine)dichloro palladium(II), (2,2'-bipyridine)dichloro platinum(II), dichloro(2,2':6',2'''-terpyridine)platinum(II) dihydrate, dichloro(1,10-phenanthroline)copper(II), dibromo(1,10-phenanthroline)copper(II), dinitrate(1,10-phenanthroline) copper(II), tris(1,10-phenanthroline)iron(II) hexafluorophosphate, tris(1,10-phenanthroline)iron(III) hexafluorophosphate, tris(1,10-phenanthroline)ruthenium(II) chloride hydrate, dichloro(1,10-phenanthroline)palladium(II), dichloro(1,10-phenanthroline)platinum(II), N,N'-bis(salicylidene)ethylenediamine cobalt(II), N,N'-bis(salicylidene)ethylenediamino nickel(II), (R,R)-(−)-N,N'-bis(3,5-di-t-butylsalicylidene)-1,2-cyclohexanediamino manganese(III) chloride, (S,S)-(+)-N,N'-bis(3,5-di-t-butylsalicylidene)-1,2-cyclohexanediamino manganese (III) chloride, N,N'-bis(salicylidene)dianilino cobalt(II), N,N'-bis(salicylidene)-1,2-phenylenediamino cobalt(II) monohydrate, tris (cyclopentadienyl)scandium, bis(cyclopentadienyl) vanadium, bis(cyclopentadienyl)chromium, ferrocene, ferrocenium hexafluorophosphate, ferrocenium hexafluoroborate, bis(cyclopentadienyl)cobalt, bis(cyclopentadienyl)nickel, bis(cyclopentadienyl)ruthenium, cyclopentadienyl titanium trichloride, bis(cyclopentadienyl)titanium dichloride, bis(cyclopentadienyl)titanium pentasulfide, bis(cyclopentadienyl)titanium bis(trifluoromethanesulfonate), bis(cyclopentadienyl)zirconium dichloride, bis (cyclopentadienyl)zirconium bis(trifluoromethane sulfonate), bis(cyclopentadienyl)hafnium dichloride, bis (cyclopentadienyl)vanadium dichloride, bis (cyclopentadienyl)niobium dichloride, bis (cyclopentadienyl)molybdenum dichloride, bis (pentamethylcyclopentadienyl)manganese, 1,1'-dimethylferrocene, bis(pentamethylcyclopentadienyl)iron, 1,2-deferrocene ethane, butylferrocene, vinylferrocene, bis(2,4-cyclopentadiene-1-yl)[(4-methylbicyclo[2.2.1]heptane-2,3-diyl)methylene]titanium, ferrocene methanol, 1,1'-ferrocenedimethanol, (dimethylaminomethyl)ferrocene, (R)-(+)-N,N-dimethy-1-ferrocenylethylamine, (S)-(−)-N,N-dimethyl-1-ferrocenylethylamine, ferrocene carboxyaldehyde, acetylferrocene, 1,1'-diacetylferrocene, ferrocene carboxylic acid, 1,1'-ferrocene dicarboxylic acid, dimethyl-1,1'-ferrocene dicarboxylate, 1,1''-[(4,4'-bipyperidine)-1,1'-diyldicarbonyl]bis[1'-(methoxycarbonyl)ferrocene], ferrocene acetonitrile, benzoylferrocene, 1,1'-bis(diphenylphosphino)ferrocene, (−)-(R)-1-[(S)-2-(diphenylphosphino)ferrocenyl]ethylmethyl ether, (+)-(S)-1-[(R)-2-(diphenylphosphino)ferrocenyl]ethylmethyl ether, [1,1'-bis(dipbenylphosphino)ferrocene]dichloropalladium(II), (−)-(R)—N,N-dimethyl-1-[(S)-2-(diphenylphosphino)ferrocenyl]ethylamine, (+)-(S)—N,N-dimethyl-1-[[(S)-2-(diphenylphosphino) ferrocenyl]ethylamine, dichloro[(R)—N,N-dimethyl-1-[(S)-2-(dipenylphosphino)ferrocenyl]ethylamine]palladium, dichloro[(S)—N,N-dimehtyl-1-[(R)-2-(diphenylphosphino)ferrocenyl]ethylamine]palladium, (−)-(R)—N,N-dimethyl-1-[[(S)-1',2-bis(diphenylphosphino)ferrocenyl]ethylamine, (+)-(S)—N,N-dimethyl-1-[(R)-1',2-bis(diphenylphosphino) ferrocenyl]ethylamine, trans-4-[2-(1-ferrocenyl)-vinyl]-1-methylpyridinium iodide, chlorocyclopentadienylbis(triphenylphosphine)ruthenium(II), (bicyclo[2.2.1]hepta-2,5-diene)[1,1'-bis(diphenilphosphino)ferrocene]ruthenium(I) perchlorate, bis(pentamethylcyclopentadienyl)zirconium dichloride, pentamethylcyclopentadienyl ruthenium(III) chloride polymer, pentamethylcyclopentadienyl rhodium chloride dimer, pentamethylcyclopentadienyl iridium(III) chloride dimer, cyclohexadienyl iron(0) tricarbonyltetrafluoroborate, cycloheptatriene chromium tricarbonyl, cycloheptatriene molybdenum tricarbonyl, cyclooctatetraene iron tricarbonyl, bicyclo[2.2.1]hepta-2,5-diene molybdenum tetracerbonyl, tricarbonyl(4-methoxy-1-methylcyclohexadine)iron tetrafluoroborate, tricarbonyl(2-methoxycyclohexadiene)iron tetrafluoroborate, tetramethylammonium(1-hydroxyethylidene)pentacarbonyl chromium, cis-tetracerbonylbis(pyperidine)molybdenum, (acetylacetonate)dicarbonyl rhodium (I), (acetylacetonate)dicarbonyl iridium(I), cyclopentadienyl molybdenum tricarbonyl dimer, cyclopentadienyl tungsten tricarbonyl dimer, cyclopentadienyl manganese tricarbonyl, cyclopentadienyl rhenium tricarbonyl, cyclopentadienyl iron dicarbonyl iodide, cyclopentadienyl iron dicarbonyl dimer, cyclopentadienyl cobalt dicarbonyl, cyclopentadienyl nickel carbonyl dimer, methylcyclopentadienyl molybdenum tricarbonyl dimer, (methylcyclopentadienyl)-manganese tricarbonyl, dicarbonylcyclopentadienyl(dimehtylsulfoniumethylide)iron tetrafluoroborate, benzene chromium tricarbonyl, mesitylene chromium tricarbonyl, mesitylene tungsten tricarbonyl, 1,2,3,4-tetrahydronaphthalene chromium tricarbonyl, naphthalene chromium tricarbonyl, anisole chromium tricarbonyl, N-methylaniline chromium tricarbonyl, o-toluidine chromium tricarbonyl, (methylbenzoate)chromium tricarbonyl, di-n-butylthiocarbamate nickel(II), n-butylamino[2,2'-thiobis(4-t-octyl)phenolate]nickel(II), n-butylamino[2,2'-thiobis(4-t-octyl)phenolate]cobalt(II), bis[2,2'-thiobis(4-t-octyl)phenolate]nickel(II), [2,2'-thiobis(4-t-octyl)phenolate) nickel(II) hydrate, [2,2'-thiobis(4-t-octyl)phenolate]nickel (II) ethylamine, bis(butyl-3,5-di-t-butyl-4-hydroxobenzylphosphonate)nickel(II), nickel chloride hexahydrate, cobalt chloride hexahydrate, manganese chloride tetrahydrate, di-n-butyldithiocarbamate cobalt(II), di-n-butyldithiocarbamate copper(II), diisopropyldithiophosphate nickel(II), diethyldithiophosphate palladium, diethyldithiophosphate platinum, tetrakispyridine iron(II) chloride, tetrakispyridine iron(II) bromide, tetrakisisoquinoline iron(II) chloride, tetrakisisoquinoline iron(II) bromide, tetrakisisoquinoline iron(II) iodide, tetrakispyridine iron(II) isocyanate, tetrakis β-picoline iron(II) bromide, and tetrakis γ-picoline iron(II) bromide.

Among these, particularly preferable ones have a fourth row transition metal. Specific examples include α-methylferrocene methanol, titanium(III) chloride tetrahydrofuran complex, titanium(IV) chloride tetrahydrofuran complex, vanadium(III) chloride tetrahydrofuran complex, 1-butanethiol copper(I) salt, tetra(dimethylamino)titanium, tetra(diethylamino)titanium, thiophenol copper(I) salt, bis(1,5-cyclooctadiene)nickel(0), titanium(III) chloride ethyleneglycol dimethylether complex, nickel(II) bromide ethyleneglycol dimethylether complex, chromium(III) chloride tetrahydrofuran complex, copper(I) bromide dimethylsulfide complex, tris(ethylenediamine)cobalt(III) choride dihydrate, bis(cis-1,2-diaminocyclohexane)nickel(II) chloride, titanium(IV) (triethanolaminato)isopropoxide, bis(tetraethylammonium)tetrabromo copper(II), bis(tetraethylammonium)tetrabromo manganese(II), bis(tetraethylammonium)tetrabromo cobalt (II), copper(II) acetylacetonate, titanium(IV) oxide acetylacetonate, vanadium (III) acetylacetonate, vanadylacetylacetonate, chromium(III) acetylacetonate, manganese(II) acetylacetonate, manganese(III) acetylacetonate, iron(III) acetylacetonate, cobalt(II) acetylacetonate, cobalt(III) acetylacetonate, nickel(II) acetylacetonate, titanium diisopropoxidebis(2,4-pentanedionato), copper bis(2,2,6,6-tetramethyl-3,5-heptanedionato), nickel(II) bis(2,2,6,6-tetramethyl-3,5-heptanedionato), copper(II) trifluoroacetylacetonate, copper(II) hexafluoroacetylacetonate hydride, manganese(II) hexafluoroacetylacetonate trihydrate, cobalt(II) hexafluoroacetylacetonate hydrate, nickel (II) hexafluoroacetylacetonate hydrate, bis[3-(heptafluoropropylhydroxymethylene)-(+)-camphorate]oxovanadium, titanium(IV) bis(ammoniumlactate) dihydroxide, titanium(IV) bis(ethylacetoacetate)diisopropoxide, tetrakis(acetonitrile)copper(I) hexafluorophosphate, dichlorobis(tributylphosphine)nickel(II), dibromobis(tributylphosphine)nickel(II), iodo(trimethylphosphite)copper(I), iodo(triethylphosphite)copper(I), chloro(pyridine)bis(dimethylglyoxime)cobalt(III), bis(salicylaldehyde)cobalt(II) dihydrate, tris(dibenzoylmethanate)iron(III), tris(triphenylphosphine)copper(I) chloride, bis(triphenylphosphine) copper(I) nitrate, dichlorobis(triphenylphosphine)cobalt(II), chlorotris(triphenylphosphine)cobalt(I), tetrakis(triphenylphosphine)nickel(0), dichlorobis(triphenylphosphine) nickel(II), dibromobis(triphenylphosphine)nickel(II), [1,2-bis(triphenylphosphino)ethane]iron(II) chloride, [1,2-bis (diphenylphosphino)ethane]cobalt(II) chloride, [1,2-bis (diphenylphosphino)ethane]nickel(II) chloride, tetrakis (pyridine)cobalt(II) bis(chromate), tris(2,2'-bipyridine)iron (II) hexafluorophosphate, dichloro(1,10-phenanthroline)copper(II), dibromo(1,10-phenanthroline)copper(II), dinitrate (1,10-phenanthroline) copper(II), tris(1,10-phenanthroline)iron(II) hexafluorophosphate, tris(1,10-phenanthroline)iron(III) hexafluorophosphate, N,N'-bis(salicylidene)ethylenediamino cobalt(II), N,N'-bis(salicylidene)ethylenediamine nickel(II), bis(salicylideneiminate-3-propyl)methylamino cobalt(II), (R,R)-(−)-N,N'-bis(3,5-di-t-butylsalicylidene)-1,2-cyclohexanediamino manganese(III) chloride, (S,S)-(+)-N,N'-bis(3,5-di-t-butylsalicylidene)-1,2-cyclohexanediamino manganese(III) chloride, N,N'-bis(salicylidene) dianilino cobalt(II), N,N'-bis(salicylidene)-1,2-phenylenediamino cobalt(III) monohydrate, tris (cyclopentadienyl)scandium, bis(cyclopentadienyl) vanadium, bis(cyclopentadienyl)chromium, ferrocene, ferrocenium hexafluorophosphate, ferrocenium hexafluoroborate, bis(cyclopentadienyl)cobalt, bis(cyclopentadienyl)nickel, cyclopentadienyl titanium trichloride, bis (cyclopentadienyl)titanium dichloride, bis(cyclopentadienyl)titanium pentasulfide, bis(cyclopentadienyl)titanium bis(trifluoromethanesulfonate), bis(cyclopentadienyl)vanadium dichloride, bis(pentamethylcyclopentadienyl)manganese, 1,1'-dimethylferrocene, bis(pentamethylcyclopentadienyl)iron, 1,2-diferrocene ethane, butylferrocene, vinylferrocene, bis(2,4-cyclopentadiene-1-yl) [(4-methylbicyclo[2.2.1]heptane-2,3-diyl)methylene]titanium, ferrocene methanol, 1,1'-ferrocene dimethanol, (dimethylaminomethyl)ferrocene, (R)-(+)-N,N-dimethyl-1-ferrocenyl ethylamine, (S)-(−)-N,N-dimethyl-1-ferrocenyl ethylamine, ferrocene carboxyaldehyde, acetylferrocene, 1,1'-diacetylferrocene, ferrocene carboxylic acid, acetylferrocene, 1,1'-ferrocene dicarboxylic acid, dimethyl-1,1'-ferrocene dicarboxylate, 1,1''-[(4,4'-bipyperidine)-1,1'-diyldicarbonyl]bis[1'-(methoxyxarbonyl)ferrocene], ferrocene acetonitrile, benzoylferrocene, 1,1'-bis (diphenylphosphino)ferrocene, (−)-(R)-1-[(S)-2-(diphenylphosphino)ferrocenyl]ethyl methyl ether, (+)-(S)-1-[(R)-2-(diphenylphosphino)ferrocenyl]ethyl methyl ether, (−)-(R)—N,N-dimethyl-1-[(S)-2-(diphenylphosphino)ferrocenyl]ethylamine, (+)-(S)—N,N-dimethyl-1-[[(S)-2-(diphenylphosphino)ferrocenyl]ethylamine, (−)-(R)—N,N-dimethyl-1-[(S)-1',2-bis(diphenylphosphino)ferrocenyl] ethylamine. (+)-(S)—N,N-dimethyl-1-[(R)-1',2-bis (diphenylphosphino)ferrocenyl]ethylamine, trans-4-[2-(1-ferrocenyl)-vinyl]-1-methylpyridinium iodide, cyclohexadienyl iron(0) tricarbonyltetrafluoroborate, cycloheptatriene chromium tricarbonyl, cyclooctatetraene iron tricarbonyl, tricarbonyl(4-methoxy-1-methylhexadiene) iron tetrafluoroborate, tricarbonyl(2-methoxycyclohexadiene)iron tetrafluoroborate, tetramethylammonium(1-hydroxyethylidene)pentacarbonyl chromium, cyclopentadienyl manganese tricarbonyl, cycropentadienyl iron dicarbonyl iodide, cyclopendadienyl iron dicarbonyl dimer, cyclopentadienyl cobalt dicarbonyl, cyclopentadienyl nickel carbonyl dimer, (methylcyclopentadienyl)-manganese tricarbonyl, dicarbonyl cyclopentadienyl(dimethylsulfoniumethylide) iron tetrafluoroborate, benzene chromium tricarbonyl, mesitylene chromium tricarbonyl, 1,2,3,4-tetrahydronaphthalene chromium tricarbonyl, naphthalene chromium tricarbonyl, anisole chromium tricarbonyl, N-methylaniline chromium tricarbonyl, o-toluidine chromium tricarbonyl, (methylbenzoate)chromium tricarbonyl, di-n-butyldithiocarbamate nickel(II), n-butylamino[2,2'-thiobis(4-t-octyl)phenolate] nickel(II), n-butylamino[2,2'-thiobis(4-t-octyl)phenolate]cobalt(II), bis[2,2'-thiobis(4-t-octyl)phenolate]nickel(II), [2,2'-thiobis(4-t-octyl)-phenolate]nickel(II) hydrate, [2,2'-thiobis(4-t-octyl) phenolate]nickel(II) ethylamine, bis(butyl-3,5-di-t-butyl-4-hydroxobenzylphosphate)nickel(II), nickel chloride hexahydrate, cobalt chloride hexahydrate, manganese chloride tetrahydrate, di-n-butyldithiocarbamate cobalt(II), di-n-butyldithiocarbamate copper(II), diiospropyldithiophosphate nickel(II), tetrakispyridine iron(II) chloride, tetrakispyridine iron(II) bromide, tetrakisisoquinoline iron (II) chloride, tetrakisisoquinoline iron(II) bromide, tetrakisisoquinoline iron(II) iodide, tetrakispyridine iron(II) isocyanate, tetrakis-β-picoline iron(II) bromide, and tetrakis-γ-picoline iron(II) bromide.

Still more preferable ones have a transition metal as a divalent metal ion. Specific examples thereof include α-methylferrocene methanol, nickel(II) bromide ethylene glycol dimethylether complex, bis(cis-1,2-diaminocyclohexane) nickel(II) chloride, bis(tetraethylammonium)tetrabromo copper(II), bis(tetraethylammonium)tetrabromo manganese (II), bis(tetraethylammonium)tetrabromo cobalt(II), copper (II) acetylacetonate, manganese(II) acetylacetonate, cobalt (II) acetylacetonate, nickel(II) acetylacetonate, copper bis(2, 2,6,6-tetramethyl-3,5-heptanedionato), nickel(II) bis(2,2,6,6-tetramethyl-3,5-heptanedionato), copper(II) trifluoroacetylactonate, copper(II) hexafluoroacetylactonate hydrate, manganese(II) hexafluoroacetylactonate trihydrate, cobalt(II) hexafluoroacetylactonate hydrate, nickel(II) hexafluoroacetylactonate hydrate, dichlorobis(tributylphosphine)nickel(II), dibromobis(tributylphosphine)nickel(II), bis(salicylaldehyde)cobalt(II) dihydrate, dichlorobis(triphenylphosphine)cobalt(II), dichlorobis(triphenylphosphine) nickel(II), dibromobis(triphenylphosphine)nickel(II), [1,2-bis(triphenylphosphino)ethane]iron(II) chloride, [1,2-bis(triphenylphosphino)ethane] cobalt(II) chloride. [1,2-bis(diphenylphosphino)ethane] nickel(II) chloride, tetrakis(pyridine)cobalt(II) bis(chromate), tris(2,2'-bipyridine)iron (II) hexafluorophosphate, dichloro(1,10-phenanthrolone) copper(II), dibromo(1,10-phenanthrolone)copper(II), dinitrate 1,10-phenanthroline)copper(II), tris(1,10-phenanthroline)iron(II) hexafluorophosphate, N,N'-bis(salicylidene)ethylenediamino cobalt(II), N,N'-bis(salicylidene) ethylenediamino nickel(II), bis(salicylideneiminate-3-propyl)methylamino cobalt(II), N,N'-bis(salicylidene) dianilino cobalt(II) N,N'-bis(salicylidene)-1,2-phenylenediamino cobalt(II) monohydrate, bis(cyclopentadienyl)vanadium, bis(cyclopentadienyl) chromium, ferrocene, bis(cyclopentadienyl)cobalt, bis(cyclopentadienyl)nickel, bis(pentamethylcyclopentadienyl)manganese, 1,1'-dimethylferrocene, bis(pentamethylcyclopentadienyl) iron, 1,2-diferrocene ethane, butylferrocene, vinylferrocene, ferrocene methanol, 1,1-ferrocene dimethanol, (dimethylaminomethyl)ferrocene, (R)-(+)-N,N-dimethyl-1-ferrocenyl ethylamine, (S)-(-)-N,N-dimethyl-1-ferrocenyl ethylamine, ferrocene carboxyaldehyde, acetylferrocene, 1,1'-diacetylferrocene, ferrocene carboxylic acid, acetylferrocene, 1,1'-ferrocene dicarboxylic acid, dimethyl-1,1'-ferrocene dicarboxylate, 1,1"-[(4,4'-bipiperidine)-1,1'-diyl dicarbonyl]bis[1'-(methoxycarbonyl)ferrocene], ferrocene acetonitrile, benzoylferrocene, 1,1'-bis (diphenylphosphino)ferrocene, (-)-(R)-1-[(S)-2-(diphenylphosphino)ferrocenyl]ethylmethyl ether, (+)-(S)-1-[(R)-2-(diphenylphosphino)ferrocenyl]ethylmethyl ether, (-)-(R)—N,N-dimethyl-1-[[(S)-2-(diphenylphosphino)ferrocenyl]ethylamine, (+)-(S)—N,N-dimethyl-1-[(S)-2-(diphenylphosphino)ferrocenyl]ethylamine, (-)-(R)—N,N-dimethyl-1-[(S)-1',2-bis(diphenylphosphino)ferrocenyl] ethylamine, (+)-(S)—N,N-dimethyl-1-[(R)-1',2-bis (diphenylphosphino)ferrocenyl]ethylamine, trans-4-[2-(1-ferrocenyl)-vinyl]-1-methylpyridinium iodide, cycropentadienyl iron carbonyl iodide, cyclopentadienyl iron dicarbonyl dimer, di-n-butyldithiocarbamate nickel(II), n-butylamino[2,2'-thiobis(4-t-octyl)phenolate]nickel(II), n-butylamino[2,2'-thiobis(4-t-octyl)phenolate]cobalt(II), bis [2,2'-thiobis(4-t-octyl)phenolate]nickel(II), [2,2'-thiobis(4-t-octyl)phenolate]nickel(II) hydrate, [2,2'-thiobis(4-t-octyl)phenolate]nickel(II) ethylamine, bis(butyl-3,5-di-t-butyl-4-hydroxobenzylphosphonate)nickel(II), nickel chloride hexahydrate, cobalt chloride hexahydrate, manganese chloride tetrahydrate, di-n-butyldithiocarbamate cobalt(II), di-n-butyldithiocarbamate copper(II), diisopropyl dithiophosphate nickel(II), tetrakispyridine iron(II) chloride, tetrakispyridine iron(II) bromide, tetrakisisoquinoline iron (II) chloride, tetrakisisoquinoline iron (II) bromide, tetrakisisoquinoline iron (II) iodide, tetrakispyridine iron (II) isocyanate, tetrakis β-picoline iron(II) bromide and tetrakis γ-picoline iron(II) bromide.

<Curing Agent>

The dye-containing photosensitive composition of the invention preferably contains at least one kind of radical polymerizable monomer as a curing agent. As the radical polymerizable monomer, a compound that has at least one addition-polymerizable ethylenic unsaturated group and has a boiling point of 100° C. or higher under normal pressure is preferable.

Examples thereof include: monofunctional acrylates and methacrylates such as polyethylene glycol mono(meth)acrylate, polypropylene glycol mono(meth)acrylate and phenoxyethyl(meth)acrylate; polyethylene glycol di(meth)acrylates; trimethylol ethane tri(meth)acrylates; neopentyl glycol di(meth)acrylates; pentaerythritol tri(meth)acrylates; pentaerythritol tetra(meth)acrylates; dipentaerythritol penta(meth)acrylates; dipentaerythritol hexa(meth)acrylates; hexanediol(meth)acrylates;

trimethylol propane tri(acryloyloxypropyl)ether; tri(acryloyloxyethyl)isocyanulate; compounds obtained by adding ethylene oxides or propylene oxides to polyhydric alcohols such as glycerin or trimethylol ethane, followed by (meth) acrylating; urethane acrylates such as those disclosed in JP-B Nos. 48-41708 and 50-6034 and JP-A No. 51-37193; polyester acrylates such as those disclosed in JP-A No. 48-64183 and JP-B Nos. 49-43191 and 52-30490; and multifunctional acrylates or methacrylates, such as epoxyacrylates, which are reaction products of epoxy resins and (meth)acrylic acids, and mixtures thereof. Further, examples thereof include those introduced as photocurable monomers and oligomers in Journal of the Adhesion Society of Japan, Vol. 20, No. 7, pp. 300 to 308.

Further, radical polymerizable monomers containing a carboxyl group such as the following formulas (VI-1) and (VI-2) can be preferably used. In the formulas (VI-1) and (VI-2), when T or G is an oxyalkylene group, the carbon atom end is bound to R, X and W.

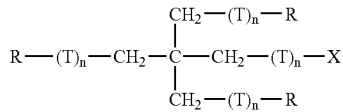

Formula (VI-1)

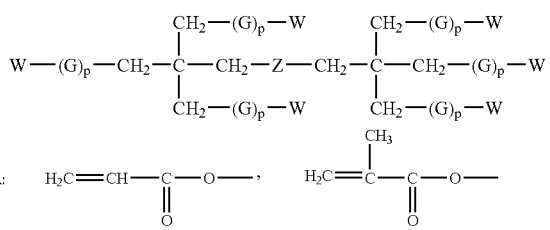

Formula (VI-2)

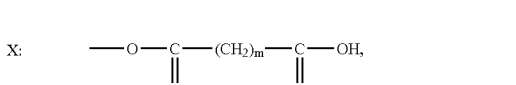

R: 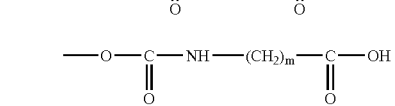

X: 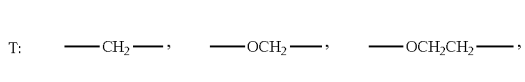

T: 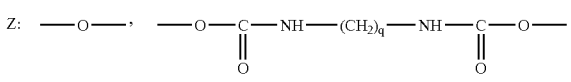

Z: 

G: 

In formula (VI-1), n represents 0 to 14 and m represents 1 to 8. In formula (VI-2), W has the meaning same as R or X in formula (VI-1) and three or more of six W's are R. p represents 0 to 14 and q represents 1 to 8. R, X, T and G that are present plurally in one molecule, respectively, may be the same as or different from each other.

Among the radical polymerizable monomers represented by the formula (VI-1) or formula (VI-2), preferable examples thereof include compounds represented by any one of formulas (M-1) to (M-12), and, among these, compounds represented by any one of formulas (M-2), (M-3) and (M-5) are preferable.

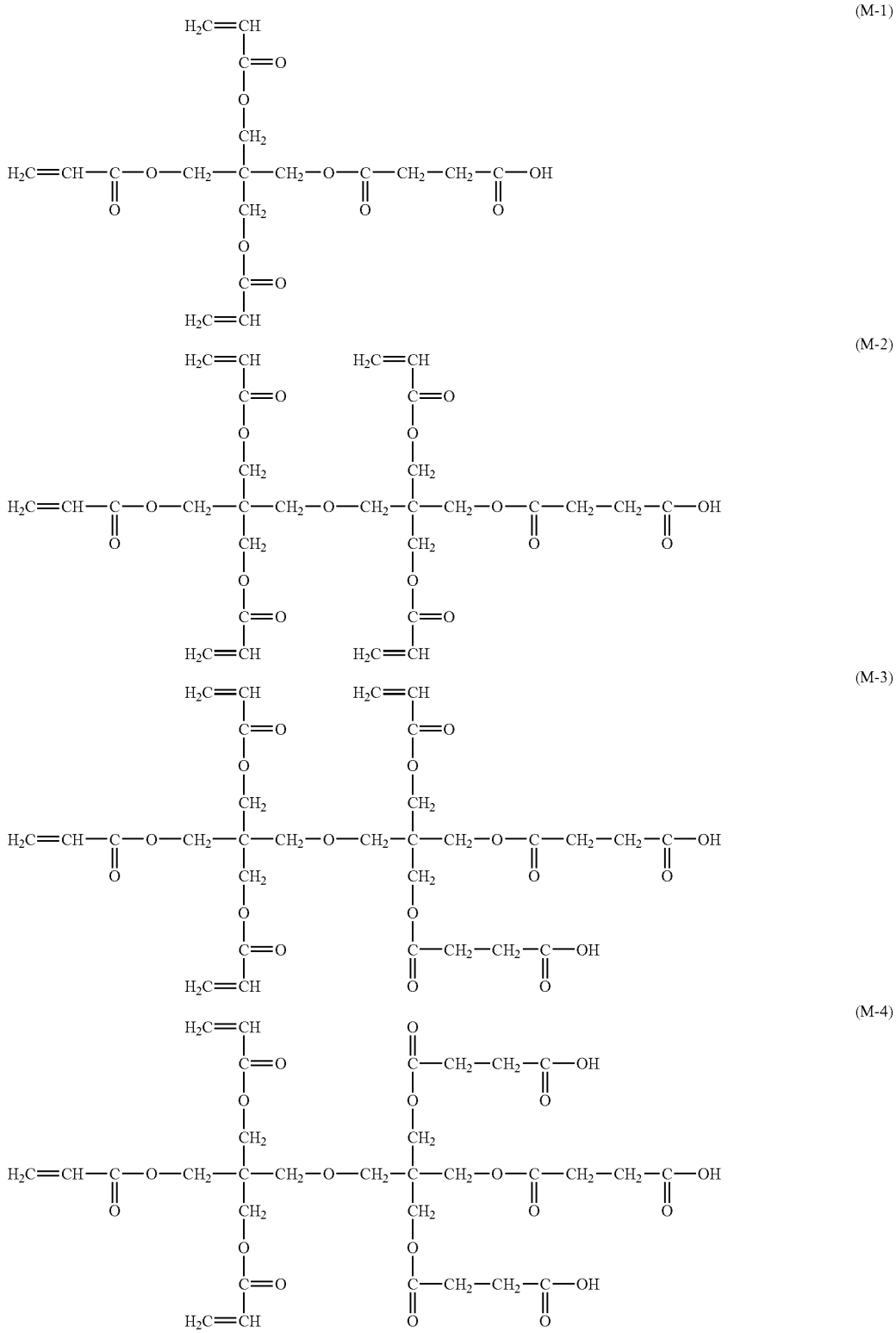

-continued
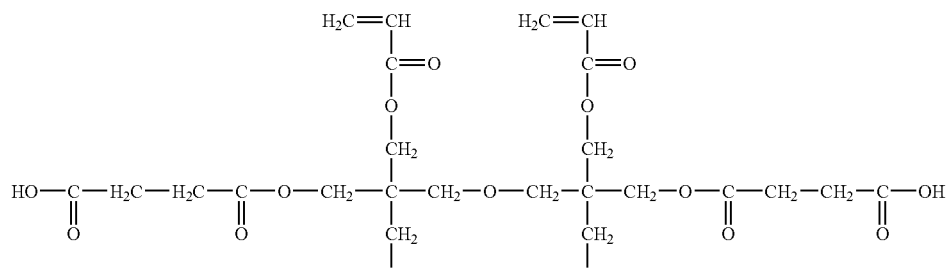
(M-5)
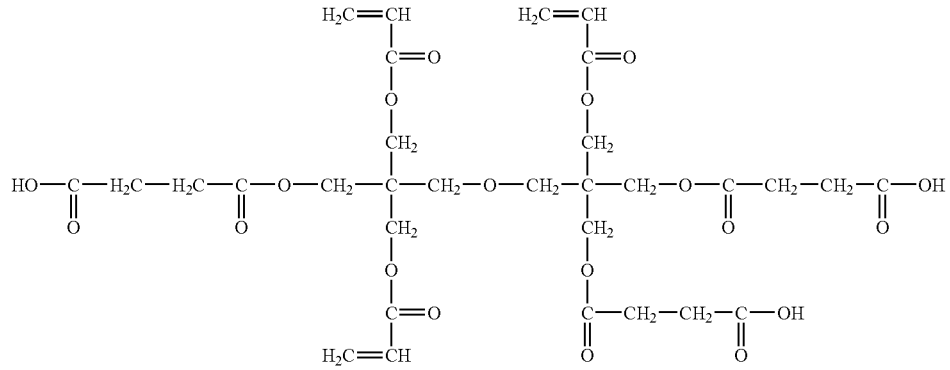
(M-6)
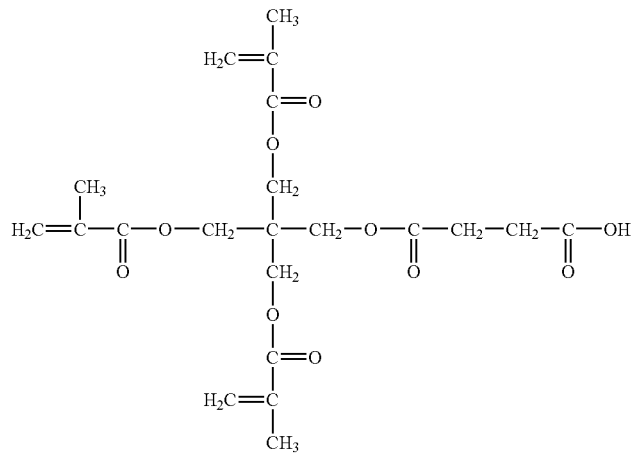
(M-7)
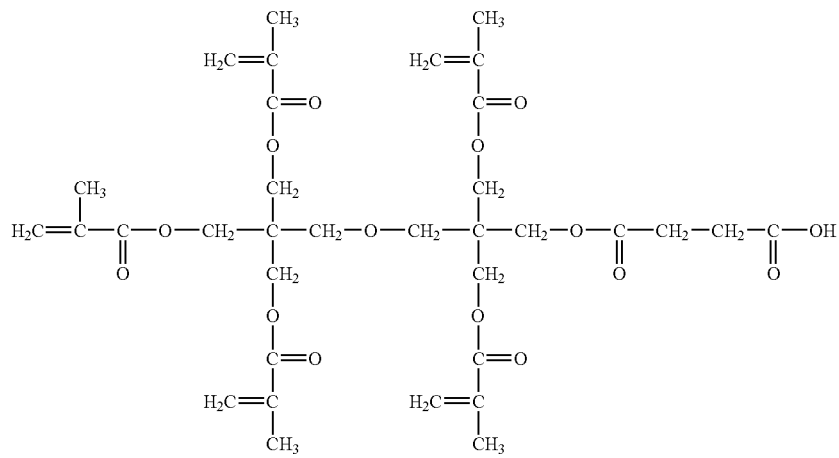
(M-8)

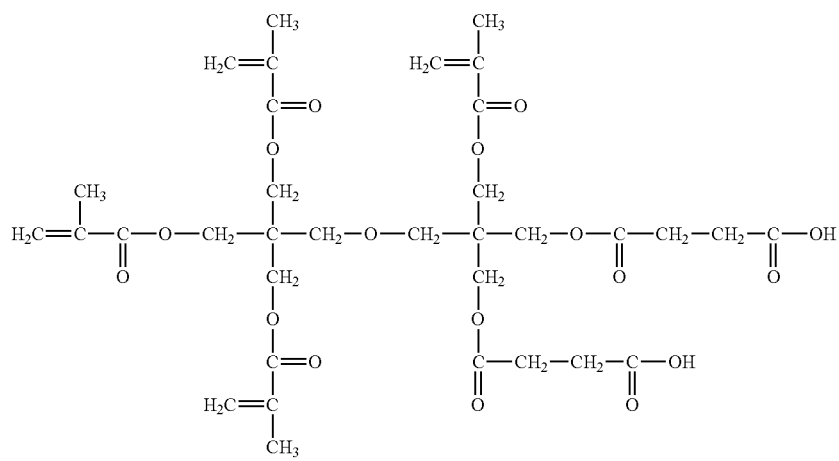
(M-9)
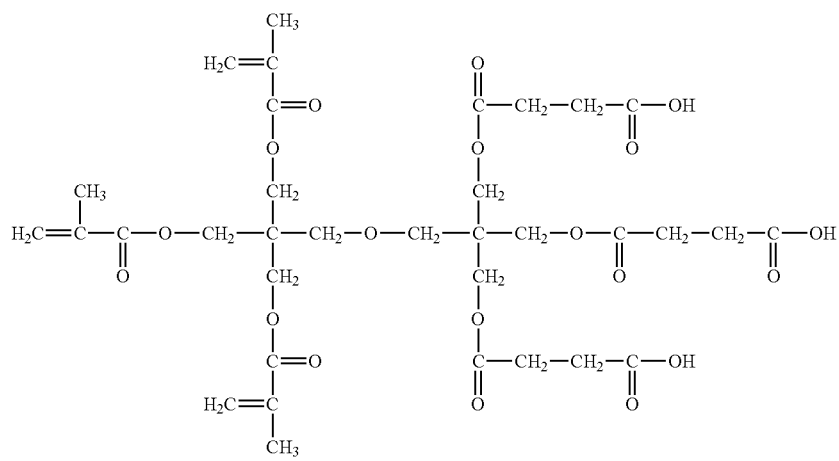
(M-10)
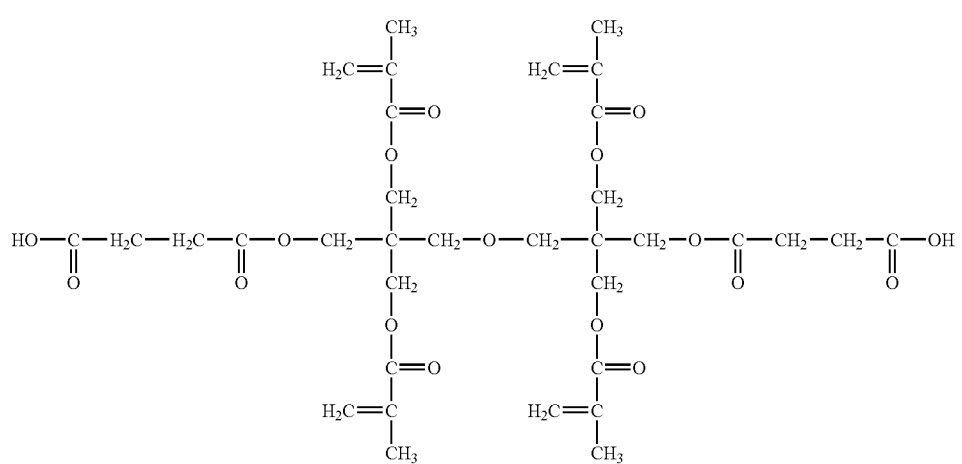
(M-11)

-continued

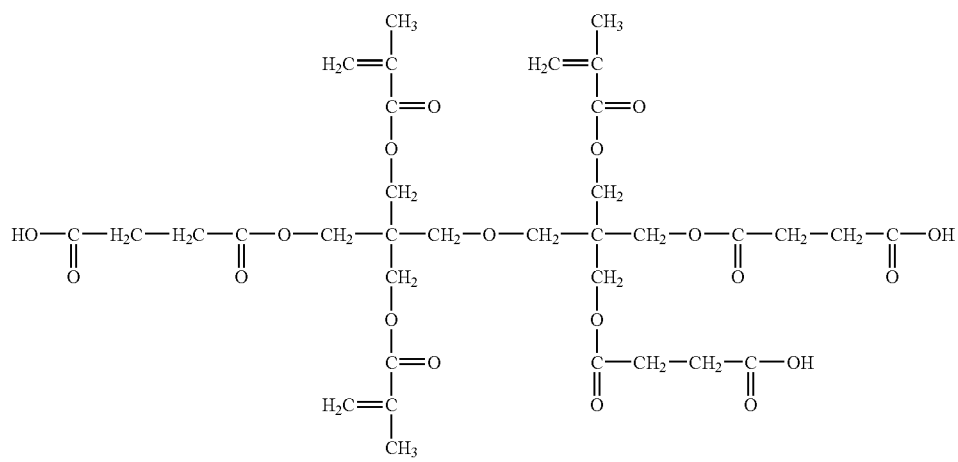

(M-12)

A content of the radical polymerizable monomer in the dye-containing photosensitive composition is, preferably in the range of 20 to 70 mass %, more preferably in the range of 22 to 65 mass % and still more preferably in the range of 25 to 60 mass %, based on the total solid content of the composition. When the content is within the above-mentioned range, sufficient hardness and elution properties of an unexposed portion can be retained, that is, the hardness of the exposed portion neither becomes insufficient nor the elution properties of the unexposed portion become deteriorated remarkably.

When a photoacid generator is contained as the photosensitive compound, as preferred examples of the curing agents, (a) an epoxy resin, (b) a melamine compound, guanamine compound, glycol urethane compound or urea compound that is substituted by at least one substituent selected from a methylol group, an alkoxymethyl group or an acyloxymethyl group and (c) a phenol compound, naphthol compound or hydroxyanthracene compound that is substituted by at least one substituent selected from a methylol group, an alkoxymethyl group or an acyloxymethyl group can be cited, in particular, polyfunctional epoxy resins being preferable.

As the epoxy resin that is component (a), any resin can be used as long as it has an epoxy group and the crosslinking ability. Examples of these compounds include divalent glycidyl group-containing low-molecular weight compounds such as bisphenol-A-diglycidyl ether, ethylene glycol diglycidyl ether, butanediol diglycidyl ether, hexanediol diglycidyl ether, dihydroxybiphenyl diglycidyl ether, phthalic acid diglycidyl ether and N,N-diglycidyl aniline; similarly, trivalent glycidyl group-containing low-molecular weight compounds represented by trimethylolpropane triglycidyl ether, trimethylol phenol triglycidyl ether, tris P-PA triglycidyl ether and the like; similarly, quadrivalent glycidyl group-containing low-molecular weight compounds represented by pentaerythritol tetraglycidyl ether, tetramethylol bisphenol-A tetraglycidyl ether and the like; similarly, multivalent glycidyl group-containing low-molecular weight compounds represented by dipentaerythritol pentaglycidyl ether, dipentaerythritol hexaglycidyl ether and the like; and glycidyl group-containing polymer compounds represented by polyglycidyl(meth)acrylate, 1,2-epoxy-4-(2-oxiranyl)cyclohexane adducts of 2,2-bis(hydroxymethyl)-1-butanol and the like.

In component (b), the number of the methylol groups, alkoxymethyl groups and acyloxymethyl groups substituting the melamine compounds is preferably 2 to 6, and the numbers of the groups above substituting the glycoluryl compounds, guanamine compounds and urea compounds, respectively, are preferably 2 to 4. More preferably, the number of the groups substituting the melamine compounds is 5 to 6, and the numbers of the groups substituting the glycoluryl compounds, guanamine compounds and urea compounds, respectively, are 3 to 4.

The methylol group-containing compound can be prepared by heating the alkoxymethyl group-containing compound in alcohol in the presence of an acid catalyst such as hydrochloric acid, sulfuric acid, nitric acid, or methanesulfonic acid. The acyloxymethyl group-containing compound is prepared when a methylol group-containing compound is mixed and stirred with an acyl chloride in the presence of a basic catalyst.

In the following, specific examples of the compounds having substituens will be listed.

Examples of the melamine compounds include hexamethylolmelamine, hexamethoxymethylmelamine, compounds obtained by methoxymethylating 1 to 5 methylol groups of hexamethylolmelamine, mixtures thereof, hexamethoxyethylmelamine, hexacyloxymethylmelamine, and compounds obtained by acyloxymethylating 1 to 5 methylol groups of hexamethylolmelamine and mixtures thereof.

Examples of the guanamine compound include tetramethylol guanamine, tetramethoxymethyl guanamine, compounds obtained by methoxymethylating 1 to 3 methylol groups of tetramethylol guanamine, mixtures thereof, tetramethoxyethyl guanamine, tetraacyloxymethyl guanamine, compounds obtained by acyloxymethylating 1 to 3 methylol groups of tetramethylol guanamine and mixtures thereof.

Examples of the glycoluril compounds include tetramethylol glycoluril, tetramethoxymethyl glycoluril, compounds obtained by methoxymethylating 1 to 3 methylol groups of tetramethylol glycoluril, mixtures thereof, and compounds obtained by acyloxymethylating 1 to 3 methylol groups of tetramethylol glycoluril and mixtures thereof.

Examples of the urea compounds include tetramethylolurea, tetramethoxymethylurea, compounds obtained by methoxymethylating 1 to 3 methylol groups of tetramethylolurea, mixtures thereof, and tetramethoxymethylurea. These can be used alone or in a combination thereof.

The phenol, naphthol or hydroxyanthracene compound substituted by at least one group selected from methylol, alkoxymethyl and acyloxymethyl groups, which is contained as component (c), in a similar manner to component (b) above, thermally forms crosslinking to inhibit from intermixing with the topcoat photoresist and thereby improves the strength of the film further.

The number of the methylol, acyloxymethyl or alkoxymethyl groups contained in component (c) is at least two per molecule, and a compound with all 2- and 4-positions of a phenolic compound substituted thereby is preferable, from the viewpoints of thermal crosslinking property and storage stability.

In addition, the skeletal naphthol or hydroxyanthracene compound is also preferably a compound having substituents at all ortho- and para-positions relative to the OH group.

The 3- or 5-position of the skeletal phenol compound may be unsubstituted or substituted. In addition, in the skeletal naphthol compound as well, the sites other than ortho-positions of the OH group may be unsubstituted or substituted.

The methylol group-containing compound can be prepared when a compound having a hydrogen atom at the ortho- or para-position (2- or 4-position) relative to the phenolic OH group as raw material is reacted with formalin in the presence of a basic catalyst such as sodium hydroxide, potassium hydroxide, ammonia, or tetraalkylammonium hydroxide.

The alkoxymethyl group-containing compound can be prepared when the methylol group-containing compound is heated in alcohol in the presence of an acid catalyst such as hydrochloric acid, sulfuric acid, nitric acid, or methanesulfonic acid.

The acyloxymethyl group-containing compound can be prepared when the methylol group-containing compound is reacted with an acyl chloride in the presence of a basic catalyst.

Examples of the skeletal compounds in component (c) include phenol, naphthol, and hydroxyanthracene compounds in which the ortho- or para-position relative to the phenolic OH group is unsubstituted, such as phenol, cresol isomers, 2,3-xylenol, 2,5-xylenol, 3,4-xylenol, 3,5-xylenol, bisphenols such as bisphenol A, 4,4'-bishydroxybiphenyl, TRIS P-PA (trade name, manufactured by Honshu Chemical Industry Co., Ltd.), naphthol, dihydroxynaphthalene and 2,7-dihydroxyanthracene.

Specific examples of component (c) include trimethylol phenol, tri(methoxymethyl)phenol, compounds obtained by methoxymethylating 1 or 2 methylol groups of trimethylol phenol, trimethylol-3-cresol, tri(methoxymethyl)-3-cresol, compounds obtained by methoxymethylating 1 or 2 methylol groups of trimethylol-3-cresol, dimethylol cresol such as 2,6-dimethylol-4-cresol, tetramethylol bisphenol A, tetamethoxymethylbisphenol A, compounds obtained by methoxymethylating 1 to 3 methylol groups of tetramethylol bisphenol A, tetramethylol-4,4'-bishydroxybiphenyl, tetramethoxymethyl-4,4'-bishydroxybiphenyl, hexamethylol compounds of TRIS P-PA, hexamethoxymethylated TRIS P-PA, compounds obtained by methoxymethylating 1 to 5 methylol groups of a hexamethylol compound of TRIS P-PA, and bishydroxymethylnaphthalenediol.

Examples of hydroxyanthracene compounds include 1,6-dihydroxymethyl-2 and 7-dihydroxyanthracene.

Examples of acyloxymethyl-containing compounds include compounds obtained by acyloxymethylating some or all of the methylol groups of the methylol-containing compounds.

Among these compounds, preferable examples of the compounds include trimethylol phenol, bishydroxymethyl-p-cresol, tetramethylol bisphenol A, hexamethylol compounds of TRIS P-PA (trade name, manufactured by Honshu Kagaku Kogyo Co., Ltd.), or phenol compounds obtained by substituting the methylol groups of these compounds with alkoxymethyl groups or with methylol group(s) and alkoxymethyl group(s).

These can be used alone or in a combination of two or more thereof.

The content of the components (a) to (c) in the dye-containing photosensitive composition may vary according to the raw materials used. However, it is preferably in the range of 1 to 60 mass % and more preferably in the range of 10 to 50 mass %, with respect the total solid content of the composition. When the content is within the above range, sufficient hardness and the elution properties of an unexposed portion can be retained, that is, the hardness of the exposed portion neither becomes insufficient nor the elution properties of the unexposed portion become remarkably deteriorated.

<Alkali-soluble Resin>

In the next place, the alkali-soluble resins will be described. The dye-containing photosensitive composition of the invention may contain an alkali-soluble resin. A resin that is used in the invention (hereinafter, referred to as a binder in some cases), as long as it is alkali-soluble, is not particularly restricted, and selected preferably in view of the heat resistance, developability, and availability.

When a photopolymerization initiator is used as a photosensitive compound, as an alkali-soluble binder, one that is a straight-chain organic polymer soluble in an organic solvent and developable in an aqueous weakly alkaline solution is preferable. Examples of such straight-chain organic polymers include polymers having a carboxylic acid in a side chain thereof such as methacrylic acid copolymers, acrylic acid copolymers, itaconic acid copolymers, crotonic acid copolymers, maleic acid copolymers, and partially esterified maleic acid copolymers described in JP-A No. 59-44615, JP-B Nos. 54-34327, 58-12577 and 54-25957 and JP-A Nos. 59-53836 and 59-71048, and similarly, acidic cellulose derivatives having a carboxylic acid in a side chain thereof are also useful. Further, addition products obtained by adding an acid anhydride to a polymer having a hydroxyl group, polyhydroxystyrene-based resins, polysiloxane-based resins, poly(2-hydroxyethyl (meth)acrylate), polyvinylpyrrolidone, polyethylene oxide, and polyvinyl alcohol are also useful.

The above-mentioned alkali-soluble binder may be copolymers of monomers having hydrophilicity and examples of thereof include alkoxyalkyl(meth)acrylate, hydroxyalkyl(meth)acrylate, glycerol(meth)acrylate, (meth)acrylamide, N-methylolacrylamide, secondary alkylacrylamide, tertiary alkylacrylamide, dialkylaminoalkyl(meth)acrylate, morpholine(meth)acrylate, N-vinylpyrrolidone, N-vinylcaprolactam, vinylimidazole, vinyltriazole, methyl (meth)acrylate, ethyl(meth)acrylate, branched or straight-chain propyl(meth)acrylate, branched or straight-chain butyl (meth)acrylate, and phenoxyhydroxypropyl(meth)acrylate.

In addition, as hydrophilic monomers, monomers containing a tetrahydrofurfuryl group, a phosphate moiety, a phosphoric ester moiety, a quaternary ammonium salt moiety, an ethyleneoxy chain, a propyleneoxy chain, sulfonic acid or a salt thereof or a morpholinoethyl group are also useful.

Furthermore, when the composition is constituted as a negative type composition, in order to improve the crosslinking efficiency, the alkali-soluble binder may have a polymerizable group on its side chain, and, polymers having an allyl group, (meth)acryl group or allyloxyalkyl group on the side chain are also useful. Examples of these polymerizable group-containing polymers will be shown below. However, the polymer is not restricted thereto as long as it contains an alkali-soluble group such as COOH group, OH group or ammonium group and a carbon-carbon unsaturated bond.

Specific examples thereof for use include compounds obtained by reacting a copolymer of, for example, 2-hydroxyethyl acrylate having a OH group, for example, methacrylic acid containing a COOH group and a monomer of an acrylic-based compound or vinyl-based compound polymerizable therewith with a compound containing an epoxy ring reactive with the OH group and a carbon-carbon unsaturated bond group such as glycidyl acrylate. As to the reaction with OH, in addition to the epoxy ring above, acid anhydrides and compounds having an isocyanate group or acryloyl group can be used as well. The reaction products described in JP-A Nos. 6-102669 and 6-1938, which are prepared by reacting a compound obtained in reaction of an epoxy ring-containing compound and an unsaturated carboxylic acid such as acrylic acid with a saturated or unsaturated polybasic acid anhydride, may be used as well. Examples of the compounds having both an alkali soluble group such as COOH and a carbon-carbon unsaturated group include DIANAL NR series (trade name, manufactured by Mitsubishi Rayon Co., Ltd.); PHOTOMER 6173 (trade name, COOH group-containing polyurethane acrylic oligomer, manufactured by Diamond Shamrock Co. Ltd.); VISCOAT R-264 and KS RESIST 106 (trade names, each of them is manufactured by Osaka Organic Chemical Industry Ltd.); CYCLOMER P and PLACCEL CF200 series (trade names, each of these is manufactured by Daicel Chemical Industries, Ltd.); and EBECRYL 3800 (trade name, manufactured by Daicel UCB Co., Ltd.).

Among these various kinds of alkali-soluble binders, the acrylic resins are preferable, and, as the acrylic resins, copolymers made of monomers selected from benzyl(meth)acrylate, (meth)acrylic acid, hydroxyethyl(meth)acrylate and (meth)acryl amide, KS resist-106 (trade name, manufactured by Osaka Organic Chemical Industry Ltd.) and Cyclomer P series (trade name, manufactured by Daicel Chemical Industries, Ltd.) are preferable.

The binders preferably have a weight average molecular weight (the polystyrene equivalent value measured by GPC method) of 1000 to $2\times10^5$, more preferably 2000 to $1\times10^5$, and still more preferably 5000 to $5\times10^4$.

The used amount of the binder in the composition of the invention is preferably 10.0 or less mass %, more preferably 8.0 or less mass %, and still more preferably 6.0 or less mass %, based on the total solid content in the composition of the invention. From the viewpoint of improving the sensitivity, in an embodiment, it is preferable that the binder is not used.

When a photoacid generator is used as the photosensitive compound, examples of usable alkali-soluble resins include, other than a phenol-formaldehyde resin, cresol-formaldehyde resin, phenol-cresol-formaldehyde co-condensation resin, phenol-modified xylene resin, polyhydroxystyrene, polyhalogenated hydroxystyrene, copolymers of N-(4-hydroxyphenyl)methacrylamide and copolymers of hydroquinone monomethacrylate, sulfonylimide-based polymers described in JP-A No. 7-28244, and carboxyl-containing polymers described in JP-A No. 7-36184. In addition to the above, a variety of alkali-soluble polymers such as phenolic hydroxyl-containing acrylic resins described in JP-A No. 51-34711, sulfonamide-containing acrylic resins described in JP-A No. 2-866, and urethane-based resins can be used. Among them, novolak resins of p-cresol, novolak resins of p-cresol and m-cresol, and novolak resins represented by the following formula (V) are preferably used.

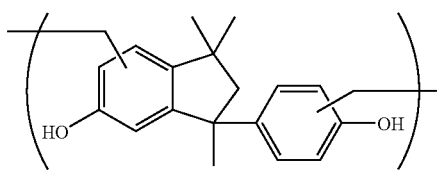

Formula (V)

A used amount of the binder in the composition of the invention is preferably 30.0 or less mass %, more preferably 25.0 or less mass %, and still more preferably 20.0 or less mass %, based on the total solid content in the composition of the invention. Among these, 10.0 or less mass % is particularly preferable and, from the viewpoint of improving the sensitivity, in an embodiment, it is preferable that the binder is not used.

<Solvent>

The solvent is basically not restricted as long as it can satisfy the solubility and coating property of the compositions. In particular, the solvent is preferably selected in consideration of a dye, the solubility of the binder, coating property, and safety.

Examples of the solvents that are used when the composition of the invention is prepared include esters such as ethyl acetate, n-butyl acetate, isobutyl acetate, amyl formate, isoamyl acetate, isobutyl acetate, butyl propionate, isopropyl butyrate, ethyl butyrate and butyl butyrate; alkyl esters such as methyl lactate, ethyl lactate, methyl oxyacetate, ethyl oxyacetate, butyl oxyacetate, methyl methoxyacetate, ethyl methoxyacetate, butyl methoxyacetate, methyl ethoxyacetate and ethyl ethoxyacetate;

3-oxypropionic acid alkyl esters such as methyl 3-oxypropionate and ethyl 3-oxypropionate; methyl 3-methoxypropionate, ethyl 3-methoxypropionate, methyl 3-ethoxypropionate, ethyl 3-ethoxypropionate, methyl 2-oxypropionate, ethyl 2-oxypropionate, propyl 2-oxypropionate, methyl 2-methoxypropionate, ethyl 2-methoxypropionate, propyl 2-methoxypropionate, methyl 2-ethoxypropionate, ethyl 2-ethoxypropionate, methyl 2-oxy-2-methylpropionate, ethyl 2-oxy-2-methylpropionate, methyl 2-methoxy-2-methylpropionate and ethyl 2-ethoxy-2-methylpropionate, methyl pyruvate, ethyl pyruvate, propyl pyruvate, methyl acetoacetate, ethyl acetoacetate, methyl 2-oxobutanoate and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, ethyl carbitol acetate, butyl carbitol acetate, diethylene glycol monomethyl ether, diethylene glycol monoethyl ether, diethylene glycol monobutyl ether, propylene glycol methyl ether, propylene glycol methyl ether acetate, propylene glycol ethyl ether acetate, and propylene glycol propyl ether acetate; ketones such as methyl ethyl ketone, cyclohexanone, 2-heptanone, and 3-heptanone; and aromatic hydrocarbons such as toluene and xylene.

More preferable examples among them include methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, ethyl carbitol acetate, butyl carbitol acetate, propylene glycol monomethyl ether, and propylene glycol monomethyl ether acetate.

The composition according to the invention may contain, as needs arise, various additives such as a filler, a polymer compound other than the above-mentioned polymers, a surfactant, an adhesion promoting agent, an antioxidant, an ultraviolet absorbent and a flocculation inhibitor.

Specific examples of the additives include fillers such as glass and alumina; polymer compounds other than the binder resins such as polyvinyl alcohol, polyacrylic acid, polyethylene glycol monoalkyl ether and polyfluoroalkyl acrylate; surfactants such as nonionic, cationic, and anionic surfactants; adhesion promoting agents such as vinyltrimethoxysilane, vinyltriethoxysilane, vinyltris(2-methoxyethoxy)silane, N-(2-aminoethyl)-3-aminopropylmethyldimethoxysilane, N-(2-aminoethyl)-3-aminopropyltrimethoxysilane, 3-aminopropyltriethoxysilane, 3-glycidoxypropyltrimethoxysilane, 3-glycidoxypropylmethyldimethoxysialne, 2-(3,4-epoxycyclohexyl)ethyltrimethoxysilane, 3-chloropropylmethyldimethoxysilane, 3-chloropropyltrimethoxysilane, 3-methacryloxypropyltrimethoxysilane, and 3-mercaptopropyltrimethoxysilane; antioxidants such as 2,2-thiobis(4-methyl-6-t-butylphenol) and 2,6-di-t-butylphenol; ultraviolet absorbents such as 2-(3-t-butyl-5-methyl-2-hydroxyphenyl)-5-chlorobenzotriazole and alkoxybenzophenone; and flocculation inhibitors such as poly(sodium acrylate).

Organic carboxylic acids, preferably low molecular weight organic carboxylic acids with a molecular weight of 1000 or less may be added for enhancing alkali solubility of non-cured parts to further improving developability of the dye-containing curable composition of the invention. Examples of the organic carboxylic acid include aliphatic monocarboxylic acids such as formic acid, acetic acid, propionic acid, butyric acid, valeric acid, pivalic acid, caproic acid, diethylacetic acid, enanthic acid and caprylic acid; aliphatic dicarboxylic acids such as oxalic acid, malonic acid, succinic acid, glutaric acid, adipic acid, pimelic acid, suberic acid, azelaic acid, sebacic acid, brassylic acid, methylmalonic acid, ethylmalonic acid, dimetylmalonic acid, methylsuccinic acid, tetramethylsuccinic acid and citraconic acid; aliphatic tricarboxylic acid such as tricarballylic acid, aconitic acid and camphoronic acid; aromatic monocarboxylic acid such as benzoic acid, toluic acid, cuminic acid, hemelitic acid and mesitylenic acid; aromatic polycarboxylic acid such as phthalic acid, isophthalic acid, terephthalic acid, trimellitic acid, trimesic acid, mellophanic acid and pyromellitic acid; and other carboxylic acid such as phenylacetic acid, hydroatropic acid, hydrocinnamic acid, mandelic acid, phenylsuccinic acid, atropic acid, cinnamic acid, methyl cinnamate, benzyl cinnamate, cinnamilydenic acid, cumalic acid and umbelic acid.

<Color Filter and Producing Method Thereof>

A color filter according to the invention is produced by using the composition of the invention.

In the beginning, the composition of the invention is coated on a support by a coating method such as spin coating, flow casting coating, or roll coating to form a photosensitive composition layer, followed by exposing through a predetermined mask pattern, further followed by developing to form a colored pattern. Here, as needs arise, a process of heating and/or exposing the resist pattern to cure may be included.

The color filter of the invention can be prepared by repeating the above described process corresponding to the number of desired hues (for example, three colors of red (R), green (G) and blue (B)).

The radiation to be used is preferably ultraviolet radiation such as g-ray, h-ray, and i-ray.

The support may be soda glass, PYREX™ glass, or quartz glass which may be used for a liquid crystal display device and the like, or a support obtained by forming a transparent conductive film thereon; or a photoelectric conversion device substrate which may be used for an image pickup device an the like, such as a silicon substrate and a complementary metal oxide semiconductor (CMOS). In some cases, the support may have black stripes formed thereon to isolate the respective pixels.

Further, as needs arise, an undercoating layer may be provided on the support so as to improve the adhesion with an upper layer, to inhibit substances from diffusing, or to flatten the substrate surface.

A developer used in the producing method of the color filter according to the invention may be any developer as long as it is capable of dissolving the photosensitive composition of the invention while it is incapable of dissolving a radiation-irradiated portion. Specifically, a variety of combinations of organic solvents and aqueous alkaline solutions can be used.

As the organic solvents, the above-described solvents that are used in the preparation of the composition of the invention can be cited.

The aqueous alkaline solutions are preferably aqueous alkaline solutions containing an alkaline compound such as sodium hydroxide, potassium hydroxide, sodium carbonate, sodium silicate, sodium metasilicate, ammonia water, ethylamine, diethylamine, dimethylethanolamine, tetramethylammonium hydroxide, tetraethylammonium hydroxide, choline, pyrrole, piperidine, or 1,8-diazabicyclo-[5.4.0]-7-undecene dissolved at a concentration in the range of 0.001 to 10 mass % and preferably in the range of 0.01 to 1 mass %. When a developer containing such an aqueous alkaline solution is used, washing with water is generally carried out after development.

The color filter according to the invention can be used for liquid crystal display devices and solid-state image pickup devices such as CCDs, and is particularly suitable for high-resolution CCD devices and CMOS devices that have 1,000,000 or more pixels. The color filter according to the invention can be used as a color filter installed between a light receiving part of the respective pixels of the CCD and a micro-lens for focusing light.

EXAMPLES

Hereinbelow, the invention will be described in detail by way of Examples. However, the invention is not limited to these Examples as long as the scope of the invention is not impaired. Unless noted differently, the "part" is based on the weight.

Example 1

1) Preparation of Resist Solution
Propylene glycol monomethyl ether acetate (PGMEA) . . . 19.20 parts
Ethyl lactate . . . 36.67 parts
Resin (PGMEA solution of 40% benzyl methacrylate/methacrylic acid/methacrylic acid-2-hydroxyethyl copolymer (molar ratio=60:22:18) . . . 30.51 parts
Dipentaerythritol hexaacrylate (photopolymerizable compound) . . . 12.20 parts
Polymerization inhibitor (p-methoxy phenol) . . . 0.0061 parts
Fluorinated surfactant (trade name: F-475, manufactured by Dainippon Ink and Chemicals Inc.) . . . 0.83 parts and
Photopolymerization initiator (trade name: TAZ-107 (trihalomethyl triazine-based photopolymerization initiator), manufactured by Midori Kagaku Co., Ltd.) . . . 36.67 parts were blended and dissolved to prepare a resist solution.

2) Preparation of Silicon Wafer Substrate with Undercoat Layer

A 6-inch silicon wafer was heated in an oven at 200° C. for 30 min. Then, the resist solution was coated on the silicon wafer so as to be 2 μm in dry thickness, followed by further heating in the oven at 220° C. for 1 hr to dry to form an undercoat layer, and thereby a silicon wafer substrate with an undercoat layer was obtained.

3) Preparation of Dye-containing Photosensitive Composition Containing Radical Polymerizable Monomer Compounds of composition A-1 below were blended and dissolved to prepare dye-containing photosensitive composition A-1.

-Composition A-1-

Cyclohexanone . . . 80 parts

Organic solvent-soluble phthalocyanine (above-mentioned exemplary compound 28) . . . 6.0 parts Organic solvent-soluble dye (compound a shown below) . . . 4.0 parts 3:7 mixture of the above-mentioned exemplary compound (M-2) of the radical polymerizable monomer and pentaerythritol hexaacrylate . . . 7.2 parts Oxime base photopolymerization initiator (trade name: CGI-242, manufactured by Ciba Specialty Chemicals Inc.) . . . 2.5 parts Bis(hexafluoroacetylacetonato)cobalt (II) (transition metal complex) . . . 0.3 parts

4) Exposure/development and Evaluation of Dye-containing Photosensitive Composition -Evaluation of Inhibition of Viscosity Increasing over Time- Dye-containing photosensitive composition A-1 prepared in "3) preparation of dye-containing photosensitive composition containing radical polymerizable monomer" was coated on the undercoat layer of the silicon wafer substrate with undercoat layer prepared in "2) preparation of silicon wafer substrate with undercoat layer" to form a photocurable coated film. Then, the coated film was heated (pre-bake) with a hot plate at 100° C. for 120 seconds so as to obtain a dry film thickness of the coated film of 0.8 μm. In the next place, by use of an exposing unit, an entire surface of the coated film was irradiated with light having a wavelength of 365 nm at an exposure amount of 2000 mJ/cm². A dry thickness of the coated film after exposure was measured with a stylus profilometer DEKTAK 6M (trade name, manufactured by Veeco Instruments). After that, dye-containing photosensitive composition A-1 was stored under room temperature for one month, followed by forming a coated film and measuring a film thickness in the same manner as above. A ratio of change in a film thickness over time was obtained by calculating a ratio of thickness B after the storage (excluding a film thickness due to the under coating) to film thickness A before the storage (%; B/A×100). The ratio was taken as an index for evaluating the inhibition of viscosity increasing with time. The smaller the ratio of the change in the thickness is, the more excellent the inhibition effect of viscosity increasing with time is. The ratio of the change in the film thickness of 110% or less is a practically acceptable level.

-Evaluation of Light Resistance-

Dye-containing photosensitive composition A-1 obtained in "3) preparation of dye-containing photosensitive composition containing radical polymerizable monomer" was coated by use of a spin coater on a glass substrate so as to obtain a film thickness of 1.0 μm, followed by pre-baking at 120° C. for 120 seconds.

In the next place, by use of an exposure unit, an entire surface of the coated film was irradiated with light having a wavelength of 365 nm at an exposure amount of 1000 mJ/cm². After the irradiation, a developing solution of 50% CD-2000 (trade name, manufactured by Fuji Film Electronic Materials Co., Ltd.) was used to develop at 23° C. for 60 seconds. Then, running water was used to rinse for 20 seconds, followed by spray drying, further followed by heating at 200° C. for 300 seconds (post bake), and thereby a colored filter film was obtained.

Thus obtained colored filter film was provided with a UV-cut filter, the colored glass substrate, after subjecting to irradiation with a xenon lamp at 100,000 lux for 20 hr (equivalent to 2,000,000 lux·hr), was measured of chromaticity variation in a patterned image, that is, a ΔEab value, and, based on the measurement, the light resistance was evaluated. The smaller the ΔEab value is, the more excellent in the light resistance is. When the ΔEab value is less than 5, it is a practically acceptable level.

Results are shown in Table 1 below.

-Evaluation of Spectral Variation due to Addition of Complex-

According to a process same as that described in the evaluation of the light resistance, colored filter film 1 was obtained. Then, according to the method similar to that of colored filter film 1 except that a transition metal complex was not added, colored filter film 2 was obtained. The chromaticity difference of colored filter film 1 and colored filter film 2, that is, ΔEab was measured, and thereby the spectral variation was evaluated based on the measurement. The smaller the ΔEab value is, the smaller the spectral variation due to the addition of the complex is. When the ΔEab value is less than 5, it is a practically acceptable level.

Examples 2 through 12, Comparative Examples 1 and 2

Dye-containing photosensitive compositions A-2 to A-14 were prepared, color filters were prepared using the compositions, and evaluation thereof was carried out in the same manner as in Example 1 except that the organic solvent-soluble phthalocyanine, the organic solvent-soluble dye other than the organic solvent-soluble phthalocyanine and the transition metal complex in composition A-1, which were used to prepare dye-containing photosensitive composition A-1 in Example 1, respectively, were changed as shown in Table 1 below.

Results are shown in Table 1 below.

TABLE 1

| | Dye-containing photosensitive composition | Phthalocyanine | Dye | Transition Metal Complex Compound | $\epsilon_{max}$ | Spectral Variation due to Addition of Complex (ΔEab) | Light Resistance (ΔEab) | Ratio of Change in Film Thickness (%) |
|---|---|---|---|---|---|---|---|---|
| Example 1 | A-1 | 28 | a | Bis(hexafluoroacetylacetonato) cobalt(II) | 354 | 2.7 | 2.5 | 100 |
| Example 2 | A-2 | 21 | b | Bis(hexafluoroacetylacetonato) nickel(II) | 226 | 2.5 | 1.9 | 100 |
| Example 3 | A-3 | 32 | c | Bis(trifluoroacetylacetonato) cobalt (II) | 242 | 2.4 | 2.7 | 101 |
| Example 4 | A-4 | 7 | d | Bis(acetylacetonato) cobalt (II) | 245 | 3.2 | 2.8 | 103 |
| Example 5 | A-5 | C-1 | c | Bis(hexafluoroacetylacetonato) copper(II) | 214 | 2.3 | 2.8 | 100 |
| Example 6 | A-6 | C-6 | a | Bis(2,2,6,6-tetramethyl-3,5-heptanedionato) nickel (II) | 224 | 2.5 | 2.1 | 101 |
| Example 7 | A-7 | C-9 | b | Tetrakispyridine iron (II) bromide | 3680 | 4.5 | 3.8 | 105 |
| Example 8 | A-8 | C-48 | d | Chromium (III) acetylacetonato | 420 | 2.7 | 4.5 | 107 |
| Example 9 | A-9 | C.I Acid Blue 249 | b | Bis(2,2,6,6-tetramethyl-3,5-heptanedionato) copper (II) | 232 | 2.9 | 3.2 | 102 |
| Example 10 | A-10 | C.I Acid Blue 249 | d | Tetra(diethylamino) titanium | 140 | 3.3 | 4.7 | 108 |
| Example 11 | A-11 | 1 | e | Bis(hexafluoroacetylacetonato) cobalt(II) | 354 | 2.6 | 1.5 | 100 |
| Example 12 | A-12 | 6 | f | Bis(hexafluoroacetylacetonato) cobalt(II) | 245 | 2.9 | 1.2 | 102 |
| Comparative Example 1 | A-13 | C.I Acid Blue 249 | d | Nothing | — | — | 35 | 125 |
| Comparative Example 2 | A-14 | C.I Acid Blue 249 | d | Bis(salicylideneiminate-3-propyl)methyl-amino cobalt(II) | 5710 | 7.3 | 3.5 | 105 |

*1. A value of $\epsilon_{max}$ denotes a maximum value of the molar absorption coefficient $\epsilon$ in a visible light region.
*2. "Phthalocyanine" in the Table means an organic solvent-soluble phthalocyanine. A mark such as "28" in the column of phthalocyanine represents a specific number of an exemplary compound of phthalocyanine.
*3. "Dye" in the Table means an organic solvent-soluble dye other than the organic solvent-soluble phthalocyanine. Marks of "a" to "f" in the column of dye, respectively, represent compounds a to f shown below.

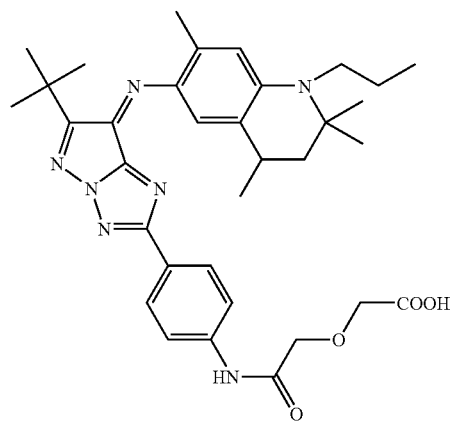

Compound a

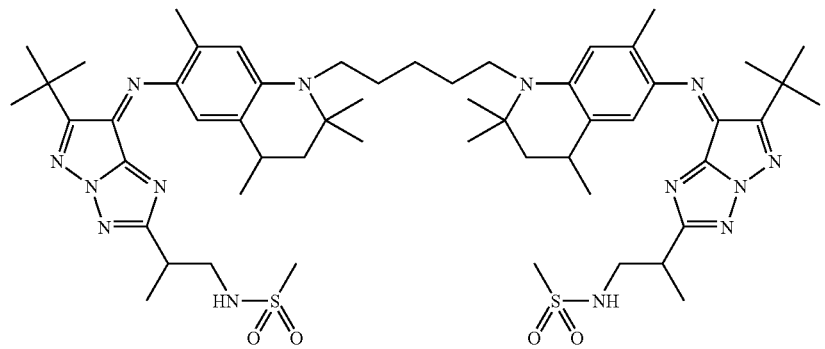

Compound b

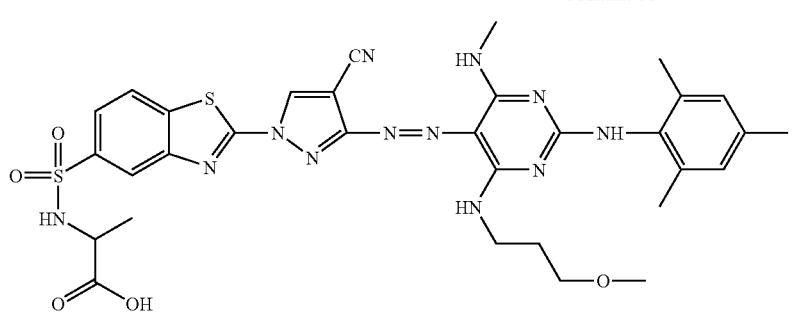

Compound c

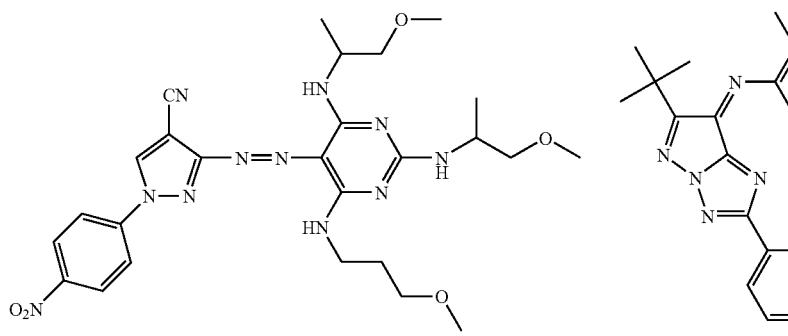

Compound d

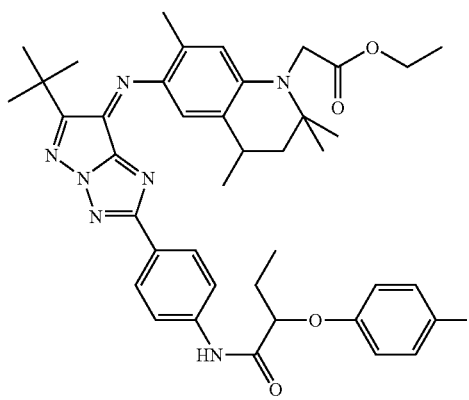

Compound e

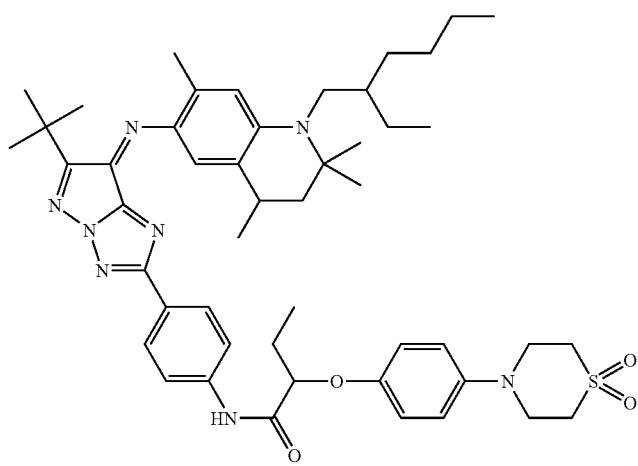

Compound f

As shown in Table 1, in the dye-containing photosensitive compositions of the invention (Examples 1 to 12), the light resistance was excellent and the viscosity increasing over time was suppressed.

On the other hand, in the dye-containing photosensitive composition that does not contain the transition metal complex (Comparative Example 1), the light resistance was poor and the viscosity increasing over time was remarkable.

-Preparation of Color Filter-

Furthermore, each of the dye-containing photosensitive compositions prepared in Examples 1 to 12, after storing for one month, was coated on the undercoat layer of the silicon wafer substrate with undercoat layer prepared in "2) preparation of silicon wafer substrate with undercoat layer" to form a photocurable coated film. Then, the coated film was heated with a hot plate at 100° C. for 120 seconds (pre-bake) so as to obtain a dry film thickness of the coated layer of 0.8 μm.

Subsequently, to a formed coated film, by use of an i-ray stepper exposure unit FPA-3000i5+(trade name, manufactured by Canon Inc.), at a wavelength of 365 nm, through a mask having a 2 μm square yellow Island pattern, irradiation was carried out at an exposure amount of 40 to 520 mJ/cm². Thereafter, the silicon wafer substrate on which irradiated coated film was formed was placed on a horizontal rotary table of a spin and shower developing unit (trade name: DW-30, manufactured by Chemitronics Co., Ltd.), subjected to paddle development at 23° C. for 60 seconds with CD-2000 (trade name, manufactured by Fuji Film Electronic Materials Inc.), and thereby a colored pattern was formed on the silicon wafer substrate.

On the other hand, when the same operation was carried out with the dye-containing photosensitive composition prepared according to Comparative Example 1, the development could not be carried out and a colored pattern could not be formed.

Example 13

5) Preparation of Dye-containing Photosensitive Composition Containing Alkali-soluble Resin Compounds of composition B-1 below were blended and dissolved to form dye-containing photosensitive composition B-1.

-Composition B-1-
- Cyclohexanone . . . 80 parts
- Binder {p-cresol/novolak resin (Mw: 5000) . . . 1.1 parts
- Organic solvent-soluble phthalocyanine (above-mentioned exemplary compound 28) . . . 6.6 parts
- Organic solvent-soluble dye (compound a shown above) . . . 4.4 parts
- Hexamethoxymethyl melamine . . . 7.4 parts and
- Photoacid generator (compound g shown below) . . . 0.5 parts were blended and dissolved to prepare a resist solution.

Compound g

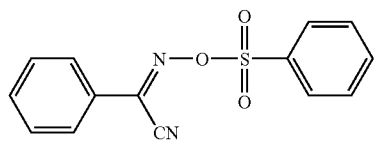

Examples 14 to 17 and Comparative Example 3

Dye-containing photosensitive compositions B-1 to B-6 were prepared in the same manner as in Example 13 except that, in the preparation of the dye-containing photosensitive composition B-1, the organic solvent-soluble phthalocyanine, the organic solvent-soluble dye other than the organic solvent-soluble phthalocyanine and the transition metal complex, respectively, were changed as shown in Table 2 below. Then, color filters were prepared and evaluation was carried out in the same manner as in Example 1 except that, after exposure, further heating was carried out at 120° C. for 60 seconds. Results are shown in Table 2 below.

As shown in Table 2, in the dye-containing photosensitive compositions (Examples 13 to 17) of the invention, the light resistance was excellent and the viscosity increasing with time was suppressed.

On the other hand, in the dye-containing photosensitive composition that does not contain the transition metal complex (Comparative Example 3), the light resistance was poor and the viscosity increasing with time was remarkable.

In the above, examples in which a particular organic solvent-soluble phthalocyanine, a particular photosensitive compound and a particular transition metal complex were used in the dye-containing photosensitive composition of the invention are described. However, advantages of the invention, as long as the composition is included in the range of the invention, even in the case where other phthalocyanines, other photosensitive compounds and other transition metal complexes are used, can be similarly obtained.

Hereinafter, embodiments of the invention will be described. However, the invention is not limited to these embodiments.

[1] A dye-containing photosensitive composition, comprising:
phthalocyanine;
a photosensitive compound; and
a transition metal complex having a molar absorption coefficient $\epsilon$ in a visible light region of less than 5000.

[2] The dye-containing photosensitive composition as described in [1], wherein the molecular weight of one ligand in the transition metal complex is from 20 to less than 300.

[3] The dye-containing photosensitive composition as described in [1], wherein the photosensitive compound is a photopolymerization initiator and/or a photoacid generator.

[4] The dye-containing photosensitive composition as described in [1], further comprising a radical polymerizable monomer.

[5] The dye-containing photosensitive composition as described in [1], wherein the photosensitive compound is an oxime-based photopolymerization initiator.

[6] The dye-containing photosensitive composition as described in [1], wherein the phthalocyanine is a phthalocyanine compound represented by the following formula (I):

TABLE 2

| | Dye-containing photosensitive composition | Phthalocyanine | Dye | Transition Metal Complex Compound | $\epsilon_{max}$ | Spectral Variation due to Addition of Complex ($\Delta$Eab) | Light Resistance ($\Delta$Eab) | Ratio of Change in Film Thickness (%) |
|---|---|---|---|---|---|---|---|---|
| Example 13 | B-1 | 28 | a | Bis(hexafluoroacetylacetonato) cobalt (II) | 354 | 2.3 | 2.6 | 100 |
| Example 14 | B-2 | 7 | d | Bis(salicylaldehyde) cobalt (II) | 2320 | 4.0 | 2.9 | 105 |
| Example 15 | B-3 | C-1 | b | Bis(trifluoroacetylacetonato) cobalt (II) | 242 | 2.6 | 2.7 | 101 |
| Example 16 | B-4 | C-9 | c | Cobaltcene hexafluorophosphate | 210 | 2.5 | 2.9 | 106 |
| Example 17 | B-5 | C.I Acid Blue 249 | c | Bis(hexafluoroacetylacetonato) copper (II) | 214 | 2.5 | 3.0 | 100 |
| Comparative Example 3 | B-6 | C.I Acid Blue 249 | d | Nothing | — | — | 35 | 123 |

*1. A value of $\epsilon_{max}$ denotes a maximum value of the molar absorption coefficient $\epsilon$ in a visible light region.

*2. "Phthalocyanine" in the Table means an organic solvent-soluble phthalocyanine. A mark such as "28" in the column of phthalocyanine represents a specific number of an exemplary compound of phthalocyanine.

*3. "Dye" in the Table means an organic solvent-soluble dye other than the organic solvent-soluble phthalocyanine. Marks of "a" to "d" in the column of dye, respectively, represent compounds a to d shown above.

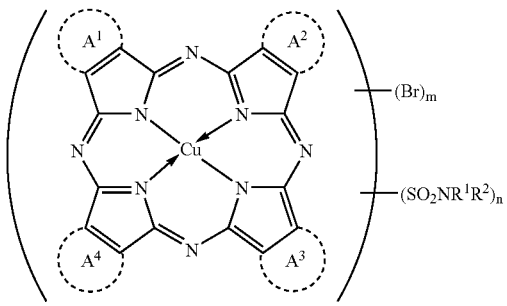

Formula (I)

wherein in formula (I), ring $A^1$, ring $A^2$, ring $A^3$ and ring $A^4$ each independently represent the following aromatic ring;

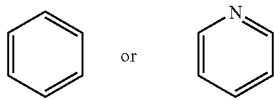

at least one of ring $A^1$, ring $A^2$, ring $A^3$ and ring $A^4$ represents the following aromatic ring; and

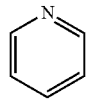

$R^1$ and $R^2$ each independently represent a hydrogen atom or a substituted or unsubstituted alkyl group; m denotes an integer from 1 to 8; n denotes an integer from 1 to 4; and $R^1$ and $R^2$ are not both a hydrogen atom simultaneously.

[7] The dye-containing photosensitive composition as described in [1], wherein the phthalocyanine is a phthalocyanine compound represented by the following formula (II):

wherein in formula (II), $Rc_1$ represents a halogen atom, an aliphatic group, an aryl group, a heterocyclic group, a cyano group, a carboxyl group, a carbamoyl group, an aliphatic oxy carbonyl group, an aryloxycarbonyl group, an acyl group, a hydroxy group, an aliphatic oxy group, an aryloxy group, an acyloxy group, a carbamoyloxy group, a heterocyclic oxy group, an aliphatic oxy carbonyloxy group, an N-alkylacylamino group, a carbamoylamino group, a sulfamoylamino group, an aliphatic oxy carbonylamino group, an aryloxy carbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imide group or a heterocyclic thio group; $Zc_1$ represents a non-metal atom group necessary for forming a 6-membered ring together with carbon atoms; four $Zc_1$s may be the same as or different from each other; M represents two hydrogen atoms, a divalent metal atom, a divalent metal oxide, a divalent metal hydroxide or a divalent metal chloride; cm represents 0, 1 or 2; cn denotes 0 or an integer from 1 to 5; four cns may be the same as or different from each other; one cn denotes an integer from 1 to 5; a plurality of $Rc_1$s in a molecule may be the same as or different from each other; $cr_1$, $cr_2$, $cr_3$ and $cr_4$ each independently represent 0 or 1; and the relationship $cr_1+cr_2+cr_3+cr_4 \geq 1$ is satisfied.

[8] The dye-containing photosensitive composition as described in [1], wherein the content of the phthalocyanine is from 20.0 mass % to 70.0 mass % based on the total solid content of the composition.

[9] The dye-containing photosensitive composition as described in [4], wherein the content of the radical polymerizable monomer is from 20.0 mass % to 70.0 mass % based on the total solid content of the composition.

[10] The dye-containing photosensitive composition as described in [1], wherein either an alkali-soluble resin is not contained or the content of the alkali-soluble resin is 10.0 mass % or less based on the total solid content of the composition.

[11] The dye-containing photosensitive composition as described in [1], further comprising:

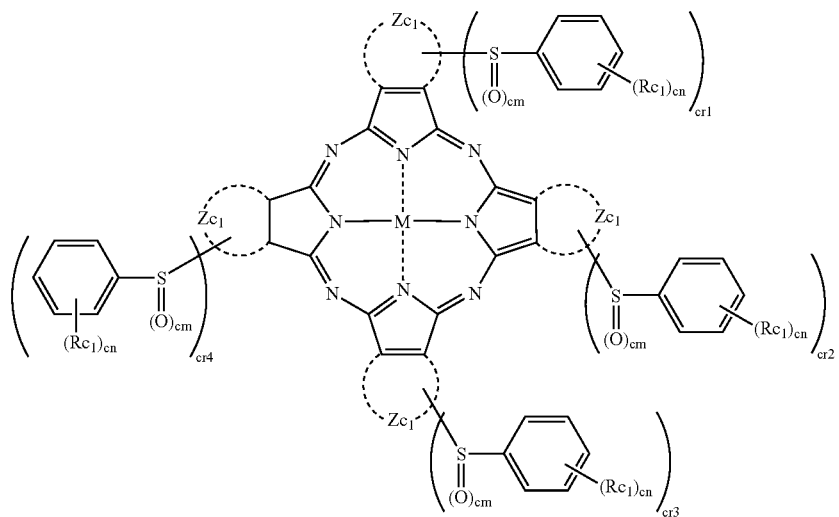

Formula (II)

at least one dye represented by the following formula (III):

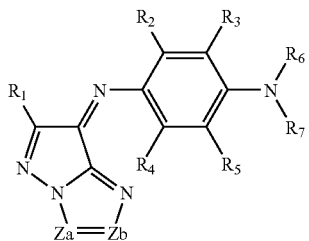

Formula (III)

wherein in formula (III), $R_1$ represents a hydrogen atom or a substituent other than a perfluoroalkylcarbonylamino group, sulfoneamide group, or sulfamoylamino group; $R_2$ to $R_5$ each independently represent a hydrogen atom or a substituent, $R_6$ and $R_7$ each independently represent an alkyl group, an alkenyl group, an aryl group or a heterocyclic group; Za and Zb each independently represent —N= or —C($R_8$)=; $R_8$ represents a hydrogen atom or a substituent; $R_2$ and $R_3$ may be bonded to each other to form a 5-membered, 6-membered or 7-membered ring; $R_3$ and $R_6$ may be bonded to each other to form a 5-membered, 6-membered or 7-membered ring; $R_4$ and $R_5$ may be bonded to each other to form a 5-membered, 6-membered or 7-membered ring; $R_5$ and $R_7$ may be bonded to each other to form a 5-membered, 6-membered or 7-membered ring; and $R_6$ and $R_7$ may be bonded to each other to form a 5-membered, 6-membered or 7-membered ring.

[12] The dye-containing photosensitive composition as described in [1], wherein a transition metal of the transition metal complex is a fourth row metal of the Periodic Table.

[13] The dye-containing photosensitive composition as described in [1], wherein a transition metal of the transition metal complex is a divalent metal ion.

[14] A color filter formed by using the dye-containing photosensitive composition as described in [1].

[15] A production method for a color filter, comprising:
coating the dye-containing photosensitive composition as described in [1] on a support to form a coated film;
exposing the coated film through a mask; and
developing to form a pattern.

All publications, patent applications, and technical standards mentioned in this specification are herein incorporated by reference to the same extent as if each individual publication, patent application, or technical standard was specifically and individually indicated to be incorporated by reference.

What is claimed is:
1. A dye-containing photosensitive composition, comprising:
phthalocyanine;
a photosensitive compound;
a transition metal complex having a molar absorption coefficient ε in a visible light region of less than 5000; and
a radical polymerizable monomer,
wherein the radical polymerizable monomer is a compound represented by Formula (VI-1) or (VI-2):

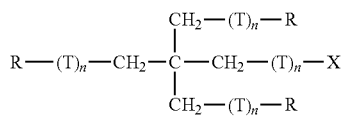

Formula (VI-1)

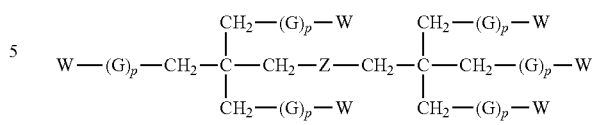

Formula (VI-2)

wherein,

R: 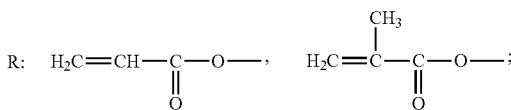

X: 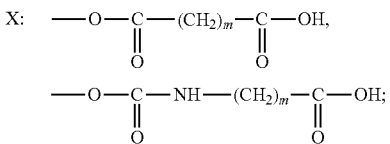

T: 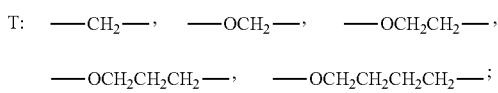

Z: 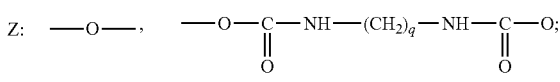

G: 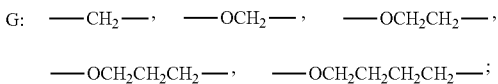

n represents 0 to 14;
m represents 1 to 8;
W has the meaning same as R or X in formula (VI-1), and three or more of six W's are R;
p represents 0 to 14;
q represents 1 to 8; and
respective of R, X, T, and G, when present plurally in one molecule, may be the same as or different from each other, respectively.

2. The dye-containing photosensitive composition of claim 1, wherein the molecular weight of one ligand in the transition metal complex is from 20 to less than 300.

3. The dye-containing photosensitive composition of claim 1, wherein the photosensitive compound is a photopolymerization initiator and/or a photoacid generator.

4. The dye-containing photosensitive composition of claim 1, wherein the photosensitive compound is an oxime-based photopolymerization initiator.

5. The dye-containing photosensitive composition of claim 1, wherein the phthalocyanine is a phthalocyanine compound represented by the following formula (I):

Formula (I)

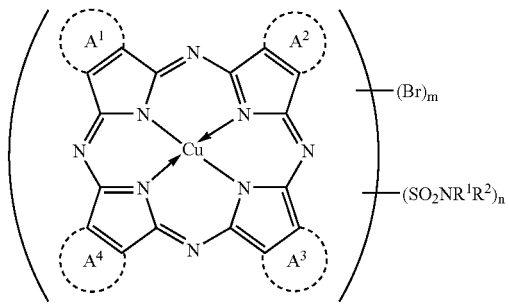

wherein in formula (I), ring $A^1$, ring $A^2$, ring $A^3$ and ring $A^4$ each independently represent the following aromatic ring;

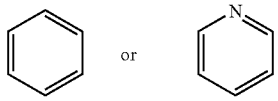

at least one of ring $A^1$, ring $A^2$, ring $A^3$ and ring $A^4$ represents the following aromatic ring; and

$R^1$ and $R^2$ each independently represent a hydrogen atom or a substituted or unsubstituted alkyl group; m denotes an integer from 1 to 8; n denotes an integer from 1 to 4; and $R^1$ and $R^2$ are not both a hydrogen atom simultaneously.

6. The dye-containing photosensitive composition of claim 1, wherein the phthalocyanine is a phthalocyanine compound represented by the following formula (II):

wherein in formula (II), $Rc_1$ represents a halogen atom, an aliphatic group, an aryl group, a heterocyclic group, a cyano group, a carboxyl group, a carbamoyl group, an aliphatic oxy carbonyl group, an aryloxycarbonyl group, an acyl group, a hydroxy group, an aliphatic oxy group, an aryloxy group, an acyloxy group, a carbamoyloxy group, a heterocyclic oxy group, an aliphatic oxy carbonyloxy group, an N-alkylacylamino group, a carbamoylamino group, a sulfamoylamino group, an aliphatic oxy carbonylamino group, an aryloxy carbonylamino group, an aliphatic sulfonylamino group, an arylsulfonylamino group, an aliphatic thio group, an arylthio group, an aliphatic sulfonyl group, an arylsulfonyl group, a sulfamoyl group, a sulfo group, an imide group or a heterocyclic thio group; $Zc_1$ represents a non-metal atom group necessary for forming a 6-membered ring together with carbon atoms; four $Zc_1$s may be the same as or different from each other; M represents two hydrogen atoms, a divalent metal atom, a divalent metal oxide, a divalent metal hydroxide or a divalent metal chloride; cm represents 0, 1 or 2; cn denotes 0 or an integer from 1 to 5; four cns may be the same as or different from each other; one cn denotes an integer from 1 to 5; a plurality of $Rc_1$s in a molecule may be the same as or different from each other; $cr_1$, $cr_2$, $cr_3$ and $cr_4$ each independently represent 0 or 1; and the relationship $cr_1+cr_2+cr_3+cr_4 \geq 1$ is satisfied.

7. The dye-containing photosensitive composition of claim 1, wherein the content of the phthalocyanine is from 20.0 mass % to 70.0 mass % based on the total solid content of the composition.

8. The dye-containing photosensitive composition of claim 1, wherein the content of the radical polymerizable monomer is from 20.0 mass % to 70.0 mass % or less based on the total solid content of the composition.

9. The dye-containing photosensitive composition of claim 1, wherein either an alkali-soluble resin is not contained or the content of the alkali-soluble resin is 10.0 mass % or less based on the total solid content of the composition.

10. The dye-containing photosensitive composition of claim 1, further comprising:

at least one dye represented by the following formula (III):

Formula (II)

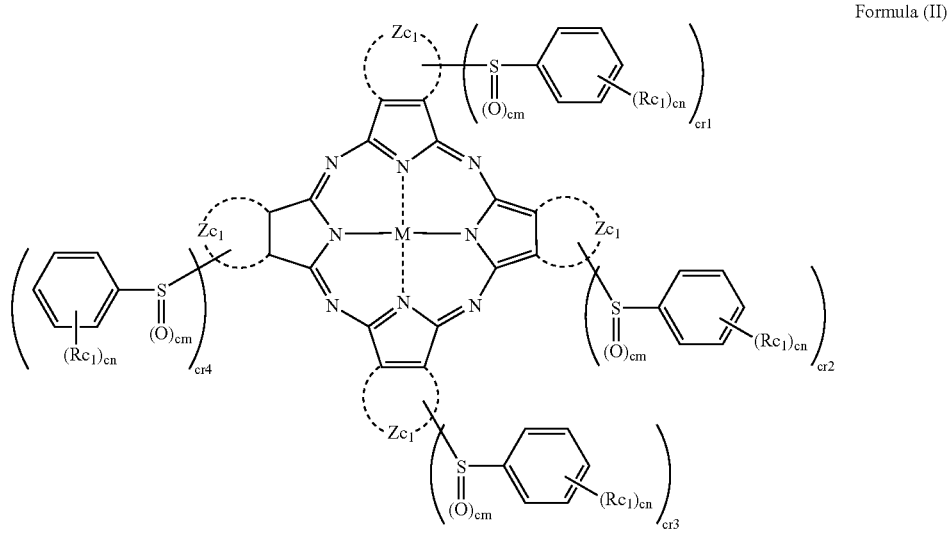

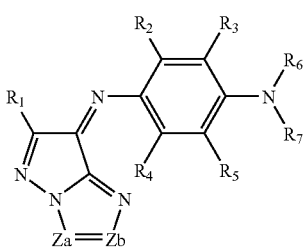

Formula (III)

wherein in formula (III), $R_1$ represents a hydrogen atom or a substituent other than a perfluoroalkylcarbonylamino group, sulfoneamide group, or sulfamoylamino group; $R_2$ to $R_5$ each independently represent a hydrogen atom or a substituent, $R_6$ and $R_7$ each independently represent an alkyl group, an alkenyl group, an aryl group or a heterocyclic group; Za and Zb each independently represent —N= or —C($R_8$)=; $R_8$ represents a hydrogen atom or a substituent; $R_2$ and $R_3$ may be bonded to each other to form a 5-membered, 6-membered or 7-membered ring; $R_3$ and $R_6$ may be bonded to each other to form a 5-membered, 6-membered or 7-membered ring; $R_4$ and $R_5$ may be bonded to each other to form a 5-membered, 6-membered or 7-membered ring; $R_5$ and $R_7$ may be bonded to each other to form a 5-membered, 6-membered or 7-membered ring; and $R_6$ and $R_7$ may be bonded to each other to form a 5-membered, 6-membered or 7-membered ring.

11. The dye-containing photosensitive composition of claim 1, wherein a transition metal of the transition metal complex is a fourth row metal of the Periodic Table.

12. The dye-containing photosensitive composition of claim 1, wherein a transition metal of the transition metal complex is a divalent metal ion.

13. A production method for a color filter, comprising:
coating the dye-containing photosensitive composition of claim 1 on a support to form a coated film;
exposing the coated film through a mask; and
developing to form a pattern of a color filter.

14. A color filter formed by the production method of claim 13.

15. A dye-containing photosensitive composition, comprising:
phthalocyanine;
a photosensitive compound;
a transition metal complex having a molar absorption coefficient ε in a visible light region of less than 5000; and
at least one dye represented by the following formula (III):

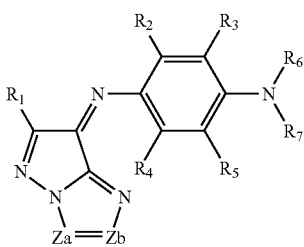

Formula (III)

wherein in formula (III), $R_1$ represents a hydrogen atom or a substituent other than a perfluoroalkylcarbonylamino group, sulfoneamide group, or sulfamoylamino group; $R_2$ to $R_5$ each independently represent a hydrogen atom or a substituent, $R_6$ and $R_7$ each independently represent an alkyl group, an alkenyl group, an aryl group or a heterocyclic group; Za and Zb each independently represent —N= or —C($R_8$)=; $R_8$ represents a hydrogen atom or a substituent; $R_2$ and $R_3$ may be bonded to each other to form a 5-membered, 6-membered or 7-membered ring; $R_3$ and $R_6$ may be bonded to each other to form a 5-membered, 6-membered or 7-membered ring;

$R_4$ and $R_5$ may be bonded to each other to form a 5-membered, 6-membered or 7-membered ring; $R_5$ and $R_7$ may be bonded to each other to form a 5-membered, 6-membered or 7-membered ring; and $R_6$ and $R_7$ may be bonded to each other to form a 5-membered, 6-membered or 7-membered ring.

16. The dye-containing photosensitive composition of claim 15, further comprising a radical polymerizable monomer.

17. The dye-containing negative type photosensitive composition of claim 16, wherein the radical polymerizable monomer is a compound represented by Formula (VI-1) or (VI-2):

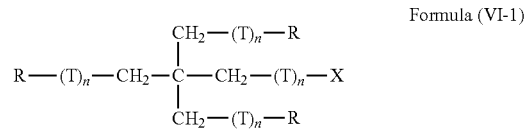

Formula (VI-1)

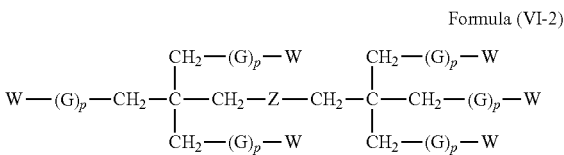

Formula (VI-2)

wherein,

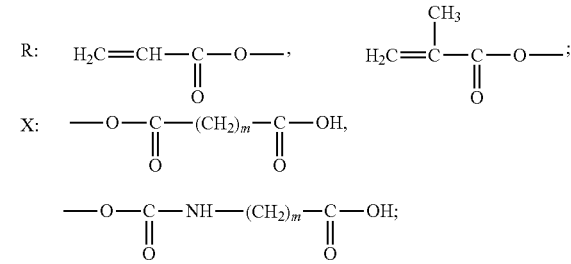

T: —CH$_2$—, —OCH$_2$—, —OCH$_2$CH$_2$—,

—OCH$_2$CH$_2$CH$_2$—, —OCH$_2$CH$_2$CH$_2$CH$_2$—;

Z: —O—, —O—C(=O)—NH—(CH$_2$)$_q$—NH—C(=O)—O—;

G: —CH$_2$—, —OCH$_2$—, —OCH$_2$CH$_2$—,

—OCH$_2$CH$_2$CH$_2$—, —OCH$_2$CH$_2$CH$_2$CH$_2$—;

n represents 0 to 14;

m represents 1 to 8;

W has the meaning same as R or X in formula (VI-1), and three or more of six W's are R;

p represents 0 to 14;

q represents 1 to 8; and respective of R, X, T, and G, when present plurally in one molecule, may be the same as or different from each other, respectively.

* * * * *